US009439332B2

(12) United States Patent
Ide et al.

(10) Patent No.: US 9,439,332 B2
(45) Date of Patent: Sep. 6, 2016

(54) POWER MODULE

(75) Inventors: Eiichi Ide, Tokyo (JP); Eiji Nishioka, Tokyo (JP); Toshiaki Ishii, Tokyo (JP); Junpei Kusukawa, Tokyo (JP); Kinya Nakatsu, Tokyo (JP); Tokihito Suwa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 269 days.

(21) Appl. No.: 14/237,975

(22) PCT Filed: Aug. 9, 2012

(86) PCT No.: PCT/JP2012/070361
§ 371 (c)(1),
(2), (4) Date: Feb. 10, 2014

(87) PCT Pub. No.: WO2013/046954
PCT Pub. Date: Apr. 4, 2013

(65) Prior Publication Data
US 2014/0168901 A1    Jun. 19, 2014

(30) Foreign Application Priority Data

Sep. 26, 2011   (JP) ................................ 2011-209815

(51) Int. Cl.
*H05K 7/20* (2006.01)
*H01L 23/36* (2006.01)
(Continued)

(52) U.S. Cl.
CPC ............... *H05K 7/209* (2013.01); *B60L 1/003* (2013.01); *B60L 1/02* (2013.01); *B60L 3/003* (2013.01);
(Continued)

(58) Field of Classification Search
CPC ....................................................... H05K 7/209
USPC ........................................................... 361/717
See application file for complete search history.

(56) References Cited

U.S. PATENT DOCUMENTS 6,704,202 B1 * 3/2004 Hamaoka .............. F25D 23/006
361/690
2006/0091512 A1 * 5/2006 Shinohara ............... H01L 24/40
257/678
(Continued)

FOREIGN PATENT DOCUMENTS

JP    2006-86342 A    3/2006
JP    2006-128555 A   5/2006
(Continued)

OTHER PUBLICATIONS

International Search Report dated Sep. 4, 2012 with English translation (five (5) pages).

*Primary Examiner* — David Warren
(74) *Attorney, Agent, or Firm* — Crowell & Moring LLP

(57) ABSTRACT

A power module includes a sealed body in which a semiconductor chip-mounted conductor plate is sealed by a resin in such a manner that a heat dissipating surface of the conductor plate is exposed, a heat dissipating member that is arranged to face the heat dissipating surface, and an insulation layer that is arranged between the sealed body and the heat dissipating member. The insulation layer has a laminated body that is made by laminating an impregnation resin-impregnated ceramic thermal spray film and a bonding resin layer in which a filler having good thermal conductivity is mixed, and that is provided to be in contact with the heat dissipating member and at least the entirety of the heat dissipating surface, and a stress relief resin portion that is provided in a gap between the heat dissipating member and the sealed body to cover an entire circumferential end portion of the laminated body.

13 Claims, 49 Drawing Sheets

(51) Int. Cl.
*H01L 23/433* (2006.01)
*H01L 23/495* (2006.01)
*B60L 1/00* (2006.01)
*B60L 3/00* (2006.01)
*B60L 11/12* (2006.01)
*B60L 11/14* (2006.01)
*B60L 15/00* (2006.01)
*B60L 1/02* (2006.01)
*B60L 15/20* (2006.01)
*H02M 7/00* (2006.01)
*H01L 21/56* (2006.01)
*H01L 23/00* (2006.01)
*H01L 23/473* (2006.01)

(52) U.S. Cl.
CPC .............. *B60L 11/123* (2013.01); *B60L 11/14* (2013.01); *B60L 15/007* (2013.01); *B60L 15/2036* (2013.01); *H01L 23/36* (2013.01); *H01L 23/4334* (2013.01); *H01L 23/49524* (2013.01); *H01L 23/49575* (2013.01); *H01L 24/36* (2013.01); *H01L 24/40* (2013.01); *H05K 7/20927* (2013.01); *B60L 2200/26* (2013.01); *B60L 2200/42* (2013.01); *B60L 2210/40* (2013.01); *B60L 2220/14* (2013.01); *B60L 2240/12* (2013.01); *B60L 2240/24* (2013.01); *B60L 2240/36* (2013.01); *B60L 2240/421* (2013.01); *B60L 2240/423* (2013.01); *B60L 2240/525* (2013.01); *B60L 2250/16* (2013.01); *B60L 2250/24* (2013.01); *B60L 2250/26* (2013.01); *B60L 2260/28* (2013.01); *H01L 21/565* (2013.01); *H01L 23/473* (2013.01); *H01L 24/45* (2013.01); *H01L 24/48* (2013.01); *H01L 24/49* (2013.01); *H01L 24/73* (2013.01); *H01L 2224/04042* (2013.01); *H01L 2224/06181* (2013.01); *H01L 2224/291* (2013.01); *H01L 2224/29139* (2013.01); *H01L 2224/32225* (2013.01); *H01L 2224/40137* (2013.01); *H01L 2224/45014* (2013.01); *H01L 2224/45124* (2013.01); *H01L 2224/45147* (2013.01); *H01L 2224/48091* (2013.01); *H01L 2224/48137* (2013.01); *H01L 2224/48195* (2013.01); *H01L 2224/48227* (2013.01); *H01L 2224/48247* (2013.01); *H01L 2224/48472* (2013.01); *H01L 2224/4903* (2013.01); *H01L 2224/49111* (2013.01); *H01L 2224/49175* (2013.01); *H01L 2224/73221* (2013.01); *H01L 2224/73263* (2013.01); *H01L 2224/73265* (2013.01); *H01L 2224/8384* (2013.01); *H01L 2224/83801* (2013.01); *H01L 2924/01013* (2013.01); *H01L 2924/01014* (2013.01); *H01L 2924/01015* (2013.01); *H01L 2924/01028* (2013.01); *H01L 2924/01047* (2013.01); *H01L 2924/1203* (2013.01); *H01L 2924/12042* (2013.01); *H01L 2924/1306* (2013.01); *H01L 2924/13055* (2013.01); *H01L 2924/13091* (2013.01); *H01L 2924/181* (2013.01); *H01L 2924/203* (2013.01); *H01L 2924/3025* (2013.01); *H01L 2924/30107* (2013.01); *H01L 2924/351* (2013.01); *H02M 7/003* (2013.01); *Y02T 10/6217* (2013.01); *Y02T 10/645* (2013.01); *Y02T 10/7077* (2013.01); *Y02T 10/7241* (2013.01); *Y02T 10/7275* (2013.01)

(56) References Cited

U.S. PATENT DOCUMENTS

| | | | | |
|---|---|---|---|---|
| 2010/0002397 | A1* | 1/2010 | Toh | H01L 23/4006 361/713 |
| 2010/0091464 | A1* | 4/2010 | Ohnishi | H01L 23/053 361/723 |
| 2010/0110640 | A1* | 5/2010 | Kretman | H05K 7/209 361/720 |
| 2012/0014059 | A1* | 1/2012 | Zeng | H02M 7/003 361/690 |
| 2012/0087095 | A1* | 4/2012 | Tokuyama | B60K 6/365 361/721 |
| 2012/0287576 | A1* | 11/2012 | Takatsuka | H05K 7/209 361/690 |
| 2013/0015495 | A1* | 1/2013 | Hauenstein | H01L 25/071 257/140 |
| 2013/0027888 | A1* | 1/2013 | Yoshida | H01L 23/24 361/715 |
| 2013/0056185 | A1* | 3/2013 | Bayerer | H01L 23/36 165/134.1 |
| 2013/0181228 | A1* | 7/2013 | Usui | H01L 23/4334 257/77 |
| 2013/0279230 | A1* | 10/2013 | Suwa | H01L 23/4334 363/141 |
| 2014/0092562 | A1* | 4/2014 | Xu | H01L 23/36 361/720 |
| 2014/0104790 | A1* | 4/2014 | Yoon | H05K 7/209 361/716 |
| 2014/0118934 | A1* | 5/2014 | Tokuyama | H05K 7/1432 361/689 |
| 2014/0168901 | A1* | 6/2014 | Ide | H05K 7/20927 361/717 |
| 2014/0198454 | A1* | 7/2014 | Yuan | H05K 7/209 361/720 |
| 2014/0318831 | A1* | 10/2014 | Nishikawa | H01L 23/36 174/252 |
| 2014/0369006 | A1* | 12/2014 | Williams | H05K 1/0203 361/712 |
| 2015/0003019 | A1* | 1/2015 | Ide | H05K 1/0271 361/705 |
| 2015/0055303 | A1* | 2/2015 | Nagatomo | H01L 23/3735 361/715 |
| 2015/0077941 | A1* | 3/2015 | Hosseini | H01L 23/3733 361/704 |
| 2015/0116945 | A1* | 4/2015 | Minamio | H01L 23/4006 361/709 |
| 2015/0282379 | A1* | 10/2015 | Terasaki | H01L 23/473 361/720 |

FOREIGN PATENT DOCUMENTS

| | | |
|---|---|---|
| JP | 2006-165498 A | 6/2006 |
| JP | 4023397 B2 | 12/2007 |
| JP | 2010-258315 A | 11/2010 |

* cited by examiner

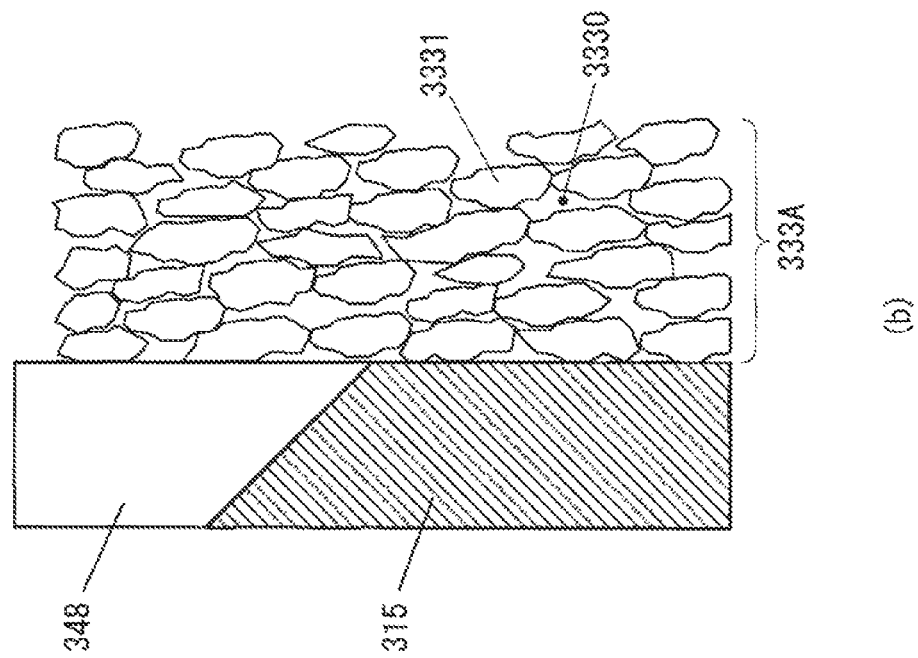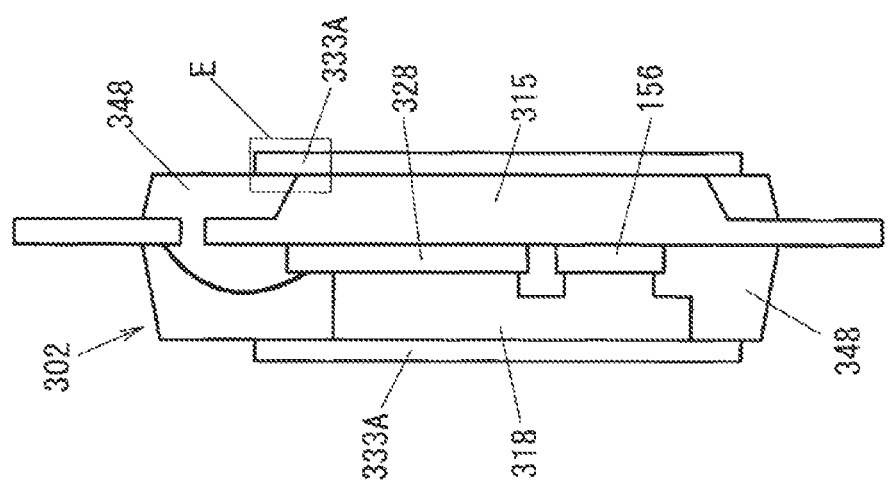
FIG. 15

FIG. 19
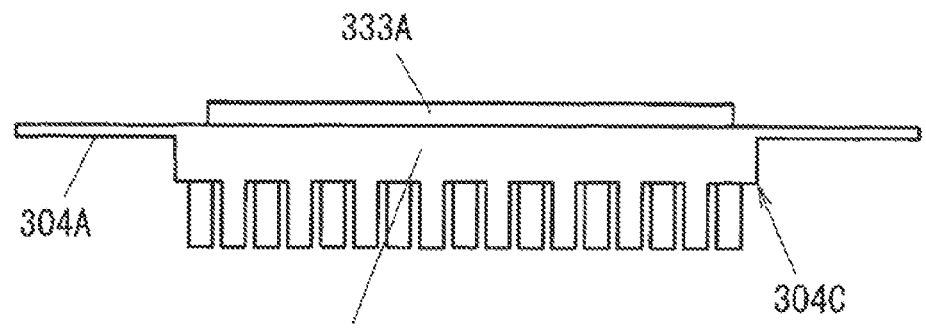
(a)
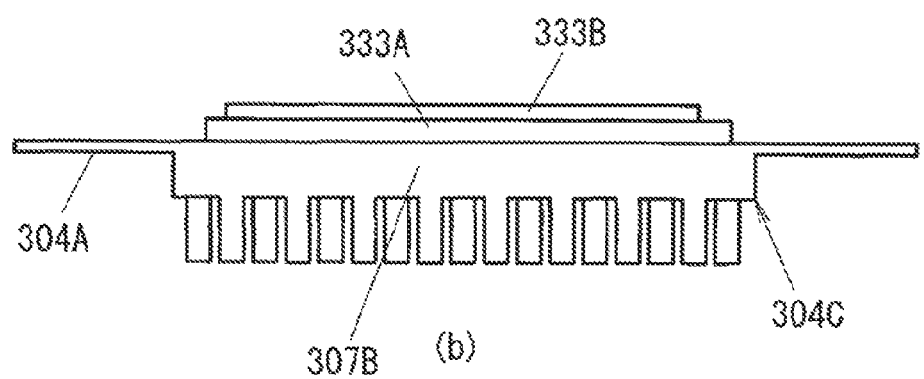
(b)
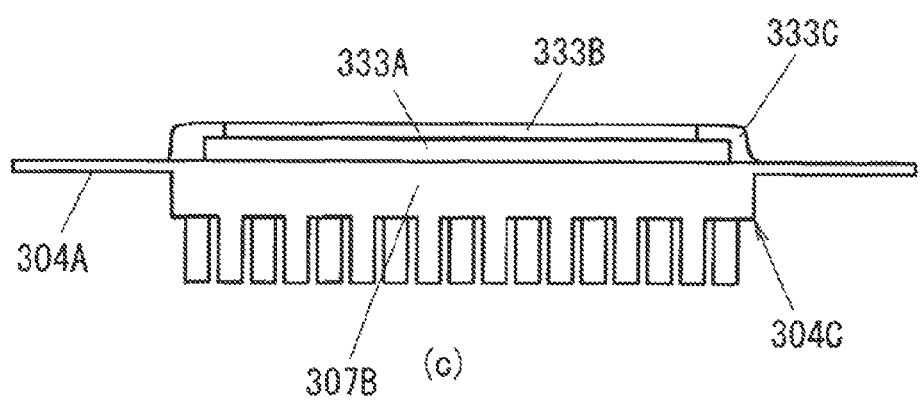
(c)

FIG. 23
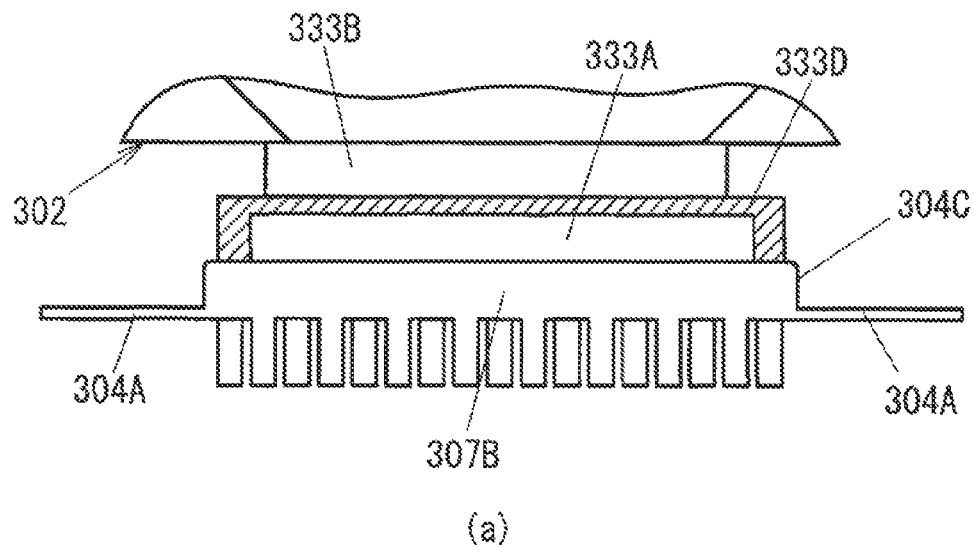
(a)
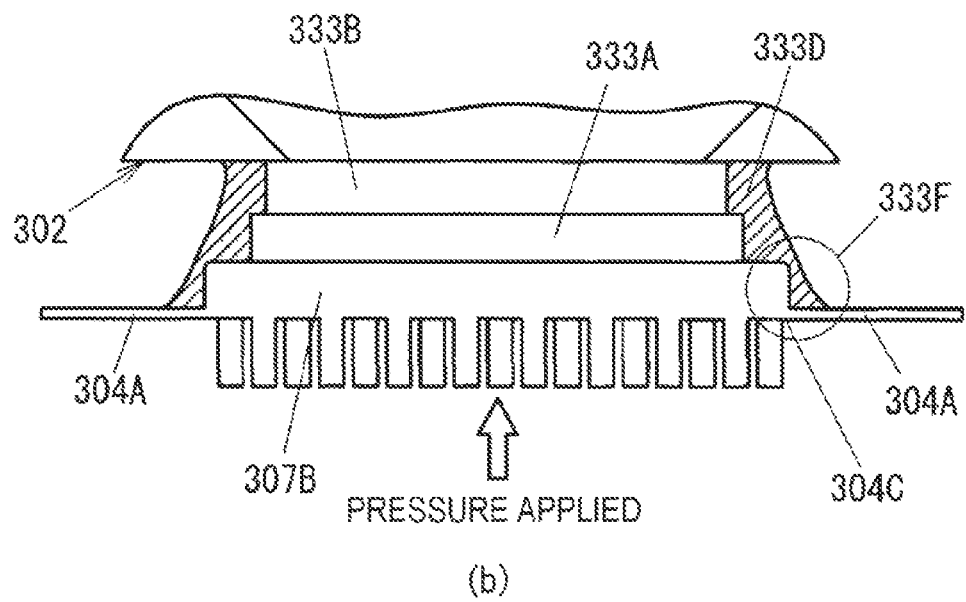
(b)

FIG. 24
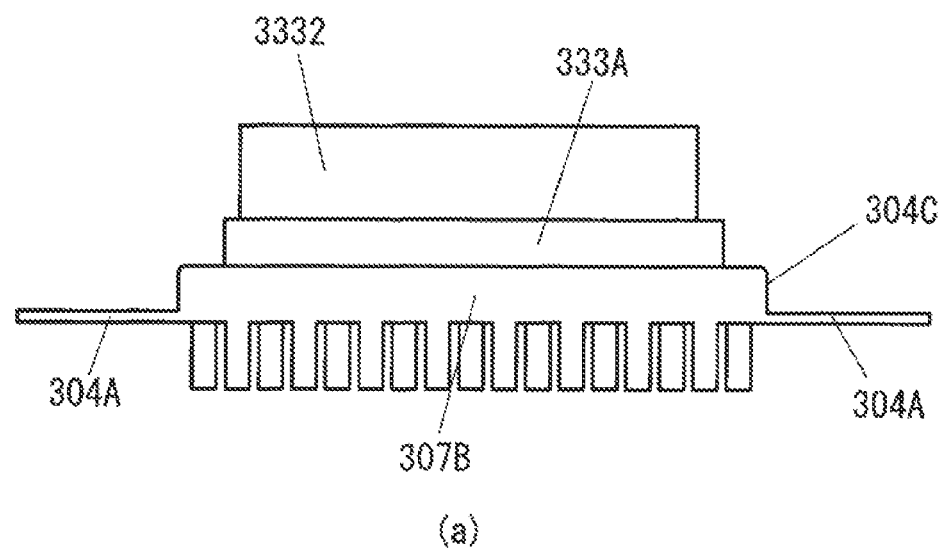
(a)
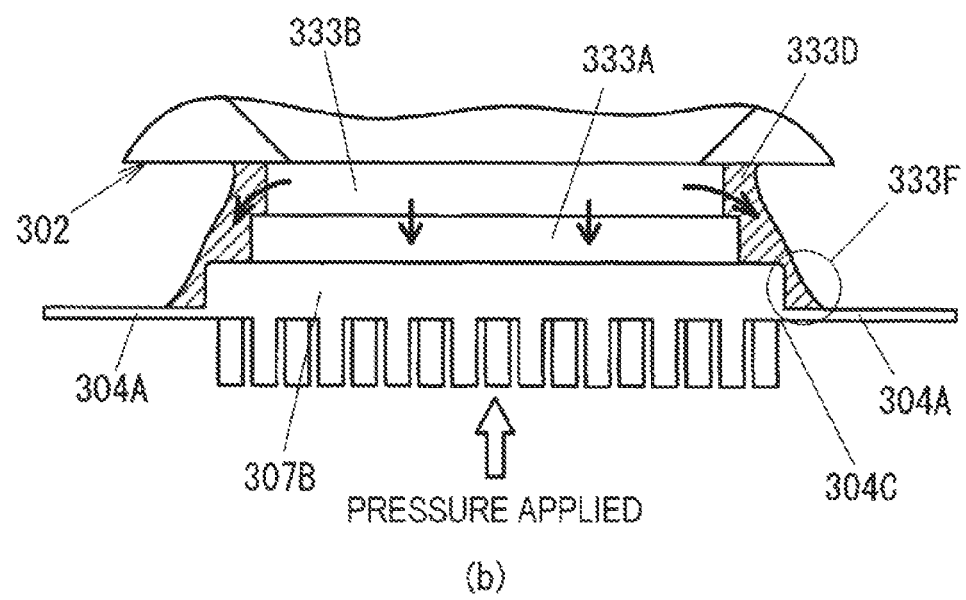
(b)

POWER MODULE

TECHNICAL FIELD

The present invention relates to a power module that has good heat dissipation and reliability.

BACKGROUND ART

From the viewpoint of energy saving, a vehicle requires high fuel economy, and public attention is drawn to an electric vehicle that is driven by a motor or a hybrid vehicle that is driven by a combination of a motor and an engine. It is difficult to drive or control a high capacity vehicle-mounted motor for a vehicle using a direct current voltage of a battery, and an electric power conversion apparatus that uses the switching of a power semiconductor element is essential to boosting and alternating current control of the high capacity vehicle-mounted motor. In addition, since the power semiconductor element generates heat due to electrification, a power module on which the power semiconductor element is mounted requires an insulation layer that has a high heat dissipation capacity.

For example, in the power module, a structure is known where laminated bodies of which each is configured to have a power semiconductor chip, a conductor plate on which the power semiconductor chip is mounted, a metal base plate on which the conductor plate is mounted, and a ceramic plate that insulates the conductor plate and the metal base plate from each other are packaged in a resin case to form a structure body, and the structure body is attached to a cooling body. In the invention disclosed in PTL 1, as an example of cost reduction, a ceramic thermal spray film is formed on a side of a heat dissipating surface of the conductor plate sealed in a resin, and the film serves as an insulation layer.

CITATION LIST

Patent Literature

[PTL 1] Japanese Patent No. 4023397

SUMMARY OF INVENTION

Technical Problem

However, since the thermal spray film that is an insulation layer disclosed in PTL 1 described above contains pores in the film, the thermal spray film lacks insulation performance necessary for the power module after the thermal spraying is completed, and thus it is necessary to form a thick thermal spray film. In addition, pores in the film cause deterioration of thermal conduction performance. Impregnating a resin into pores is effective in improving the insulation performance and the thermal conduction performance. Furthermore, when the thermal spray film is bonded to the metal base plate for heat dissipation cooling by an impregnation resin, good heat dissipation is obtained compared to a method in which the thermal spray film is attached by grease. However, there is a problem in that a crack or peeling occurs in circumferential end portions of the insulation layer due to thermal stress resulting from a difference in coefficients of thermal expansion between the metal conductor plate and the metal base plate.

Solution to Problem

According to an aspect of the invention, a power module includes a sealed body in which a semiconductor chip-mounted conductor plate is sealed by a resin in such a manner that a heat dissipating surface of the conductor plate is exposed; a heat dissipating member that is arranged to face the heat dissipating surface; and an insulation layer that is arranged between the sealed body and the heat dissipating member. The insulation layer has a laminated body that is made by laminating an impregnation resin-impregnated ceramic thermal spray film and a bonding resin layer in which a filler having good thermal conductivity is mixed, and that is provided to be in contact with the heat dissipating member and at least the entirety of the heat dissipating surface, and a stress relief resin portion that is provided in a gap between the heat dissipating member and the sealed body to cover an entire circumferential end portion of the laminated body.

Advantageous Effects of Invention

According to the invention, since the stress relief resin portion is provided, it is possible to relieve stress in the end portion of the insulation layer, and it is possible to achieve improvement in reliability of the power module.

BRIEF DESCRIPTION OF DRAWINGS

FIG. 15 is a view describing a process of forming the thermal spray film 333A.

FIG. 19 is a view describing a process of assembling the power module.

FIG. 23 is a view describing a first method of forming a laminated body.

FIG. 24 is a view describing another method of forming the laminated body.

DESCRIPTION OF EMBODIMENTS

Hereinafter, embodiments according to the invention will be described with reference to the accompanying drawings.

-First Embodiment-

Figure 1:
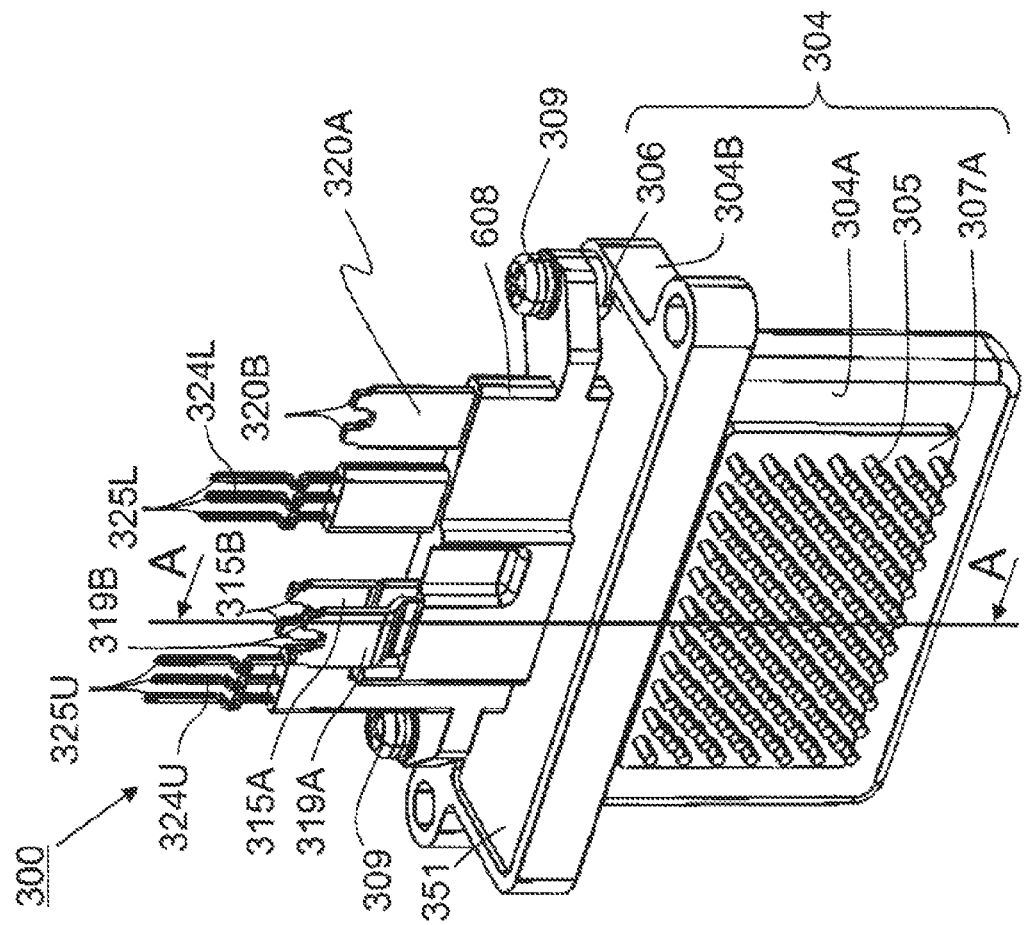
FIG. 1 is a view illustrating an embodiment of a power module according to the invention, and is an exterior perspective view of the power module.
Figure 2:
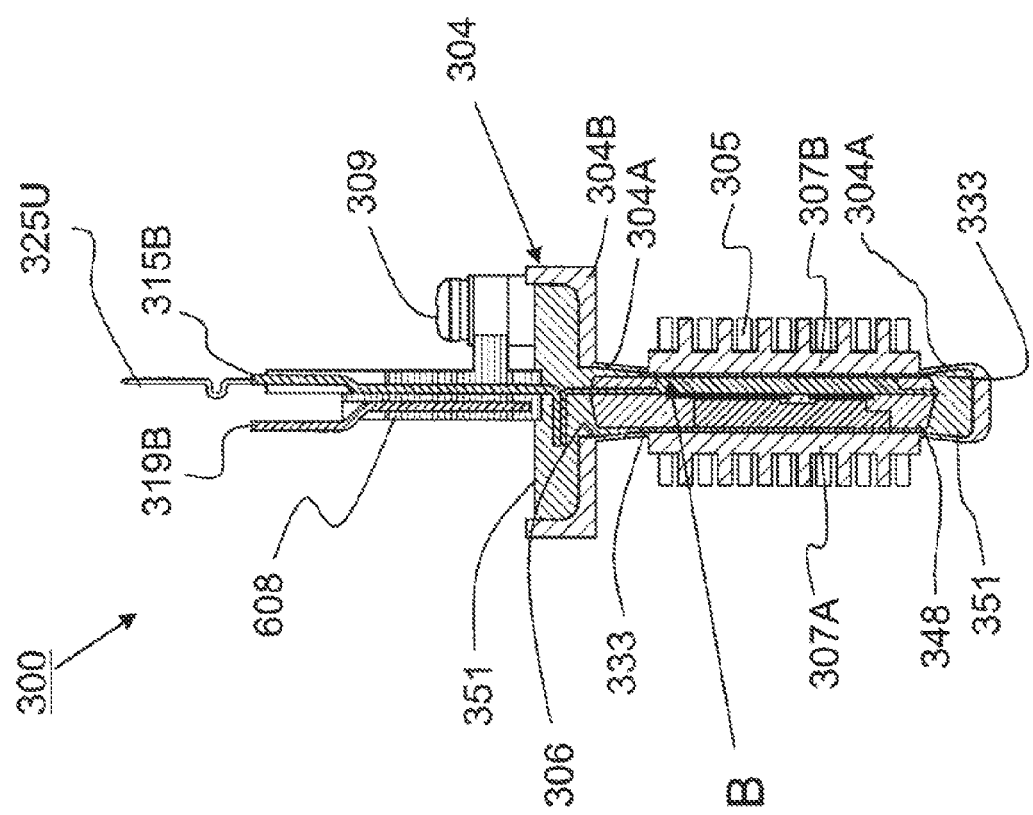
FIG. 2 is a cross-sectional view taken along line A-A in FIG. 1.

FIGS. 1 to 17 are views illustrating a first embodiment of a power module according to the invention. FIG. 1 is an exterior perspective view of the power module. FIG. 2 is a cross-sectional view taken along line A-A in FIG. 1. A power module 300 is configured to accommodate a power semiconductor unit that includes a switching element and is transfer-molded in a module case 304. For example, the power module 300 is used in an electric power conversion apparatus mounted on an electric vehicle such as an electric vehicle or a hybrid vehicle.

Figure 3:
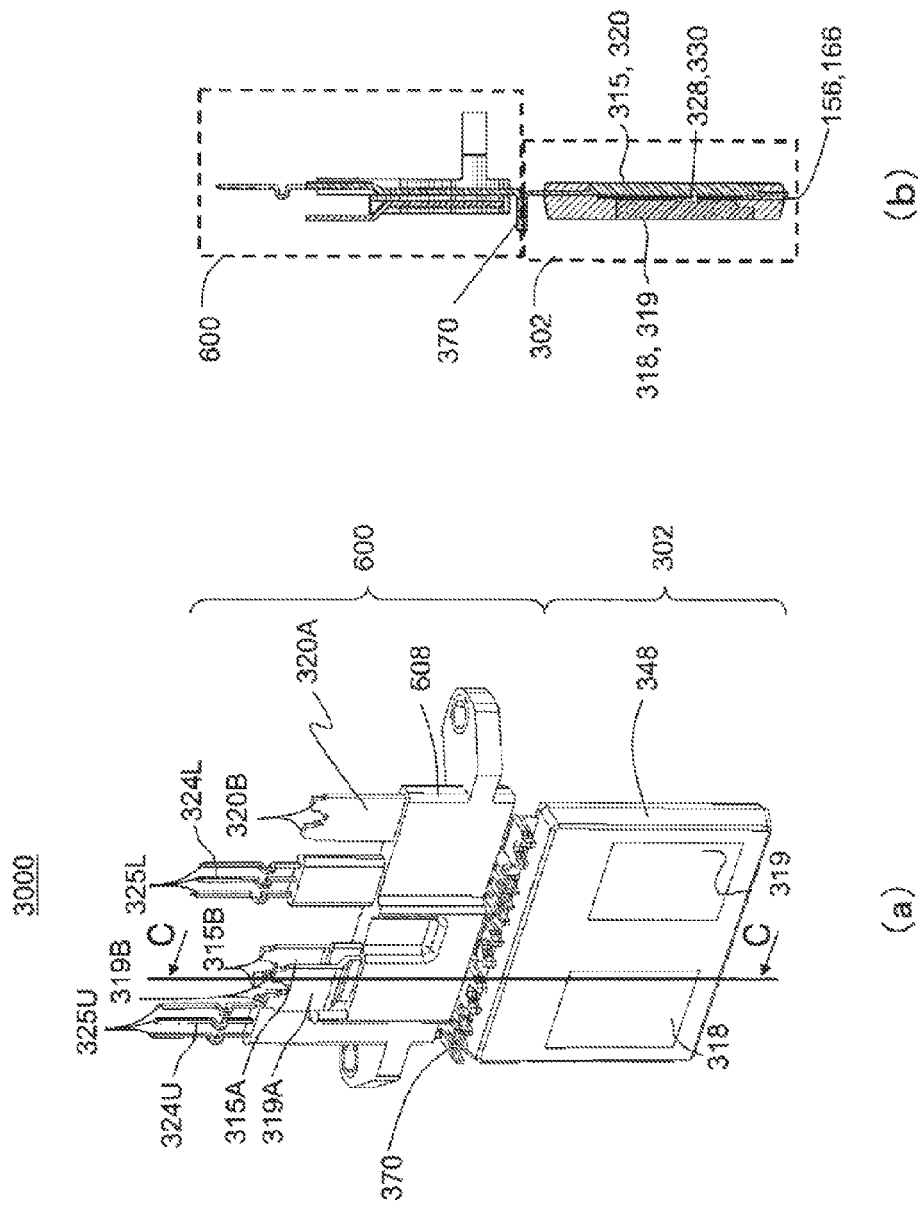
FIG. 3 is a view illustrating a power module structure body 3000.

As illustrated in FIG. 2, the power module 300 is configured to accommodate a power module structure body 3000 which is illustrated in FIG. 3 in the module case 304 that is a CAN-type cooler. Herein, the CAN-type cooler is a cylindrical cooler that has an insertion opening 306 in one surface and the bottom in the other surface. The module case 304 is made of a member that has electrical conductivity, for example, Cu, a Cu alloy, a composite such as Cu—C or Cu—CuO or a composite such as Al, an Al alloy, AlSiC or Al—C. In addition, the module case 304 is integrally formed into a case shape without joints by a joint method with good waterproof properties such as a welding, or a forging process, a casting or the like.

The module case 304 is a flat case that is not provided with an opening other than the inserting opening 306, and the flat insertion opening 306 is provided with a flange 304B. A heat dissipating portion 307A is provided on one of two surfaces of the flat case that have wide areas and face each other, and a heat dissipating portion 307B is provided on the other surface. The heat dissipating portion 307A and the heat dissipating portion 307B function as heat dissipating walls of the module case 304, and a plurality of fins 305 are uniformly formed on the outer circumferential surfaces. A circumferential surface that surrounds the heat dissipating portion 307A and the heat dissipating portion 307B is configured to have a thin wall portion 304A of which the thickness is so small that the thin wall portion 304A can be easily subject to plastic deformation. Since the thin wall portion 304A is made so thin, when pressure is applied toward the inside of the case on the heat dissipating portion 307A and the heat dissipating portion 307B, the thin wall portion 304A can be easily deformed. The module case 304 does not necessarily have an exact rectangular shape, and as illustrated in FIG. 1, a corner may form a curved shape.

FIG. 3 is a view illustrating the power module structure body 3000 that is accommodated in the module case 304. FIG. 3(a) is a perspective view of the power module structure body 3000, and FIG. 3(b) is a cross-sectional view taken along line C-C. A cross-section C-C and a cross-section A-A in FIG. 1 indicate cross-sections of the same portion. The power module structure body 3000 is configured to have a primary sealed body 302 and an auxiliary module body 600. The primary sealed body 302 and the auxiliary molded body 600 are connected to each other in a connection portion 370. For example, a TIG welding or the like can be used as a metal joint in the connection portion 370. As illustrated in FIG. 1, a wiring insulation portion 608 provided in the auxiliary molded body 600 is fixed to the flange 304B of the module case 304 by screws 309, and thus the power module structure body 3000 is located in the module case 304.

(Description of Primary Sealed Body 302)

Figure 4:
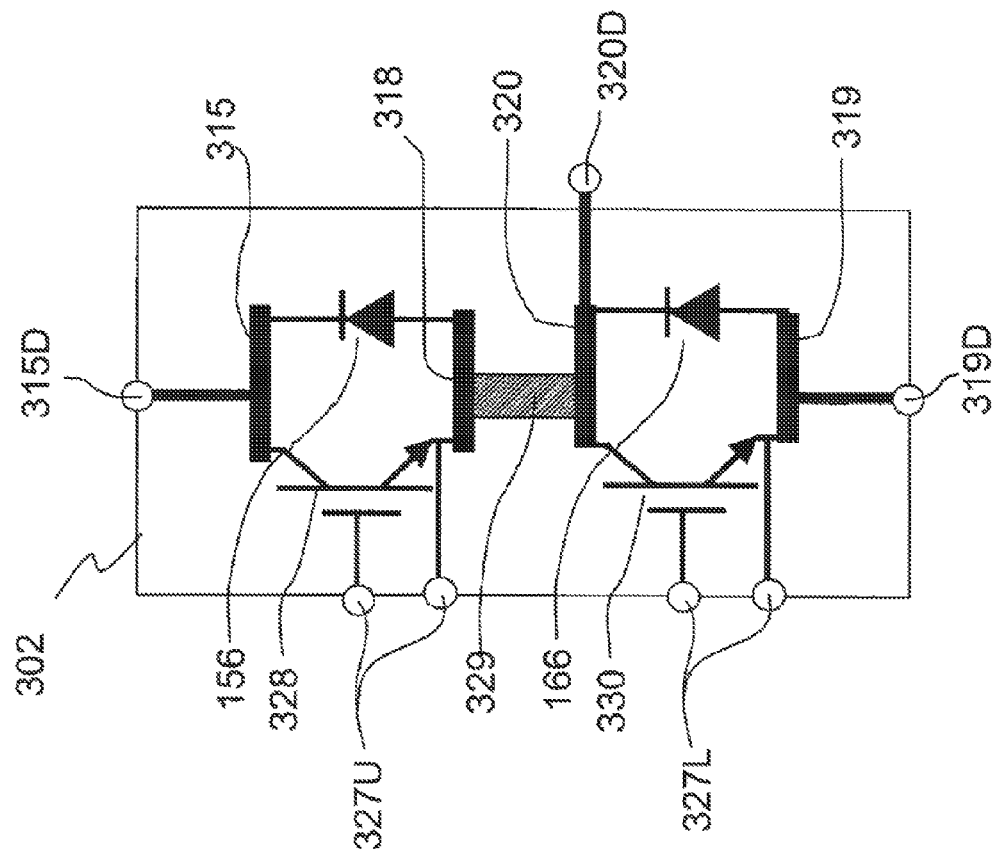
FIG. 4 is a circuit diagram of a power module 300.
Figure 5:
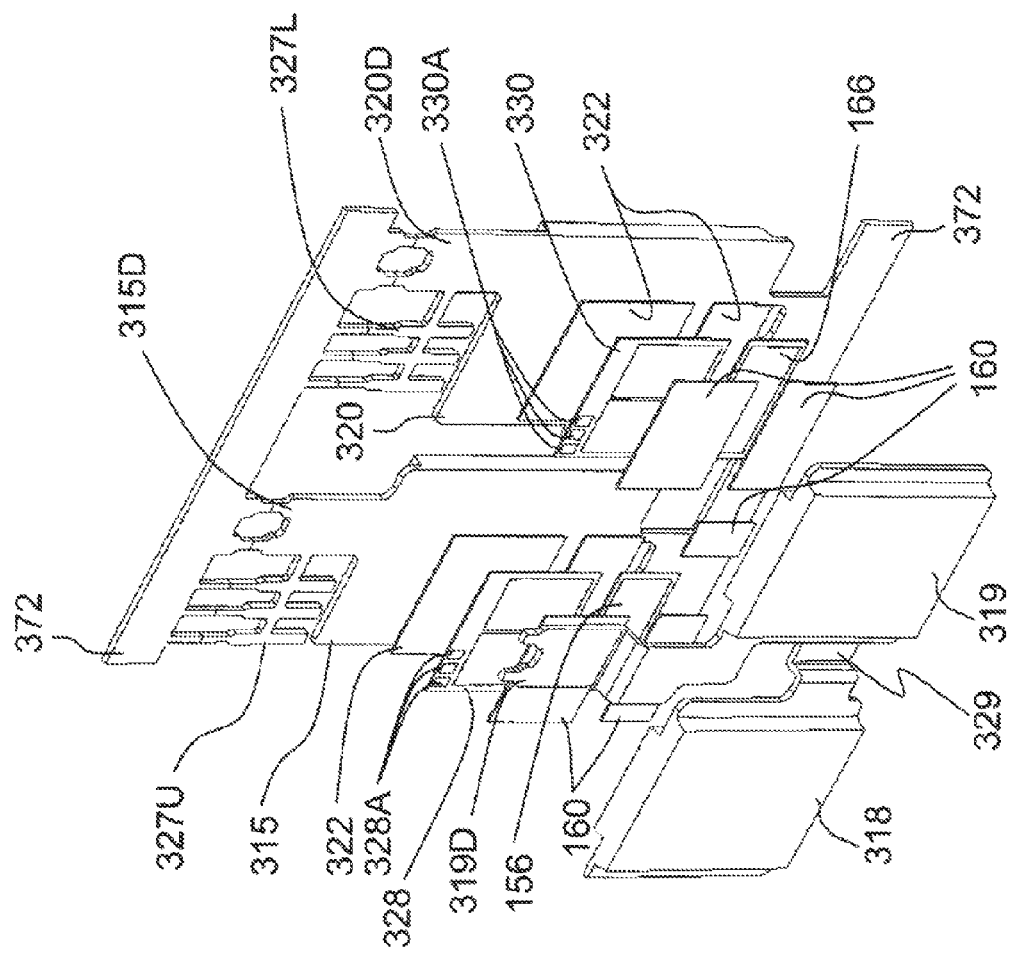
FIG. 5 is a view illustrating a process of manufacturing a primary sealed body 302.

Subsequently, the primary sealed body 302 will be described with reference to FIGS. 4 to 11. FIG. 4 is a circuit diagram of the power module 3000. FIGS. 5 to 11 are views illustrating a process of manufacturing the primary sealed body 302. The power module 300 is configured to arrange an upper arm IGBT 328 and a lower arm IGBT 330 in series, and includes the IGBTs 328 and 330 and diodes 156 and 166 as semiconductor elements. As illustrated in FIG. 5, chips of the semiconductor elements (hereinafter, referred to as semiconductor chips) have plate shapes, and electrodes are formed on the front and the back surfaces of the semiconductor chips.

A collector electrode of the upper arm IGBT 328 and a cathode electrode of the upper arm diode 156 are connected to a conductor plate 315, and an emitter electrode of the IGBT 328 and an anode electrode of the diode 156 are connected to a conductor plate 318. A collector electrode of the lower arm IGBT 330 and a cathode electrode of the lower arm diode 166 are connected to a conductor plate 320, and an emitter electrode of the IGBT 330 and an anode electrode of the diode 166 are connected to a conductor plate 319. The conductor plates 318 and 320 are connected to each other via an intermediate electrode 159. An upper arm circuit and a lower arm circuit are electrically connected to each other via the intermediate electrode 159, and as illustrated in FIG. 4, an upper and lower arm series circuit is formed. Metals such as Cu, Al, Ni, Au, Ag, Mo, Fe and Co, alloys thereof or composites are used as materials of conductor plates 315, 318, 319 and 320.

As illustrated in FIG. 5, the conductor plate 315 on a side of a direct current positive electrode and the conductor plate 320 on a side of an alternating current output, and an upper arm signal connection terminal 327U and a lower arm signal connection terminal 327L are integrally processed to be arranged on approximately the same plane in a state where the conductor plates 315 and 329, and the upper arm signal connection terminal 327U and the lower arm signal connection terminal 327L are connected to a common tie bar 372. Control electrodes 328A of the IGBT 328 are connected to the upper arm signal connection terminal 327U via bonding wires. Control electrodes 330A of the IGBT 330 are connected to the lower arm signal connection terminal 327L via bonding wires. Convex chip-fixed portions 322 are respectively formed in portions to which the semiconductor chips (IGBTs 328 and 330 and diodes 155 and 166) of the conductor plates 315 and 320 are joined. Each of the semiconductor chips is joined to the chip-fixed portion 322 by a metal joint material 160. For example, a soldering material, a low temperature sintering joint material containing a silver sheet and fine metal particles or the like is used as the metal joint material 160. In addition, a solder that includes tin as a main component is desirably used in the metal joint material 160, but it is possible to use a solder that includes any one of gold, silver and copper as a main component, a brazing filler material, a paste or the like.

The conductor plates 318 and 319 are arranged on approximately the same plane and metal-joined to the IGBTs 328 and 330 and the diodes 155 and 166 by the metal joint material 160. As illustrated in FIG. 4, the emitter electrode of the upper arm IGBT 328 and the anode electrode of the upper arm diode 156 are joined to the conductor plate 318. The emitter electrode of the lower arm IGBT 330 and the anode electrode of the lower arm diode 166 are joined to the conductor plate 319. A direct current positive electrode connection terminal 315D is formed in the conductor plate 315. An alternating current connection terminal 320D is formed in the conductor plate 320. A direct current negative electrode connection terminal 319D is formed in the conductor plate 319.

Figure 6:
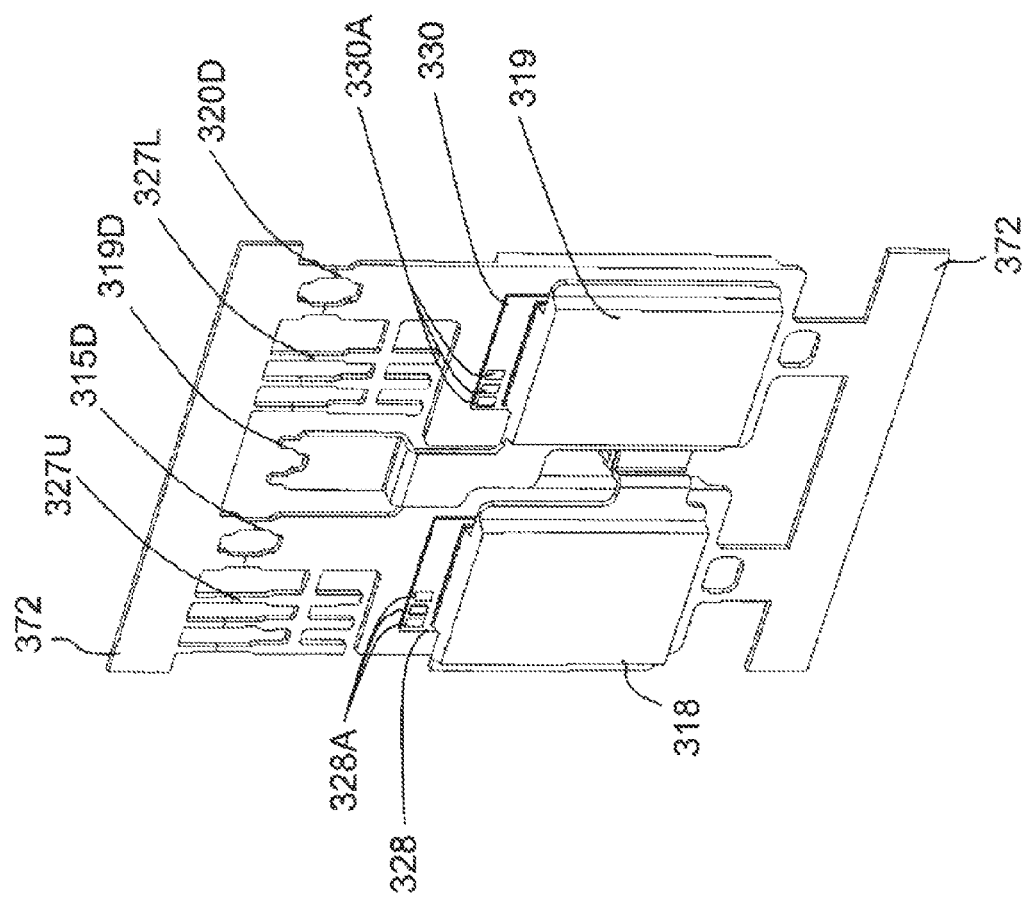
FIG. 6 is a view illustrating the process of manufacturing the primary sealed body 302, and is a view illustrating a process subsequent to the process in FIG. 5.

As described above, the IGBT 328 and the diode 156 are interposed between the conductor plates 315 and 318, the IGBT 330 and the diode 166 are interposed between the conductor plates 320 and 319 and the conductor plates 320 and 318 are connected to each other via an intermediate electrode 329, thereby leading to a state that is illustrated in FIG. 6. Furthermore, the control electrode 328A and the signal connection terminal 327U of the IGBT 328 are connected to each other via a bonding wire 371, and the control electrode 330A and the signal connection terminal 327L of the IGBT 330 are connected to each other via the bonding wire 371, thereby leading to a state that is illustrated in FIG. 7.

Figure 7:
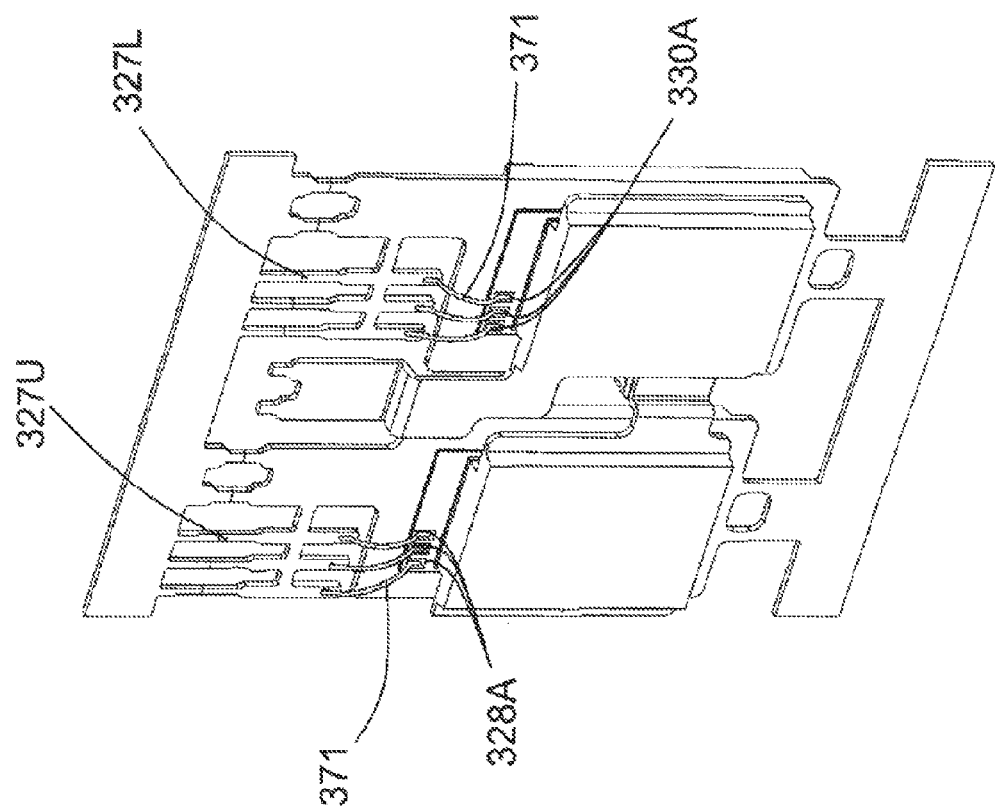
FIG. 7 is a view illustrating the process of manufacturing the primary sealed body 302, and is a view illustrating a process subsequent to the process in FIG. 6.
Figure 9:
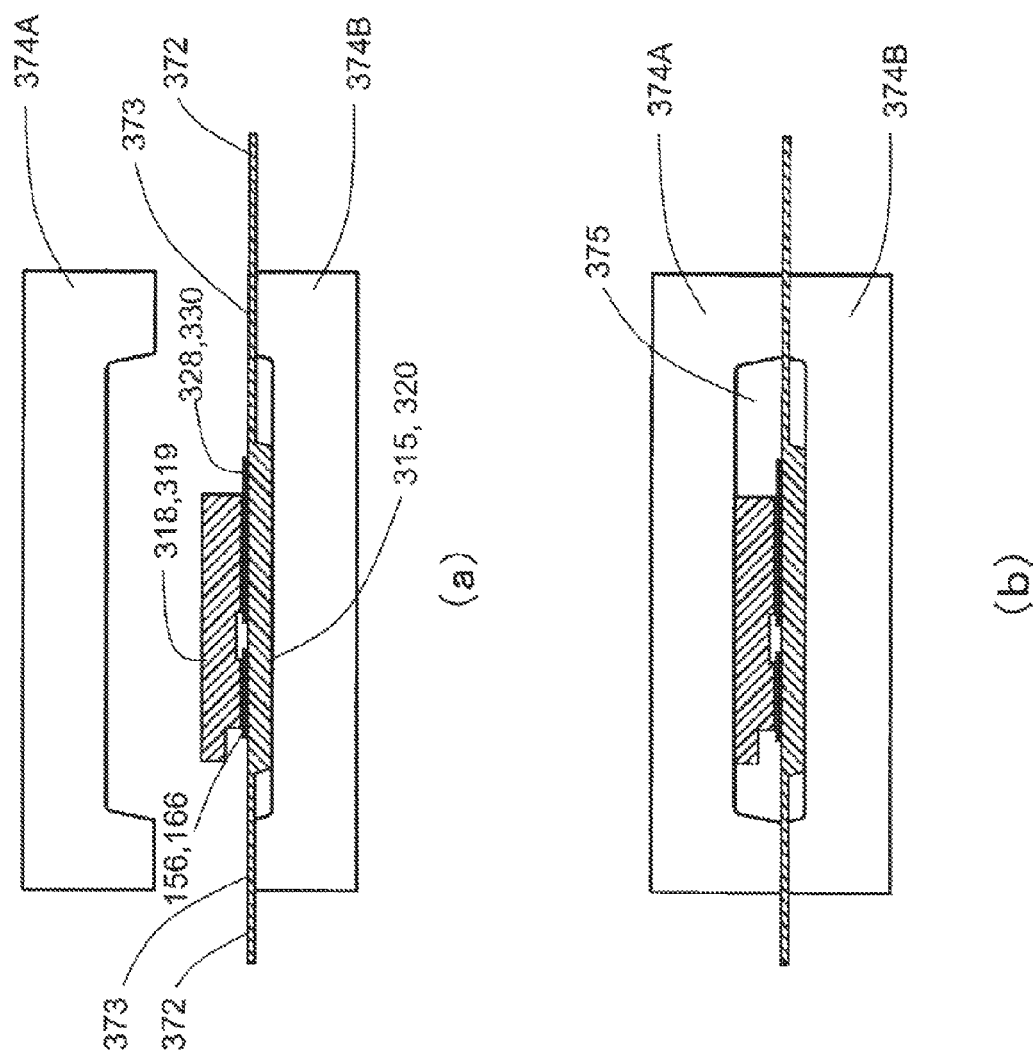
FIG. 9 is a view describing a transfer molding process by the sealing resin 348.

After the assembly is completed as illustrated in FIG. 7, a portion that contains the semiconductor chips (IGBTs 328 and 330 and diodes 156 and 166) and the bonding wire 371 is sealed by a sealing resin 348. The sealing is carried out by a transfer molding. As illustrated in FIG. 9, a portion (die-pressed surface) illustrated by a reference sign 373 is pressed from above and below by transfer molding dies, the dies are filled with the sealing resin 348 and a molding is carried out.

FIG. 9 is a view describing a transfer molding process. In FIG. 9, (a) illustrates a longitudinal cross-sectional view before the dies are clamped, and (b) illustrates a longitudinal cross-sectional view after the dies are clamped. As illustrated in FIG. 9(a), before the primary sealed body 302 that is illustrated in FIG. 7 is sealed, the primary sealed body 302 is placed between an upper die 374A and a lower die 374B. When the die-pressed surface 373 of the primary sealed body 302 is interposed from above and below between the upper die 374A and the lower die 374B and the upper die 374A and the lower die 374B are clamped, a die space 375 is formed in the dies as illustrated in FIG. 9(b). When the die space 375 is filled with the sealing resin 348 and a molding is carried out, the semiconductor chips (IGBTs 328 and 330 and diodes 155 and 166) in the primary sealed body 302 are sealed by the sealing resin 348.

For example, it is possible to use an epoxy-based resin such as a novolac-based epoxy resin, a multifunction-based epoxy resin or a biphenyl-based epoxy resin as the sealing resin 348. By adding ceramics such as $SiO_2$, $Al_2O_3$, AlN, BN, a gel, a rubber or the like in the epoxy resin, a coefficient of thermal expansion of the epoxy resin is set to be close to that of the conductor plates 315, 320, 318 and 319. Accordingly, it is possible to reduce a difference in coefficients of thermal expansion among the members and to greatly decrease thermal stress occurring from temperature increase under the operating environment, and thus, it is possible to extend the life of the power module.

Figure 8:
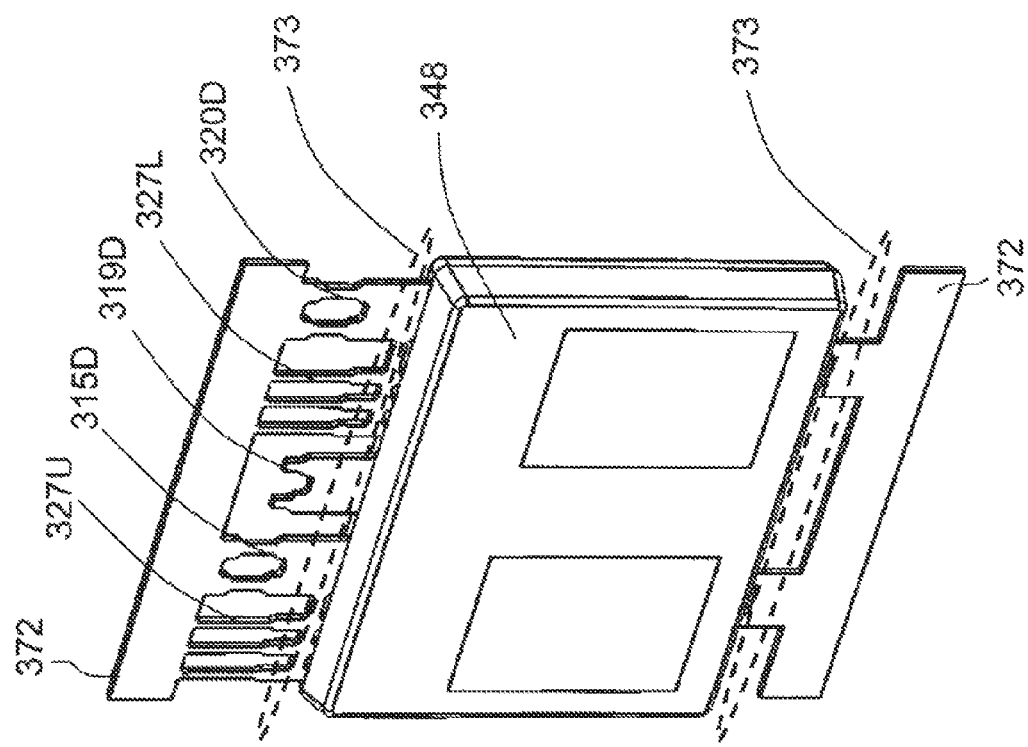
FIG. 8 is a view illustrating the process of manufacturing the primary sealed body 302, and illustrates a state after the primary sealed body 302 is sealed by a sealing resin 348.

As illustrated in FIG. 8, in the die-pressed surface 373, the direct current positive electrode connection terminal 315D, the direct current negative electrode connection terminal 319D, the alternating current connection terminal 320D and the signal connection terminals 327U and 327L are arranged to align in a row. Since the terminals are arranged in this way, extra stress occurs in connection portions between each of the terminals and the semiconductor chips, and the upper die 374A and the lower die 374B can be clamped without a gap. Accordingly, it is possible to seal the semiconductor chips without causing damage to the semiconductor chips or the sealing resin 348 leaking from a gap. In addition, front surfaces (heat dissipating surfaces) of the conductor plates 318 and 319 are exposed on one surface of the sealing resin 348, and front surfaces (heat dissipating surfaces) of the conductor plates 315 and 320 are exposed on a surface opposite the surface.

Figure 10:
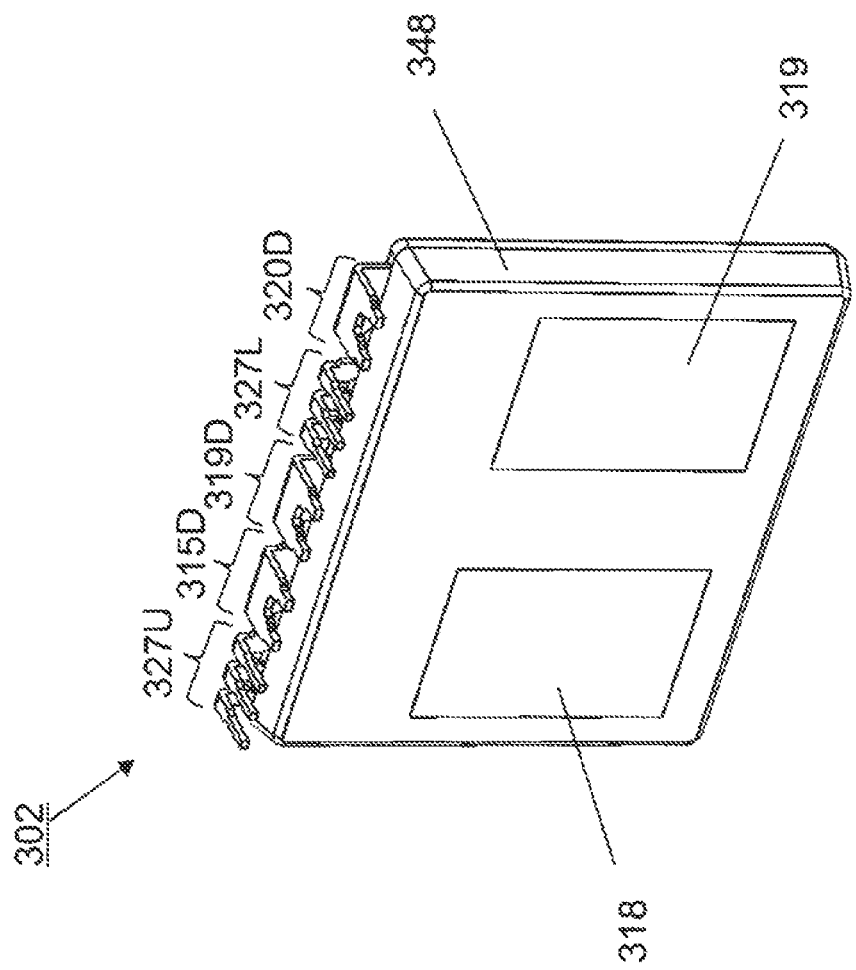
FIG. 10 is a perspective view of the primary sealed body 302.

As illustrated in FIG. 8, after the sealing is carried out by the sealing resin 348, the tie bar 372 is cut off, and the direct current positive electrode connection terminals 315D and the direct current negative electrode connection terminal 319D, the alternating current connection terminal 320D and the signal connection terminals 327U and 327L are separated from each other. As illustrated in FIG. 10, each end portion of the direct current positive electrode connection terminal 315D, the direct current negative electrode connection terminal 319D, the alternating current connection terminal 320D and the signal connection terminals 327U and 327L which align in a row on one side of the primary sealed body 302 is bent in the same direction. Accordingly, when the primary sealed body 302 and the auxiliary molded body 600 are metal-joined to each other in the connection portion 370, it is possible to improve productivity due to easy operation and to improve reliability of the metal joint.

Figure 11:
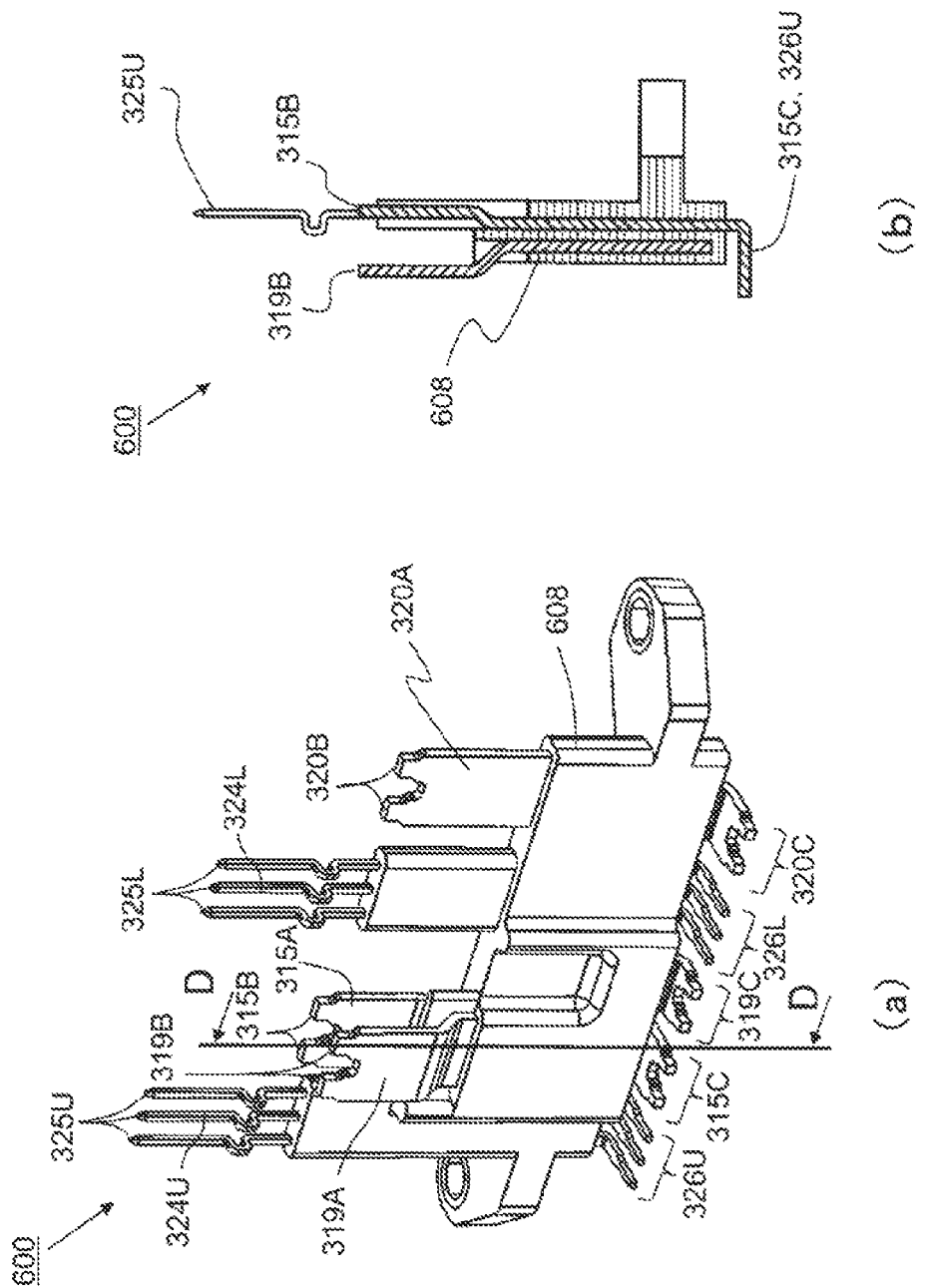
FIG. 11 is a view illustrating an auxiliary molded body 600.
Figure 12:
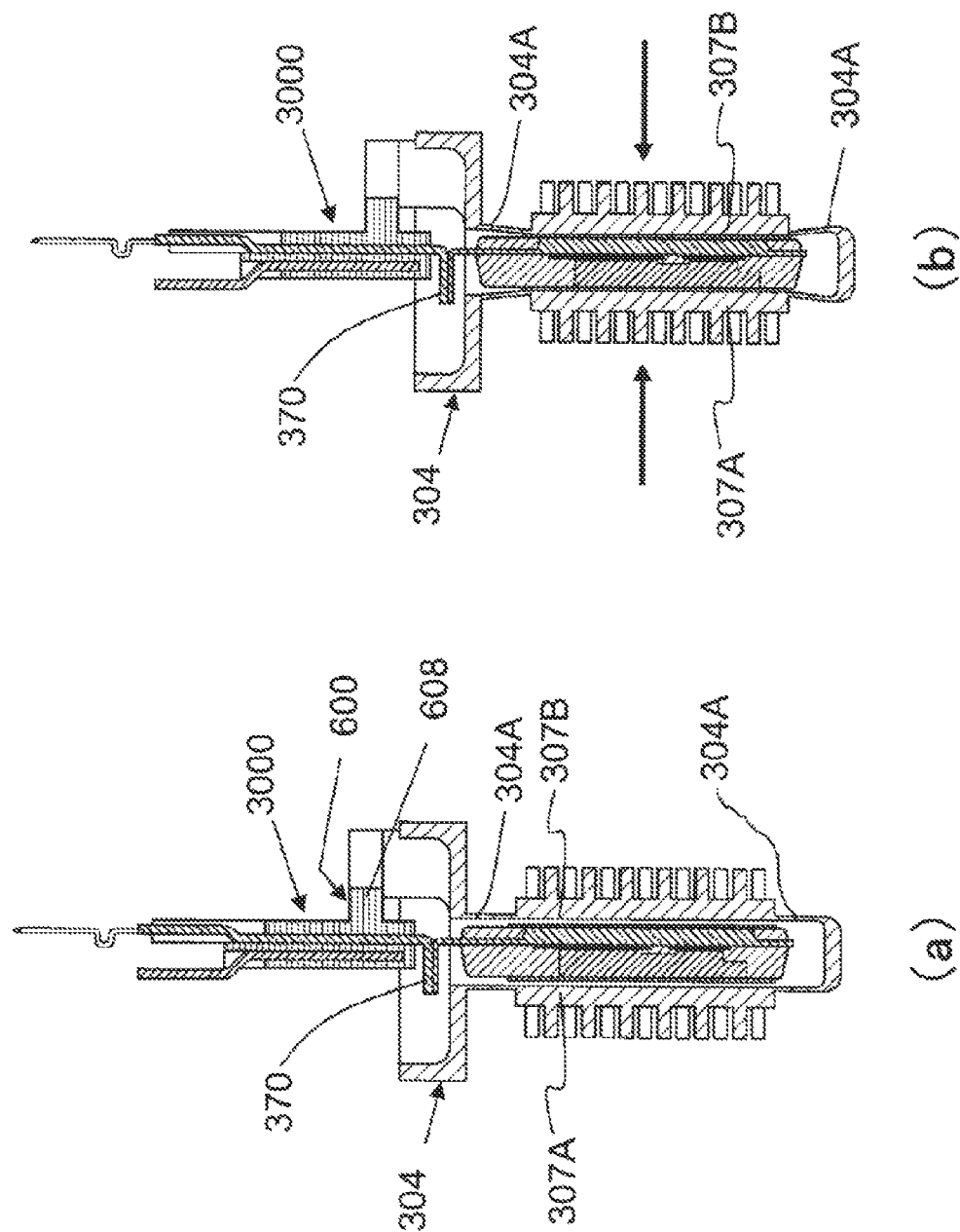
FIG. 12 is a view describing a state where the power module structure body 3000 is enclosed in a module case 304.

FIG. 11 is a view illustrating the auxiliary molded body 600, and (a) is a perspective view and (b) is a cross-sectional view taken along line D-D. The auxiliary molded body 600 includes a direct current positive electrode wiring 315A, a direct current negative electrode wiring 319A, an alternating current wiring 320A and signal wirings 324U and 324L. The direct current positive electrode wiring 315A, the direct current negative electrode wiring 319A, the alternating current wiring 320A and the signal wirings 324U and 324L are integrally molded in a state where the direct current positive electrode wiring 315A, the direct current negative electrode wiring 319A, the alternating current wiring 320A and the signal wirings 324U and 324L are insulated from each other by the wiring insulation portion 608 that is made of a resin material. The wiring insulation portion 608 functions as a supporting member that supports each wiring, and a thermosetting resin or a thermoplastic resin which has insulating properties is suitable as a resin material used in the wiring insulation portion 608. Accordingly, it is possible to ensure insulating properties between the direct current positive electrode wiring 315A, the direct current negative electrode wiring 319A, the alternating current wiring 320A and the signal wirings 324U and 324L and to form a high density wiring.

A direct current positive electrode terminal 315B is formed in an upper end of the direct current positive electrode wiring 315A, and a direct current positive electrode connection terminal 315C is formed in a lower end thereof to be bent at right angles. A direct current negative electrode terminal 319B is formed in an upper end of the direct current negative electrode wiring 319A, and a direct current negative electrode connection terminal 319C is formed in a lower end thereof to be bent in the same direction as the direct current positive electrode connection terminal 315C is directed. An alternating current terminal 320B is formed in an upper end of the alternating current wiring 320A, and an alternating current connection terminal 320C is formed in a lower end thereof to be bent in the same direction as the direct current positive electrode connection terminal 315C is directed. Signal terminals 325U and 325L are formed in upper ends of the signal wirings 324U and 324L, respectively. In contrast, signal connection terminals 326U and 326L are formed in lower ends of the signal wirings 324U and 324L to be bent in the same direction as the direction in which the direct current positive electrode connection terminal 315C is directed.

As such, as illustrated in FIG. 11(a), the direct current positive electrode connection terminal 315C, the direct current negative electrode connection terminal 319C, the alternating current connection terminal 320C and the signal connection terminals 326U and 326L are arranged to align in a row to configure the connection portion 370 on a side of the auxiliary molded body 600. The connection portions 370 (326U, 315C, 319C, 326L and 320C) on the side of the auxiliary molded body 600 are connected to the connection portion 370 (327U, 315D, 319D, 327L and 320D) on a side of the primary sealed body 302 which are arranged to align in a row as illustrated in FIG. 10. For example, it is possible to use a TIG welding or the like for the connection.

When the power module structure body 3000 is built as illustrated in FIG. 3, as illustrated in FIG. 12(a), the power module structure body 3000 is inserted into the module case 304, and the wiring insulation portion 608 of the auxiliary molded body 600 is fixed to the flange 304B of the module case 304. At the time of the insertion, an insulation layer 333 for achieving electrical insulation is disposed between the primary sealed body 302 of the power module structure body 3000 and the heat dissipating portions 307A and 307B of the module case 304. The insulation layer 333 will be in detail described later. As illustrated by arrows in FIG. 12(b), when pressure is applied toward the inside of the case on the heat dissipating portions 307A and 307B, the thin wall portion 304A is deformed, and the heat dissipating portions 307A and 307B are attached closely to the primary sealed body 302. Thereafter, when the module case 304 is filled with a sealing resin 351 (refer to FIG. 3) and is sealed, it is possible to reliably ensure a necessary insulation distance between the connection portion 370 and the module case 304.

For example, it is possible to use an epoxy-based resin such as a novolac-based epoxy resin, a multifunction-based epoxy resin or a biphenyl-based epoxy resin as the sealing resin 351. In addition, by adding ceramics such as SiO2, Al2O3, AlN, BN, a gel, a rubber or the like in the epoxy resin, the coefficient of thermal expansion of the epoxy resin is set to be close to those of the module case 304 or the conductor plates 315, 320, 318 and 319. Accordingly, it is possible to reduce a difference in coefficients of thermal expansion among the members and to greatly decrease thermal stress occurring from temperature increase under the operating environment, and thus, it is possible to extend the life of the power module.

(Description of Insulation Layer 333)

Figure 13:
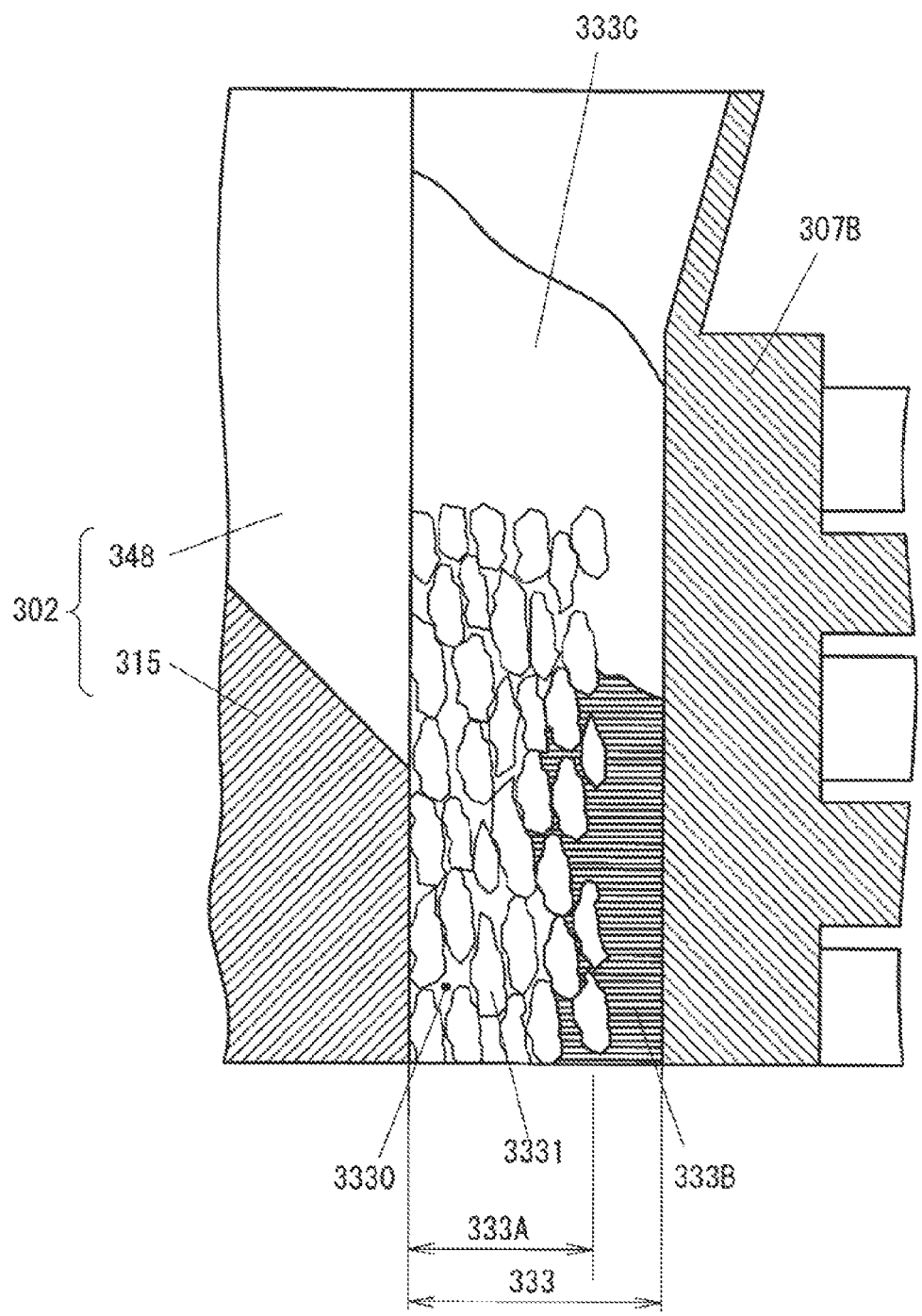
FIG. 13 is an enlarged view of a portion that is illustrated by reference sign B in FIG. 2.

FIG. 13 is a view describing the structure of the insulation layer 333. FIG. 13 is an enlarged view of a portion that is illustrated by a reference sign B in FIG. 2. The insulation layer 333 is provided to be interposed between the primary sealed body 302 and the heat dissipating portion 307B. The insulation layer 333 includes a layer of a thermal spray film 333A that an insulating oxide or ceramic powder are thermal-sprayed to form; an insulating resin layer 333B; and an insulating resin portion 333C that is provided in a circumferential end portion (an edge portion) of a laminated body formed by the thermal spray film 333A and the resin layer 333B. The insulation layer 333C is provided on the entire circumferential side surface. The thermal spray film 333A is formed on the side of the primary sealed body 302, and the resin layer 333B is formed between the thermal spray film 333A and the head dissipating portion 307B.

A void 3330 formed in the thermal spray film 333A is impregnated with an insulating resin. In an example that is illustrated in FIG. 13, the same resin as that used in the resin portion 333C is used as an impregnation resin. In addition, a filler for improving thermal conduction performance is mixed in a resin that configures the resin layer 333B. The resin portion 333C that is provided in the circumferential end portion of the laminated body formed by the thermal spray film 333A and the resin layer 333B is formed in a gap between the sealing resin 348 and the heat dissipating portion 307B in order for the circumferential end portion of the laminated body not to be exposed. A front surface of the thermal spray film 333A is a concave and convex surface, and a number of the voids 3330 are formed in the thermal spray film 333A. The resin layer 333B is provided in such a manner that apart thereof penetrate into the concave and convex surface of the thermal spray film 333A.

Figure 14:
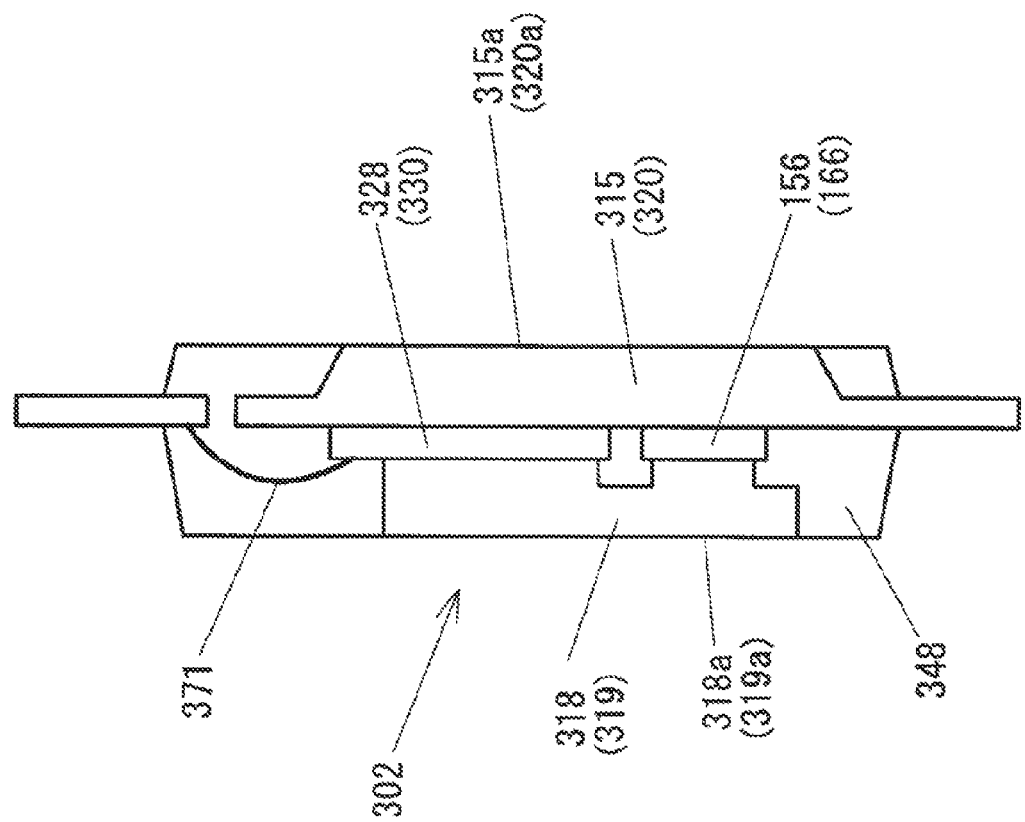
FIG. 14 is a cross-sectional view of the primary sealed body 302 illustrating a state before a thermal spray film 333A is formed.

FIGS. 14 to 17 are views illustrating a process of forming the insulation layer 333. FIG. 14 is a view describing a formation of the thermal spray film 333A onto the primary sealed body 302, and is a cross-sectional view illustrating the primary sealed body 302 before the thermal spray film 333A is formed. As described above, each in a pair of the conductor plates 315 and 318 and each in a pair of the conductor plates 320 and 319 is arranged to be opposite the other, and are arranged to align in a row in a direction orthogonal to a FIG. 14 drawing sheet. The IGBT 328 and the diode 156 are arranged to be interposed between the conductor plates 315 and 318, and the IGBT 330 and the diode 166 are arranged to be interposed between the conductor plates 320 and 319. The primary sealed body 302 is sealed by the sealing resin 348, but heat dissipating surfaces 315a, 318a, 319a and 320a (surfaces opposite surfaces to which the semiconductor chips are joined) of the conductor plates 315, 318, 319 and 320 are exposed from the sealing resin 348. The cross-sectional view in FIG. 14 and the cross-section C-C in FIG. 3 indicate cross-sections of the same portion, and FIG. 14 is a cross-sectional view of portions of the conductor plates 315 and 318.

<Formation of Thermal Spray Film 333A>

First, as illustrated in FIG. 15(a), the thermal spray films 333A are formed on both surfaces of the primary sealed body 302 in order for the insulation layer 333 to be formed as illustrated in FIG. 13. FIG. 15(b) is an enlarged view of a portion that is illustrated by a reference sign E in FIG. 15(a). The thermal spray film 333A is formed to include areas of the heat dissipating surfaces 315a, 318a, 319a and 320a, and an edge portion of the thermal spray film 333A is formed on the sealing resin 348. The thermal spray film 333A is an insulator, and is made by thermal-spraying an oxide or ceramic powder. In the embodiment, the ceramic thermal spray film 333A is formed by a plasma spraying method, but other thermal spraying methods such as an arc spraying method or a high-speed flame spraying method may be used.

When the thermal spraying method is used, temperature increase of the conductor plates 315, 318, 319 and 320 is much smaller than temperature increase when the conductor plates and a ceramic plate are joined to each other using a brazing filler material, and thermal deformation such as melting, thermal deterioration and warpage is also small. For example, when the thermal spray film 333A is formed by a plasma spraying method, temperature increase of the primary sealed body 302 is by approximately 100° C. to 180° C. For this reason, it is possible to prevent thermal deterioration of the sealing resin 348, the metal joint material 160, the IGBTs 328 and 330 and the diodes 156 and 166. Since the joining of the semiconductor elements by the metal joint material 160 is carried out in a temperature range of approximately 220° C. to 300° C., there is no problem even in a case where the thermal spray film 333A is formed after the joint is completed.

On one hand, in a case where the process is carried out in a reverse sequence in such a manner that the thermal spray film 333A is formed on the conduction plate 315 and then the semiconductors element is joined thereto, the joining temperature of the semiconductor elements is approximately 220° C. to 300° C. and is higher than temperature increase when the thermal spray film is formed, and thus, thermal stress occurring in a laminated portion of the thermal spray film 333A having a small coefficient of thermal expansion and the conductor plates 315, 318, 319 and 320 having great coefficients of thermal expansion becomes greater than that when the thermal spraying is carried out. That is, when a sequence is adopted where the semiconductor elements are joined to the conductor plates and then the thermal spray film 333A is formed, thermal stress is reduced.

In addition, when the surfaces (heat dissipating surfaces) of the conductor plates 315, 318, 319 and 320 on which the thermal spray film 333A is formed are roughened by a sand blasting process, an etching process or the like, it is possible to improve joint strength between the conductor plates 315, 318, 319 and 320 and the thermal spray film 333A. Furthermore, as illustrated in FIG. 15(a), since the primary sealed body 302 is sealed by the sealing resin 348, the sealing resin 348 protects the semiconductor chips (IGBTs 328 and 330 and diodes 156 and 166), the bonding wire 371 and the like from physical and chemical effects when the thermal spraying is carried out. For this reason, it is not necessary for complicated masking to be carried out for the thermal spraying, and thus good productivity is obtained.

The aforementioned roughening processes such as a sand blasting process or an etching process have the following advantages. When a transfer molding is carried out, there is a case where a part of the heat dissipating surfaces of the conductor plates 315, 318, 319 and 320 is coated with the sealing resin 348, but when a roughening process is carried out by the aforementioned sand blasting, it is possible to remove the sealing resin 348 from radiation surfaces. Since the sealing resin 348 has thermal conductivity smaller than those of the conductor plates, heat dissipation properties are improved due to the fact that the sealing resin 348 can be removed from the heat dissipating surfaces.

In addition, there is a case where a portion of the heat dissipating surfaces of the conductor plates is machined or polished in order to remove the sealing resin 348 or to improve flatness of the primary sealed body 302. When the process is carried out, there is a concern that, depending on process conditions (for example, a case where a machining or a polishing speed is increased in order to reduce a process time), surface roughness of the conductor plates becomes excessive or a burr is formed at boundaries between the conductor plates and the sealing resin 348, and thus, electric field is concentrated. However, since sandblasting or etching is carried out in a process before the thermal spray film is formed, it is possible to prevent the occurrence of the defects, and it is possible to achieve improvement in insulation reliability.

Powder for forming the thermal spray film 333A is preferably selected from high thermal conductive ceramic powder, for example, an oxide such as alumina, silica, magnesia or beryllia, a nitride such as an aluminum nitride, a silicon nitride or boron nitride, a carbide such as a silicon carbide, or the like. In addition, the powder is not limited to a composition of simple substance, and powder that has a composition of simple substance, a composite composition of an oxide and a nitride or a carbide, or mixed powder may be used.

As illustrated in FIG. 15(b), the thermal spray film 333A formed on the conductor plates 315, 318, 319 and 320 and the sealing resin 348 is an assembly of a flat body 3331 into which the aforementioned ceramic solidifies, and the flat bodies are piled up to form a layer. As such, when ceramic powder collides with base materials (conductor plates 315, 318, 319 and 320 and sealing resin 348) in a partially or completely melted state, the ceramic is meltingly bonded in a flat shape on front surfaces of the base materials, and furthermore is meltingly bonded onto the meltingly-bonded and solidified flat bodies 3331.

Accordingly, three-dimensionally, meltingly-bonded surfaces are formed at interfaces at which the flat bodies 3331 are in contact with each other, or at interfaces at which the flat bodies 3331 are in contact with ceramic fillers or resins in the conductor plates 315, 318, 319 and 320 and the sealing resin 348, and thus, a strong joint is obtained. For this reason, when, as described above, the primary sealed body 302 and the auxiliary module body 600 are metal-joined in the connection portion 370 to each other by TIG welding or the like after the thermal spray film 333A is formed on the primary sealed body 302 (refer to FIG. 3), peeling, fragments or the like of the thermal spray film 333A is unlikely to occur. When masking is carried out, it is possible to partially form the thermal spray film 333A, and thus, the thermal spray film 333A may be formed after the primary sealed body 302 and the auxiliary molded body 600 are metal-joined to each other. As described above, a metal such as Cu, Al, Ni, Au, Ag, Mo, Fe and Co, an alloy thereof or a composite thereof is used as the material of the conductor plates 315, 318, 319 and 320.

<Formation of Resin Layer 333B>

Subsequently, a formation of the resin layer 333B that configures an insulation layer will be described with reference to FIG. 16. As illustrated in FIG. 15, when the thermal spray films 333A are formed on both of the surfaces of the primary sealed body 302, the resin layers 333B are formed on the thermal spray films 333A. FIG. 16(b) is an enlarged view of a part E. At this stage, a protective film 352 is provided on a front surface of the resin layer 333B formed on the thermal spray film 333A.

The resin layer 333B serves to bond the surface of the primary sealed body 302, on which the thermal spray film 333A is formed, to the heat dissipating portions 307A and 307B of the module case 304, and the resin layer 333B is required to have sufficient bonding properties and high thermal conductivity. For this reason, a resin having bonding properties such as a phenolic-based resin, an acrylic-based resin, a polyimide-based resin, a polyamide imide-based resin, an epoxy-based resin, a silicon-based resin, a bismaleimide triazine-based resin, or a cyanate essel-based resin is used as a resin that configures the resin layer 333B. In particular, it is preferable to use a resin having high bonding properties such as a bismaleimide triazine-based resin, a polyamide imide-based resin, a polyimide-based resin, a cyanate essel-based resin, an epoxy-based resin or a phenolic-based resin, and after the bond is completed, the resin layer 333B is unlikely to peel off, and the life of the power module is extended.

In addition, the resin layer 333B is required to have high thermal conductivity in order that heat generated by the semiconductor elements (IGBTs 328 and 330 and diodes 156 and 166) is efficiently transferred to the heat dissipating portions 307A and 307B of the module case 304. For this reason, a filler having good thermal conductivity is mixed in the aforementioned resin for improvement of thermal conductivity, and the filler-mixed resin is used in the resin layer 333B. The filler mixed in the resin layer 333B preferably has insulating properties. A high thermal conductive ceramic filler such as an oxide such as alumina, silica, magnesia or beryllia, a nitride such as an aluminum nitride, a silicon nitride or boron nitride or a carbide such as a silicon carbide is more preferable. However, since the resin layer 333B is insulated by the 333A which is impregnated with a resin, it is possible to use a filler having electrical conductivity such as silver, copper, a solder or carbon.

In a case where the resin layer 333B is formed on the thermal spray film 333A, a resin sheet 3332 made of the aforementioned filler-mixed resin is first prepared (refer to FIG. 16(a)). The resin sheet 3332 is provided with the protective films 352 on both front and back surfaces thereof for easy handling. It is preferred to use polyethylene terephthalate, polyethylene, polypropylene, polybutylene terephthalate, Teflon (registered trademark) or the like, which can easily be peeled off after a temporary thermocompressive bond to be described later is completed, as the protective film 352.

Figure 16:
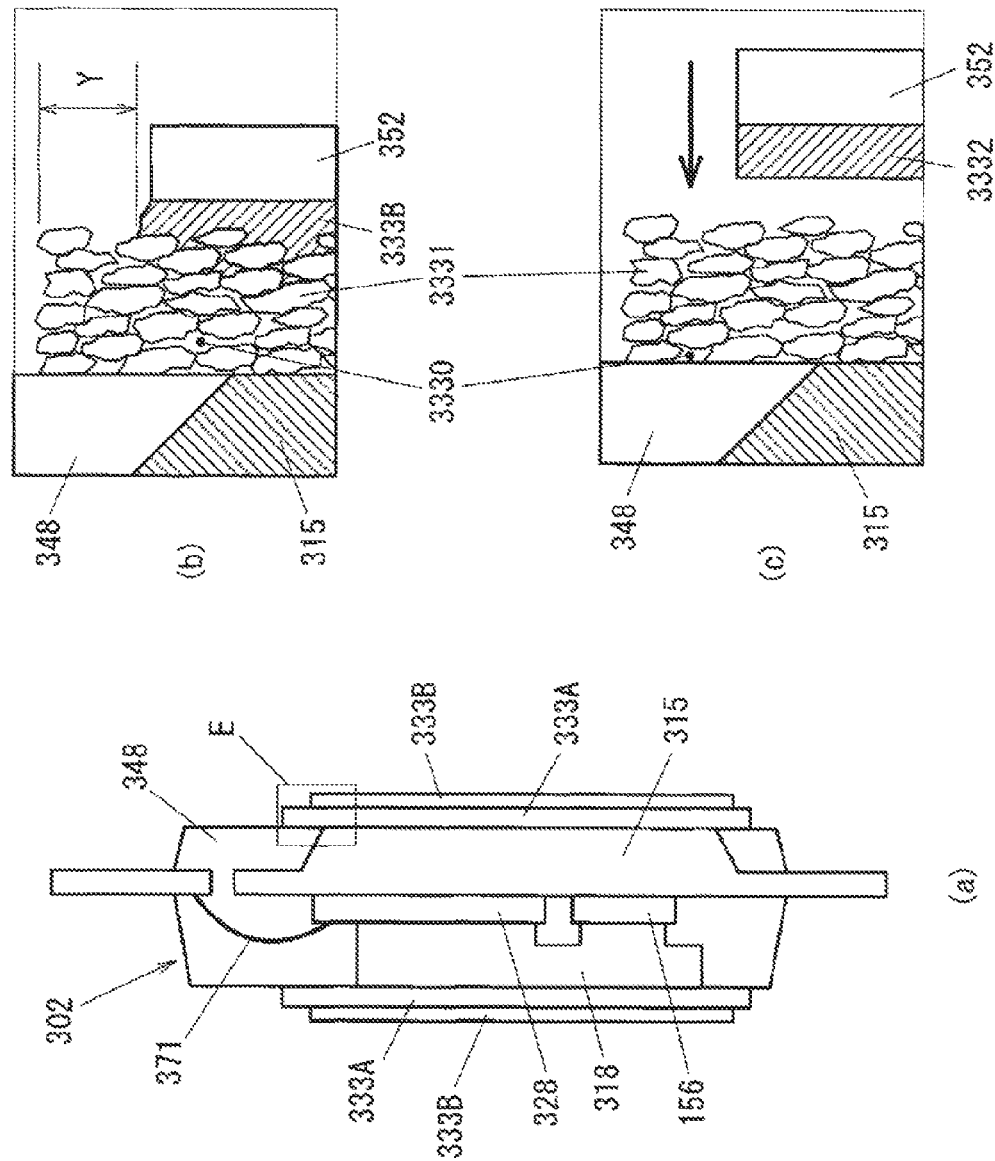
FIG. 16 is a view describing the process of forming the thermal spray film 333A, and illustrates a process subsequent to the process in FIG. 16.

As illustrated in FIG. 16(c), when the protective film 352 on one surface of the resin sheet 3332 is peeled off and is temporarily thermocompressively bonded onto the thermal spray film 333A as illustrated by an arrow, the resin layer 333B is formed on the thermal spray film 333A. After the primary sealed body 302 is accommodated in the module case 304, in a process to be described later, the temporarily thermocompressively-bonded resin layer 333B is finally thermocompressively bonded in order that the resin layer 333B and the heat dissipating portions 307A and 307B are bonded to each other. For this reason, in the temporary thermocompressive bond process that is illustrated in FIG. 16, a temperature condition and a pressure condition when the thermocompressive bond is formed are set in such a manner that a resin component is in a state of being half- or less-cured (for example, a state where a degree of curing of the resin component is approximately equal to or less than 80%).

When the temporary thermocompressive bond is carried out, a part of the resin sheet 3332 penetrates into a front-surface concave and convex portion of the thermal spray film 333A or voids in the vicinity of the front surface of the thermal spray film 333A. A particle size distribution of the filler mixed in the resin sheet 3332 is set in order for the filler together with the resin to penetrate into the concave and convex portion of the thermal spray film 333A. As a result, as illustrated in FIG. 16(b), the resin layer 333B is formed. As such, since a part of the resin layer 333B penetrates into the concave and convex portion of the thermal spray film 333A, it is possible to achieve improvement in bond strength and heat dissipation properties that result from an anchor effect.

In a formation range of the resin layer 333B, when the formation range is greater than areas of the heat dissipating surfaces 315a and 318a of the conductor plates 315 and 318 (FIG. 14), it is possible to most improve heat dissipation properties. As illustrated in FIG. 16(a), since thermal conductivity of the sealing resin 348 is sufficiently smaller than that of the conductor plates 315, 318, 319 and 320, the formation range of the resin layer 333B having high thermal conductivity is slightly greater than those of the conductor plates and is sufficient. In the embodiment, taking into consideration operation, to be described later, of impregnating the void 3330 of the thermal spray film 333A with a resin, it is necessary to set the formation range of the resin layer 333B to be smaller than an area of the thermal spray film 333A. In FIG. 16(b), an empty range that is illustrated by Y illustrates an area of an impregnation operation.

In the example that is illustrated in FIG. 16(c), the resin sheet 3332 is thermocompressively bonded onto the thermal spray film 333A such that the resin layer 333B is formed. However, the front surface of the thermal spray film 333A is coated with a filler-mixed resin such that the resin layer 333B may be formed. In this case, a mask is placed such that only a predetermined area is coated. That is, the mask is placed in an outer circumferential area of the thermal spray film 333A used for impregnation with a resin.

<Impregnation with Resin>

As illustrated in FIG. 16, after the resin layer 333B is formed on the thermal spray film 333A, the void 3330 of the thermal spray film 333A is impregnated with a resin. It is possible to fill the thermal spray film 333A up to a maximum ceramic fill factor of approximately 95%. However, as illustrated in FIG. 13, since the three-dimensional through-holes (voids 3330) are formed, an insulating characteristic or thermal conductivity of the thermal spray film 333A before the impregnation with a resin is carried out deteriorates due to the void 3330. In addition, since the three-dimensional through-holes are formed in the thermal spray film 333A, there is a problem in that crack sensitivity increases due to thermal stress associated with temperature fluctuation in this state.

The void 3330 of the thermal spray film 333A is impregnated with a resin in order that insulation, heat dissipation and thermal cycling resistance can be improved. Herein, it is preferable to use the impregnation resin that is the same as the resin used in the resin layer 333B since it is possible to improve bonding properties that show a high affinity at the time of curing. In addition, when the impregnation is carried out, the void 3330 preferably undergoes an etching process or a coupling process in order that affinity between the void 3330 of the thermal spray film 333A and the resin impregnating thereinto increases.

Furthermore, as illustrated in FIG. 13, since the power module is configured to have members necessary for required functions, the power module has a structure in which the following members having various coefficients of thermal expansion are laminated: the metal conductor plate 315; the resin-impregnated ceramic thermal spray film 333A; the resin layer 333B; and the metal heat dissipating portion 307B. As such, since members having various coefficients of thermal expansion are joined or are bonded to each other, stress concentrates in the end portion of the laminated body, and peeling occurs from the end portion and progresses. For example, when Cu is used as a material of the conductor plate 315, a coefficient of thermal expansion α thereof is approximately 17, and when Al is used as a material of the module case 304, the coefficient of thermal expansion α of the heat dissipating portion 307B is approximately 23. When a temperature of the entire module increases, peeling, a crack or the like is likely to occur due to a difference between the coefficients of thermal expansion.

In the embodiment, as illustrated in FIG. 13, the insulating resin portion 333C is set to be formed in a circumference of the end portion of the laminated body formed by the filler-contained resin layer 333B and the thermal spray film 333A in order that the concentration of thermal stress in the end portion is relieved. In the example that is illustrated in FIG. 13, the resin portion 333C covers the end portions of the resin layer 333B and the thermal spray film 333A, and extends in a circumferential direction of the end portions. In the embodiment, the same resin as the impregnation resin is used in the resin portion 333C, and the resin-impregnated thermal spray film 333A certainly has a small elastic modulus or high bond strength compared to the filler-contained resin layer 333B. Since the resin portion 333C is provided, it is possible to relieve stress in the end portions and to suppress occurrence or progression of peeling in the end portions in which stress is concentrated. Since the circumferential resin portion 333C is arranged between the sealing resin 348 and the heat dissipating portion 307B, heat dissipation of the power module is not affected at all even though thermal conductivity of the portion of the insulation layer 333 is low.

Figure 17:
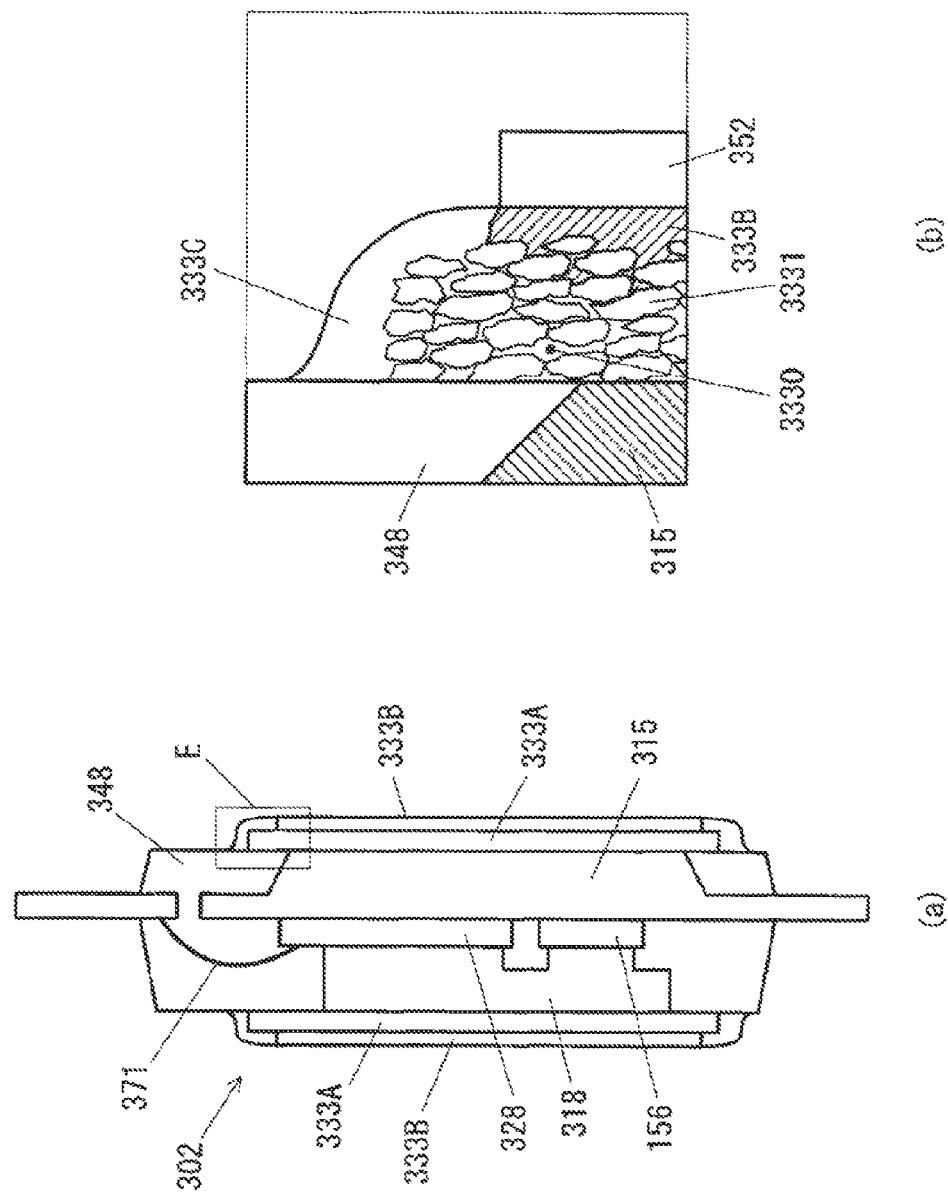
FIG. 17 is a view illustrating the primary sealed body 302 after the primary sealed body 302 is impregnated.

When the thermal spray film 333A is impregnated with a resin, the resin (the same resin as that of the resin portion 333C) is impregnated into the thermal spray film 333A from the impregnation operation area Y that is illustrated in FIG. 16. FIG. 17 is a view illustrating the primary sealed body 302 after the impregnation operation is completed. When the impregnation operation area Y is impregnated with the resin, the resin is impregnated into the void 3330 of the thermal spray film 333A between the resin layer 333B and the conductor plate 315 by capillary phenomenon. When the impregnation operation is carried out, the aforementioned resin portion 333C is formed with the resin used for the impregnation.

As illustrated in FIG. 17, since the void 3330 is impregnated with the resin, insulation, heat dissipation and thermal cycling resistance of the thermal spray film 333A are improved. In addition, the resin layer 333B is attached closely to the front-surface concave and convex portion of the thermal spray film 333A, and the impregnation resin cannot penetrate into locations of the thermal spray film 333A, to which the resin layer 333B of the thermal spray film 333A is bonded. For this reason, thermal conductivity between the thermal spray film 333A and the resin layer 333B is not affected by the impregnation with the resin.

When the impregnation operation is carried out in a depressurizing state, it is possible to prevent residual gas in the void 3330 from being trapped in the impregnation resin and from generating voids, and to prevent non-filling areas from occurring. In addition, the resin is injected from one location or one side of the impregnation operation area Y by a dispenser or the like, and thus, the injected impregnation resin flows through between the resin layer 333B and the conductor plate 315 and overflows from other sides. At this time, residual gas in the void 3330 is swept away by the resin and is discharged from the other sides. As a result, it is possible to prevent occurrence of voids caused by residual gas entrapment. The overflowing impregnation resin forms the aforementioned stress relief resin portion 333C. That is, the resin portion 333C of the end portion of the laminated body also is formed when the impregnation with the resin is carried out. Since the impregnation resin overflows from the other sides, it is possible to easily confirm if the impregnation resin is impregnated into the void 3330 between the resin layer 333B and the conductor plate 315. The injection of the resin may be carried out under a normal pressure, the pressure may be reduced after the injection is completed and thus, gas may be ejected from the resin.

Since the impregnation resin preferably has low viscosity, in order to decrease viscosity, a filler is not mixed in the embodiment. Since the ceramic thermal spray film 333A has satisfactory thermal conductivity when the void 3330 is impregnated with a resin, a filler may not be mixed in the impregnation resin. As long as a viscosity is in an impregnatable range, a filler may be mixed for adjustment of the viscosity at the time of supply. Furthermore, the impregnation resin is set to have a range of filler content by percentage smaller than that of the resin layer 333B in order that the impregnation resin can have a smaller elastic modulus or more improved bond force than the resin layer 333B. In addition, a solvent component may be increased to decrease the viscosity of the impregnation resin. The impregnation resin may be the same as or may be different from the resin used in the resin layer 333B.

When heating is carried out for removal of a solvent in the impregnating process or thereafter, a temperature or time is set in such a manner that curing of the resin layer 333B does not progress further than a half-cured state. In addition, as illustrated in FIG. 17, when the protective film 352 is provided on the temporarily-attached resin layer 333B, it is possible to prevent a resin (a resin for filling), which decreases thermal conductivity, from being deposited on the front surface (surface facing the heat dissipating portion 307B) of the resin layer 333B. Accordingly, productivity improvement is achieved.

<Enclosing Primary Sealed Body 302 in Module Case 304>

As illustrated in FIG. 17, after the thermal spray film 333A is impregnated with a resin, the primary sealed body 302 is enclosed in the module case 304. First, the protective film 352 (refer to FIG. 16(b)) that is affixed onto the front surface of the resin layer 333B of the primary sealed body 302 is peeled off therefrom, and as illustrated in FIG. 12(a), the primary sealed body 302 is inserted into the module case 304. Under a predetermined temperature condition and a pressure condition, the heat dissipating portions 307A and 307B are pressurized in an arrow direction in FIG. 12(b), and the heat dissipating portions 307A and 307B are bonded to the resin layer 333B. Thereafter, the module case 304 is filled with the sealing resin 351 and is sealed.

As such, since the resin layer 333B is provided between the thermal spray film 333A and the heat dissipating portion 307B, a surface (bonding surface) of the primary sealed body 302, which is in contact with the heat dissipating portion 307B, is flattened, and thus it is possible to prevent voids from occurring between the primary sealed body 302 and the heat dissipating portion 307B.

Thermal resistance of the resin layer 333B provided between the thermal spray film 333A and the heat dissipating portion 307B is reduced as far as the thickness thereof is made small, and heat dissipation of the insulation layer 333 is improved. However, when the temporarily-attached resin layer 333B has an excessively small thickness, the resin layer 333B cannot deal with surface roughness of an inner surface of the heat dissipating portion 307B. For this reason, the resin layer 333B that is temporarily attached onto the thermal spray film 333A desirably has a minimum thickness greater than a range of the thickness in which the resin layer 333B can absorb the maximum surface roughness Rmax of the inner surface of the heat dissipating portion 307B. The thickness can be easily adjusted when the thickness of the resin sheet 3332 is adjusted. For example, the maximum thickness of the resin layer 333B in a temporarily-attached state is adjusted to be in a range of 10 µm to 50 µm, and to be preferably in a range of 10 µm to 30 µm.

A volume fraction of a filler mixed in the bonding resin layer 333B is in a range of 5% to 80%. Thermal conductivity becomes high as far as the volume fraction is great and heat dissipation is improved, but since bond strength deteriorates, the volume fraction is preferably in a range of 30% to 60%.

In addition, a side of the bonding surface in the heat dissipating portion 307B undergoes a physical roughening process such as sand blasting or dimpling or a chemical roughening process such as etching, anodization or a chemical conversion treatment or a layer having good properties of bonding to a resin is provided on the side of the bonding surface by a plating, a sputtering or a coupling process, and thus bond strength can be relatively improved. For this reason, it is possible to further increase the volume fraction of the filler mixed in the resin layer 333B.

-Second Embodiment-

Figure 18:
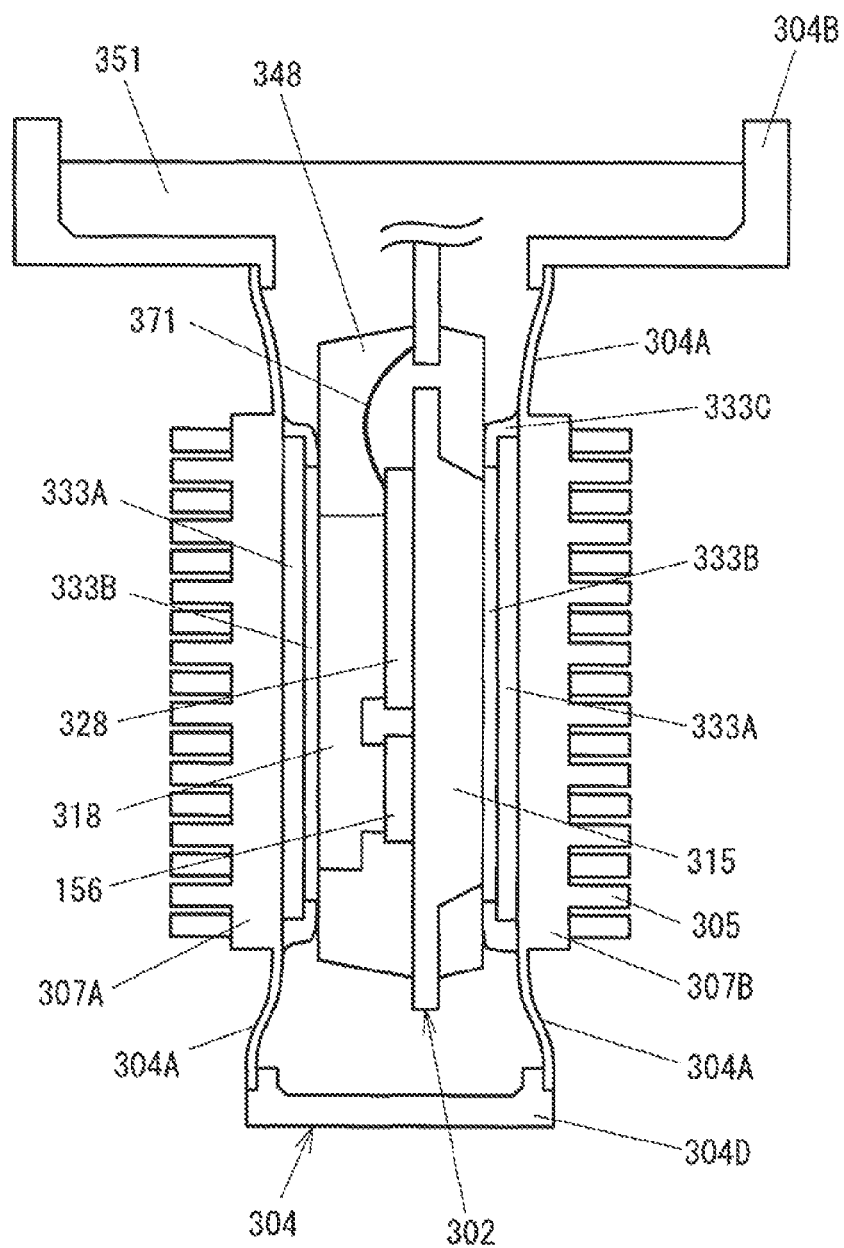
FIG. 18 is a cross-sectional view of the power module according to a second embodiment.

FIGS. 18 to 21 are views illustrating a second embodiment. FIG. 18 is a cross-sectional view of the power module. The auxiliary molded body 600 of the primary sealed body 302 is not illustrated. In the first embodiment, the module case 304 is integrally formed but in the second embodiment, the module case 304 is configured to have a case frame body and a pair of case side portions. The case frame body is configured to have a thick flange 304B and a frame portion 304D. One side (left side in FIG. 18) of the pair of case side portions 304C is configured to have the heat dissipating portion 307A on which the fin 305 is formed and the thin wall portion 304A that surrounds the heat dissipating portion 307A. The case side portion 304C on the other side is configured to have the heat dissipating portion 307B on which the fin 305 is formed and the thin wall portion 304A that surrounds the heat dissipating portion 307B. The thin wall portion 304A is metal-connected to the case frame body and thus, the module case 304 is formed.

In the embodiment, the thermal spray films 333A are formed on sides of the heat dissipating portions 307A and 307B, and the resin layers 333B are formed on sides of the conductor plates 315 and 318. The thermal spray film 333A is impregnated with a resin. In addition, the resin portion 333C is provided in the circumferential end portion of the laminated body formed by the resin-impregnated thermal spray films 333A and the resin layers 333B to cover the end portion.

Figure 20:
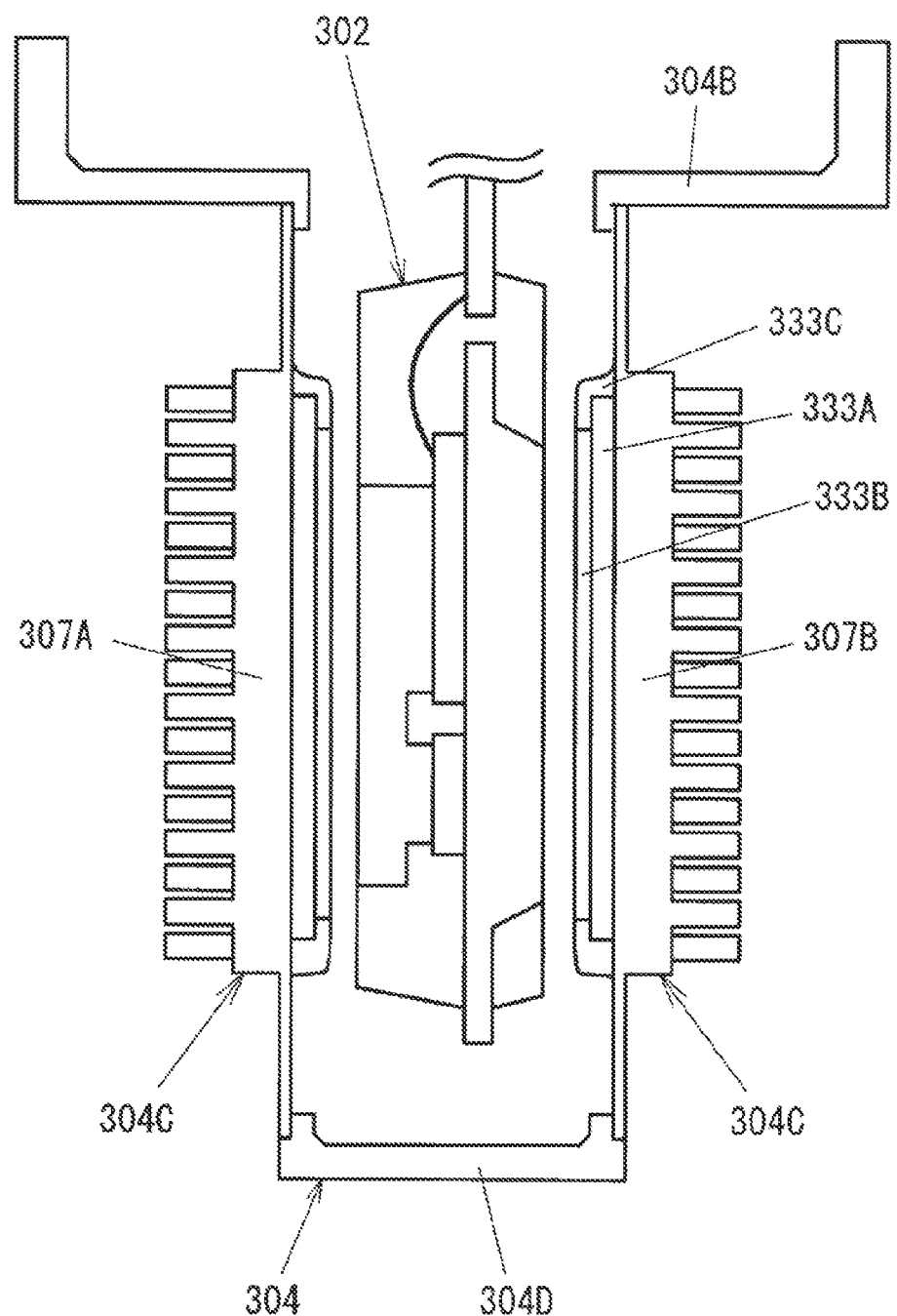
FIG. 20 is a view illustrating a state where the primary sealed body 302 is inserted into the module case 304 on which an insulation layer 333 is formed.
Figure 21:
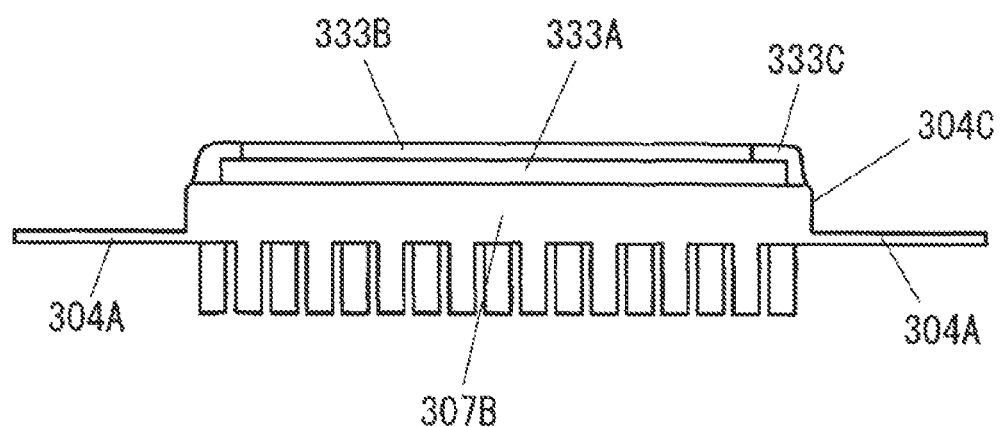
FIG. 21 is a view illustrating a heat dissipating portion 307B on which the insulation layer 333 is formed.

FIGS. 19 to 21 are views describing a process of assembling the power module. In a process that is illustrated in FIG. 19(a), the case side portion 304C is prepared before the case side portion 304C is metal-joined to the case frame body, and the thermal spray film 333A is formed on a side of a case inner circumferential surface of the heat dissipating portion 307B. A method of forming the thermal spray film 333A is the same as that of the first embodiment. Since, when thermal spraying is carried out, temperature increase of a thermal-sprayed body is by approximately 100° C. to 200° C. as described above, as illustrated in FIG. 19(a), it is possible to carry out the thermal spraying process on the heat dissipating portion 307B in a state where the fin 305 or the thin wall portion 304A is formed. A masking process is carried out in order for the thermal spray film 333A not to be formed on the thin wall portion 304A.

It is possible to manufacture the case side portion 304C in which the fin 305 and the thin wall portion 304A are formed in the heat dissipating portions 307A and 307B using a casting, a forging or a machining process. The following material is used: Cu; a Cu alloy; a composite such as Cu—C or Cu—CuO; or a composite such as Al, an Al alloy, AlSiC or Al—C.

Subsequently, similar to in the first embodiment, the resin sheet 3332 is temporarily attached (temporarily fixed) onto the thermal spray film 333A, and thus the resin layer 333B is formed (FIG. 19(b)). Thereafter, the thermal spray film 333A is impregnated with a resin, and the resin portion 333C is formed in the circumferential end portion of the laminated body formed by the thermal spray film 333A and the resin layer 333B by the impregnation resin (FIG. 19(c)). The processes up to the process that is illustrated in FIG. 19(c) are carried out on both the case side portion 304C on which the heat dissipating portion 307A is formed and the case side portion 304C on which the heat dissipating portion 307B is formed.

In addition to the aforementioned method of using the resin sheet 3332 as a method of forming the resin layer 333B, a coating, spraying or dipping method may be used using a liquid filler-mixed resin. Since the resin layer 333B is formed in a range narrower than the range of the thermal spray film 333A, masking is carried out in a portion on an edge of the range of the thermal spray film and the resin layer 333B is formed. A resin is impregnated into the thermal spray film 333A from an area in which the resin layer 333B is not formed due to the masking. In addition, similar to in the case where the resin sheet 3332 is used, since the protective film 352 is placed on the front surface of the resin layer 333B, impregnation operation is easily carried out.

Thereafter, as illustrated in FIG. 20, the pair of case side portions 304C, in which the resin-impregnated thermal spray film 333A, the resin layer 333B and the resin portion 333C are formed, respectively, are metal-joined to the case frame body that is configured to have the flange 304B and the frame portion 304D, and thus the module case 304 is formed. An edge portion of the thin wall portion 304A separated from the resin portion 333C is metal-joined using a method such as a laser welding or a friction stir joint in which a thermally affected area is minimal. Since a method with the minimally thermally-affected portion is selected, it is possible to maintain a rate of progression of curing in the resin layer 333B, the resin that is impregnated into the thermal spray film or the resin portion 333C.

Subsequently, the primary sealed body 302 is inserted into the module case 304 and is fixed. The heat dissipating portions 307A and 307B are heated while pressure is applied toward the inside of the case thereon, and the inner circumferential surfaces of the heat dissipating portions 307A and 307B are bonded to the resin layer 333B. Thereafter, the module case 304 is filled with the sealing resin 351 and thus, the power module that is illustrated in FIG. 18 is finished.

In the example that is illustrated in FIGS. 19 and 20, the heat dissipating portions 307A and 307B which are thick wall portions protrude farther outside of the case than the thin wall portion 304A. However, as illustrated in FIG. 21, the heat dissipating portions 307A and 307B may be configured to protrude farther inside of the case than the thin wall portion 304A. In addition, the thermal spray film 333A may have the same area as those of the heat dissipating portions 307A and 307B which are thick wall portions.

As such, since the second embodiment has a configuration in which the case frame body and the case side portion 304C are individually formed and are metal-joined such that the integrated module case 304 is formed, it is possible to easily form the thermal spray film 333A on sides of the inner circumferential surfaces of the heat dissipating portions 307A and 307B.

When Cu or a Cu alloy is used in the conductor plates 315 and 318 and a composite such as AlSiC or AlC is used in the module case 304, the conductor plates 315 and 318 have a coefficient of thermal expansion greater than that of the module case 304. In this case, when a member configuring the insulation layer 333 is configured in such a manner that a coefficient of thermal expansion of the member decreases from a side of the conductor plate 315 to the heat dissipating portion 307B, thermal stress occurring in the end portion of the laminated body due to temperature change during use can be made small. For this reason, the thermal spray film 333A having a smaller coefficient of thermal expansion is formed on the heat dissipating portion 307B and is impregnated with a resin and thus, a coefficient of thermal expansion of the entirety of the impregnation resin and the thermal spray film 333A becomes close to a coefficient of thermal expansion of the heat dissipating portion 307B. On one hand, a resin having a great coefficient of thermal expansion is selected for the resin layer 333B and the amount of filler mixing is adjusted and thus, the coefficient of thermal expansion of the resin layer 333B is set to be close to the coefficient of thermal expansion of the conductor plate 315.

The second embodiment is similar to the first embodiment in that the insulation layer 333 is set to be the laminated body formed by the resin-impregnated thermal spray film 333A and the filler-mixed resin layer 333B such that thermal conduction performance between the conductor plate 315 and the heat dissipating portion 307 is improved. Furthermore, the second embodiment is similar to the first embodiment even in that the resin portion 333C is provided such that increase in thermal stress in the end portion of the laminated body can be relieved.

-Third Embodiment-

Figure 22:
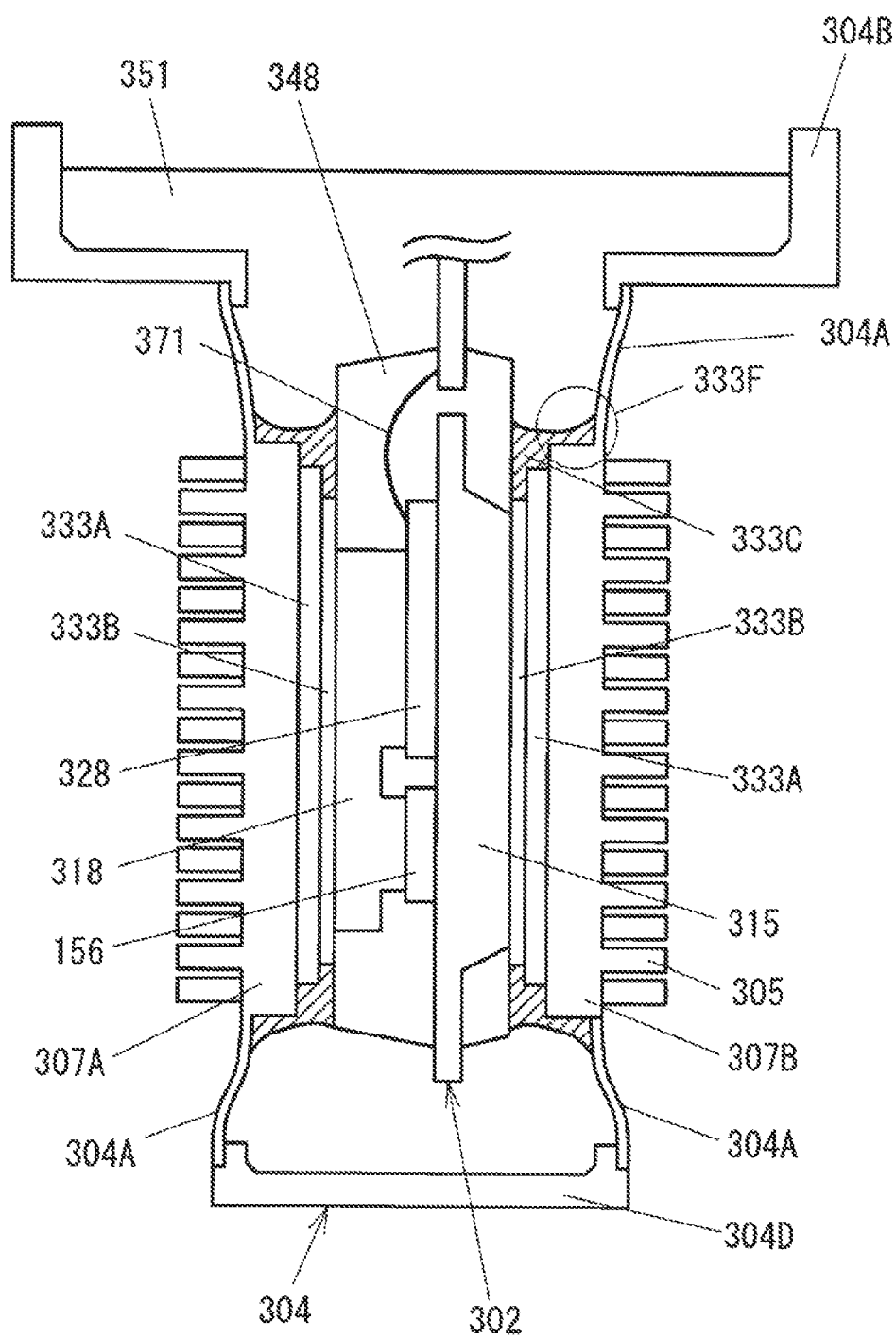
FIG. 22 is a view describing a third embodiment.

FIG. 22 is a view describing a third embodiment. As in the aforementioned second embodiment, since the resin portion 333C having a lower elastic modulus or great bond force is provided in the circumferential end portion of the laminated body that is configured to have the thermal spray film 333A and the resin layer 333B, stress is prevented from being concentrated in the end portion, and peeling is prevented from occurring from the end portion and from progressing. In the third embodiment, the amount of a resin configuring the resin portion 333C is increased and thus, effects of relieving the stress concentration are further improved.

In the example that is illustrated in FIG. 22, since the amount of overflow of the impregnation resin (the same resin as that of the resin portion 333C) is great, a fillet 333F (a portion that protrudes from a gap) is formed. In the method of forming the laminated body which is illustrated in the first embodiment, the amount of the resin is set to be great at the time of the impregnation of the thermal spray film 333A and thus, the resin greatly overflows in a circumferential direction of the laminated body. Hereinafter, another method, in which the resin greatly overflows in the circumferential direction of the laminated body, will be described. In a method of forming the laminated body to be described hereinafter, the resin layer 333B is bonded to the heat dissipating portion or the conductor plate by applying pressure, and overflowing resin forms the fillet 333F.

FIG. 23 is a view describing a first formation method. FIG. 23(a) is a view illustrating a state before pressure is applied toward the primary sealed body 302 to the heat dissipating portion 307B and the heat dissipating portion 307B is bonded to the resin layer 333B. The thermal spray film 333A is formed on the heat dissipating portion 307B, and a resin 333D is impregnated into the thermal spray film 333A. Herein, the amount of the impregnation resin 333D is increased and thus, the resin 333D is provided on not only a side of the upper surface of the thermal spray film 333A but also sides of side surfaces of the thermal spray film 333A.

In a stage that is illustrated in FIG. 23(a), the resin 333D is not in a cured state. Herein, a resin that is different from the resin sheet 3332 used in the resin layer 333B and the resin 333D is used. The resin sheet 3332 is made of a resin of which a main component is a thermoplastic resin, and is a composition that has a thermally cured portion. For the resin 333D, a thermosetting resin is selected of which viscosity in a temperature range of a room temperature to 150° C. is lower than that of the resin 333B and which has good impregnability. In a state that is illustrated in FIG. 23(a), a method may be used where the resin sheet 3332 is attached in a half-cured state onto the primary sealed body 302 and thereafter, the resin 333D is formed using a coating, spraying or dipping and thus, the thermal spray film 333A is coated with the resin 333D. A method may be used where the thermal spray film 333A is coated with the resin 333D, and the primary sealed body 302, to which the impregnated resin sheet 3332 is attached in a half-cured state, may be mounted thereon.

In a process that is illustrated in FIG. 23(b), pressure is applied on the heat dissipating portion 307B in a direction of the primary sealed body 302. As a result, the resin 333D between the thermal spray film 333A and the resin layer 333B is extruded to sides (in a right and left direction in FIG. 23(b)) of the thermal spray film 333A and the resin layer 333B, and as illustrated in FIG. 23(b), the extruded resin 333D accumulates in the circumferential end portion of the laminated body that is configured to have the thermal spray film 333A and the resin layer 333B. In this state, the resin 333D and the resin layer 333B are cured. In order to discharge the resin 333D in the circumferential end portion, it is necessary to apply pressure on the heat dissipating portion 307B in the direction of the primary sealed body 302 in a state where viscosity of the resin sheet 3332 is satisfactorily greater (for example, by 50 times or greater) than that of the resin layer 333D at a temperature when pressure is applied, and the resin sheet 3332 is made of a resin of which a main component is a thermoplastic resin and is a composition that has a thermally cured portion. For the resin 3333D, a thermosetting resin is selected of which viscosity in a temperature range of a room temperature to 150° C. is lower than that of the resin 333B and which has good impregnability and thus, the range of a heating temperature at which the resin 333D is dischargeable by applying pressure becomes wide. For this reason, effects of production stability improvement are obtained. The resin 333D is discharged and thus, a filler mixed in the resin 333B can be arranged in the concave portion of the thermal spray film 333A. As a result, it is possible to improve heat dissipation properties of the insulation layer 333. In the example that is illustrated in FIG. 22, a filler is mixed in the resin layer 333B and is not mixed in the resin 333D, but the filler may be mixed in the resin 333D as long as the viscosity is not in an increased range for discharge of the resin 333D. When an elastic modulus of the resin layer 333B is greatly great at a thermocompressive-bond temperature, a filler is put in the resin 333D and thus, it is possible to arrange the filler in the concave portion of the thermal spray film 333A. In addition, when a resin having a high glass transition temperature is used in the resin sheet 3332 and a resin having a glass transition temperature lower than that of the resin sheet 3332 is used in the resin 333D, manufacturing can be performed using thermoplastic resins or thermosetting resins. In this case, pressure is applied on the resin 333D and the resin 333D is discharged to the outside at a temperature lower than the glass transition temperature of the resin sheet 3332.

FIG. 24 is a view describing another method of forming the laminated body. As illustrated in FIG. 24, first, the thermal spray film 333A is formed on the heat dissipating portion 307B, and the resin sheet 3332 is arranged above the thermal spray film 333A. The amount of the resin sheet 3332 is set to be greater than the amount of the resin layer 333B to be formed. Subsequently, as illustrated in FIG. 24(b), pressure is applied on the heat dissipating portion 307B in the direction of the primary sealed body 302, the resin sheet 3332 is thermocompressively bonded to the primary sealed body 302 and the resin layer 333B is formed. Since pressure is applied on the resin sheet 3332 at the time of the thermocompressive bond until the thickness of the resin layer 333B is reached, a resin component of the resin sheet 3332 is impregnated into the void 3330 of the thermal spray film 333A, and the resin component overflows from the circumference of the thermal spray film 333A. As a result, the resin component overflowing from the circumference of the laminated body forms the resin portion 333C and the fillet 333F.

For example, the amount of a filler that is mixed in the resin sheet 3332 is set to be 20 vol %. The filler has a size smaller than that of the concave portion in the front surface of the thermal spray film 333A, and is set to be larger than that of the void 3330 in the thermal spray film 333A. When the resin component of the resin sheet 3332 is impregnated into the void 3330 in the thermal spray film 333A, pressure is applied on the resin sheet 3332 in order for the resin to flow out of the circumferential end portion and the resin component of the resin layer 333B is reduced by half, and filler mix rate of the resin layer 333B is increased by up to approximately 40 vol %. When a part of the resin sheet 3332 flows in the circumferential direction, a filler is mixed even in the resin portion 333C or the fillet 333F. In addition, manufacturing can be performed by a coating or a dipping process using a filler-mixed resin in addition to the resin sheet.

Figure 25:
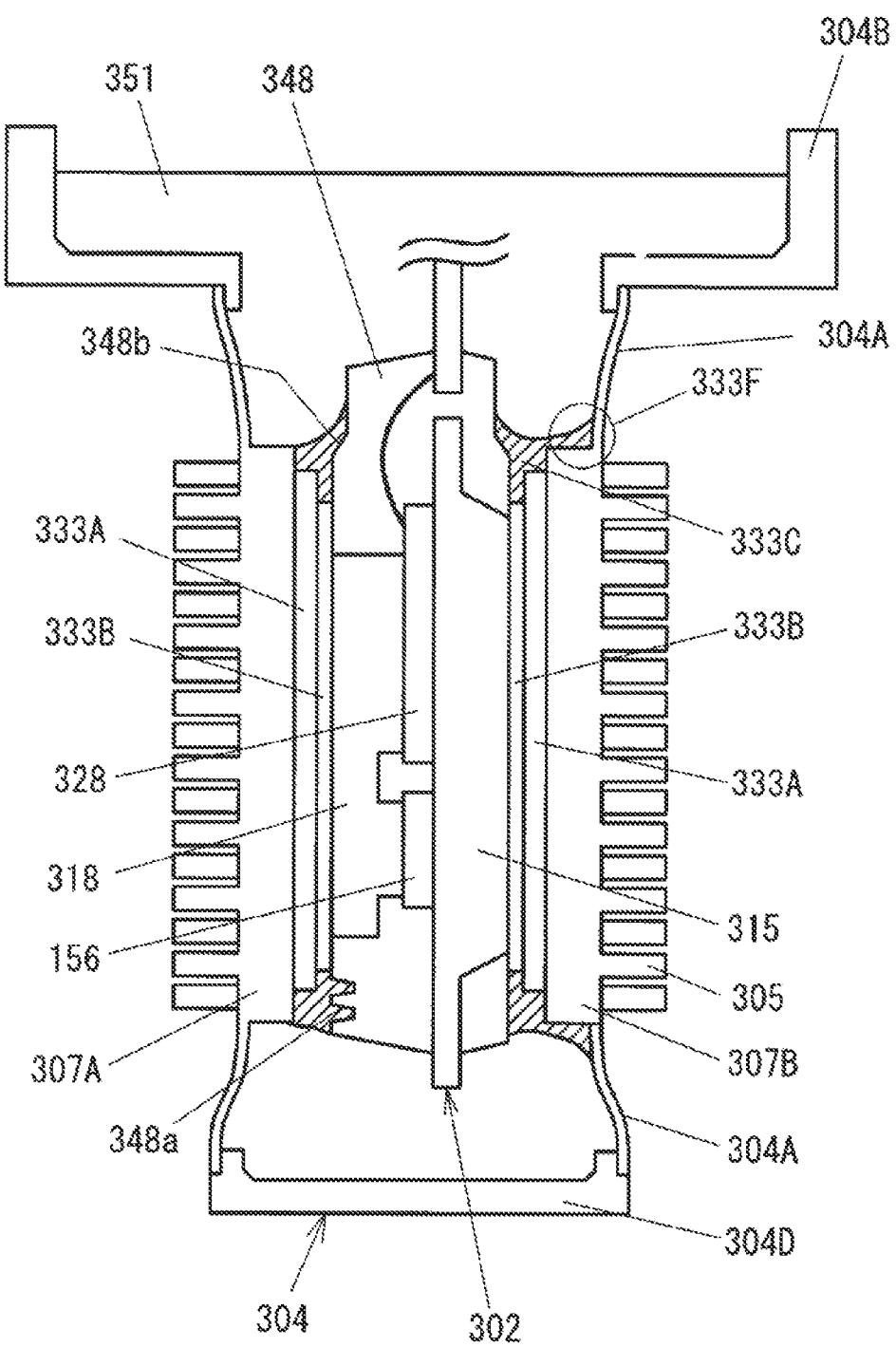
FIG. 25 is a view illustrating a first modification example.
Figure 26:
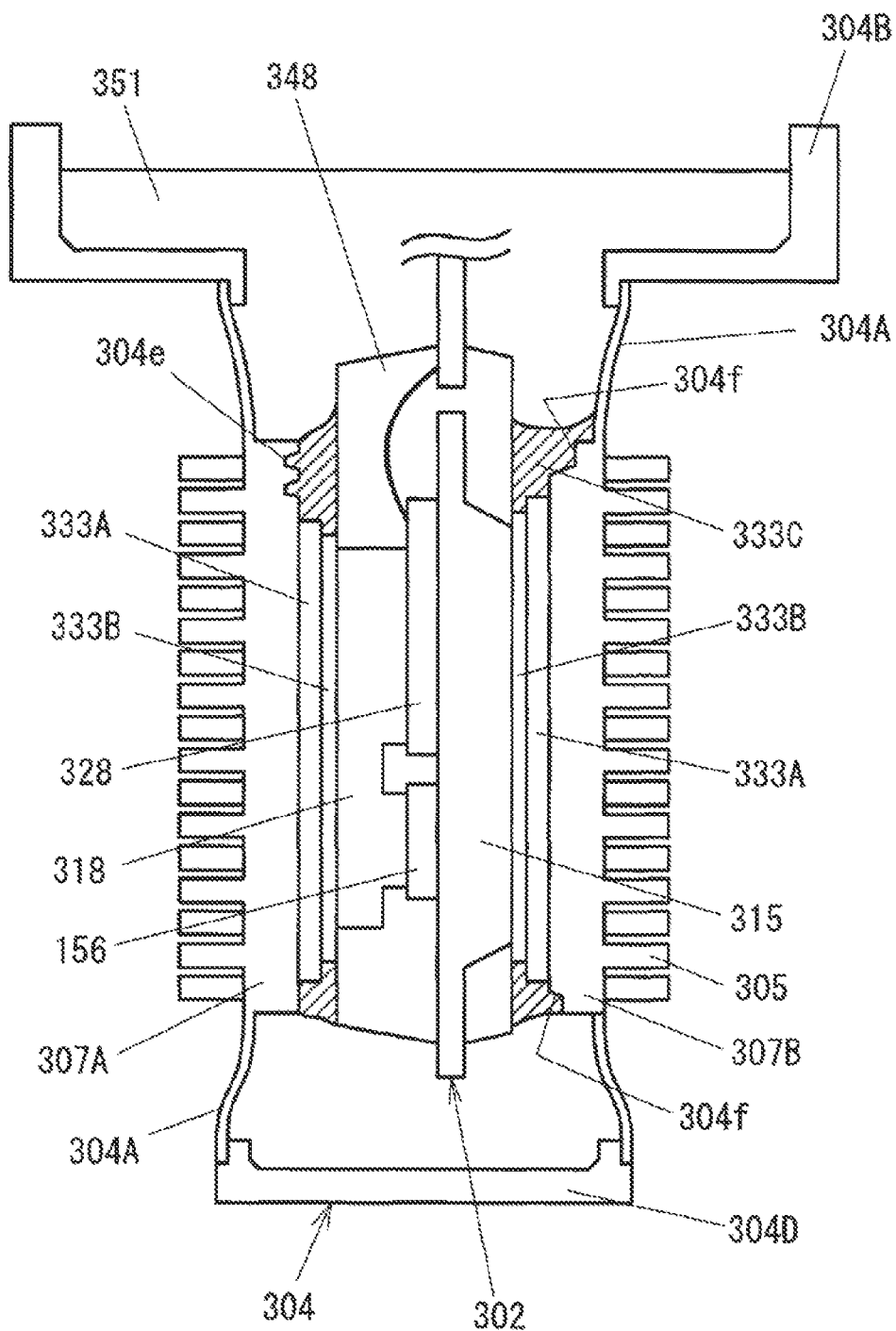
FIG. 26 is a view illustrating a second modification example.

FIGS. 25 and 26 are views illustrating modification examples. In the modification example that is illustrated in FIG. 25, a concave portion 348a or a step 348b is formed in a part of the circumference or the entire circumference of an outer circumferential portion of the sealing resin 348. The resin 333D overflowing from the circumferential direction penetrates into the concave portion 348a or the step 348b, and the amount of resin of the fillet 333F becomes greater. As a result, it is possible to improve stress relief in the end portion of the laminated body. Furthermore, not only the amount of resin involved with stress relief is increased, but bond force also becomes great due to an anchor effect resulting from the penetration of resin into the concave portion 348a or the step 348b.

FIG. 26 illustrates a case where a concave portion 304e or a step 304f is formed on a side of the module case (heat dissipating portions 307A and 307B). Instead of the concave portion 304e or the step 304f, the heat dissipating portions 307A and 307B may have angled portions chamfered and have a tapered shape. As illustrated in FIGS. 25 and 26, when steps are provided in the sealing resin 348 on a side of the insertion opening 306 of the module case 304 or in the heat dissipating portions 307A and 307B, a gap in the end portion of the thermal spray film 333A increases. For this reason, in a state where the thermal spray film 333A is bonded to the primary sealed body 302 or the heat dissipating portions 307A and 307B, impregnation with a resin is easily carried out from an increased gap portion.

-Fourth Embodiment-

In the aforementioned embodiment, the power module is described in which the primary sealed body 302 is inserted into the CAN-type module case 304 and is sealed by a resin.

However, in a fourth embodiment, a case will be described where structures of the laminated body, the resin portion 333C and the like can be applied even to the power module with another structure.

Figure 27:
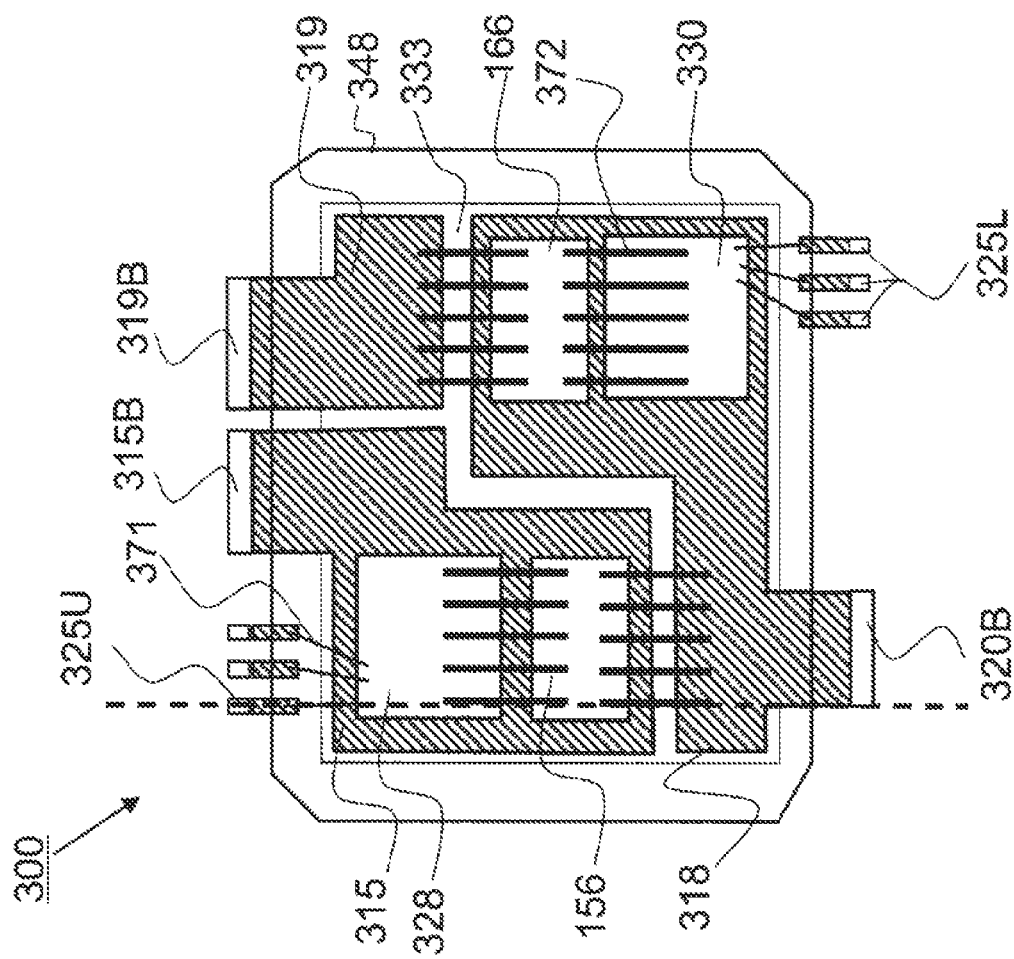
FIG. 27 is a view describing a configuration of a resin-sealed single side cooling power module 300.
Figure 28:
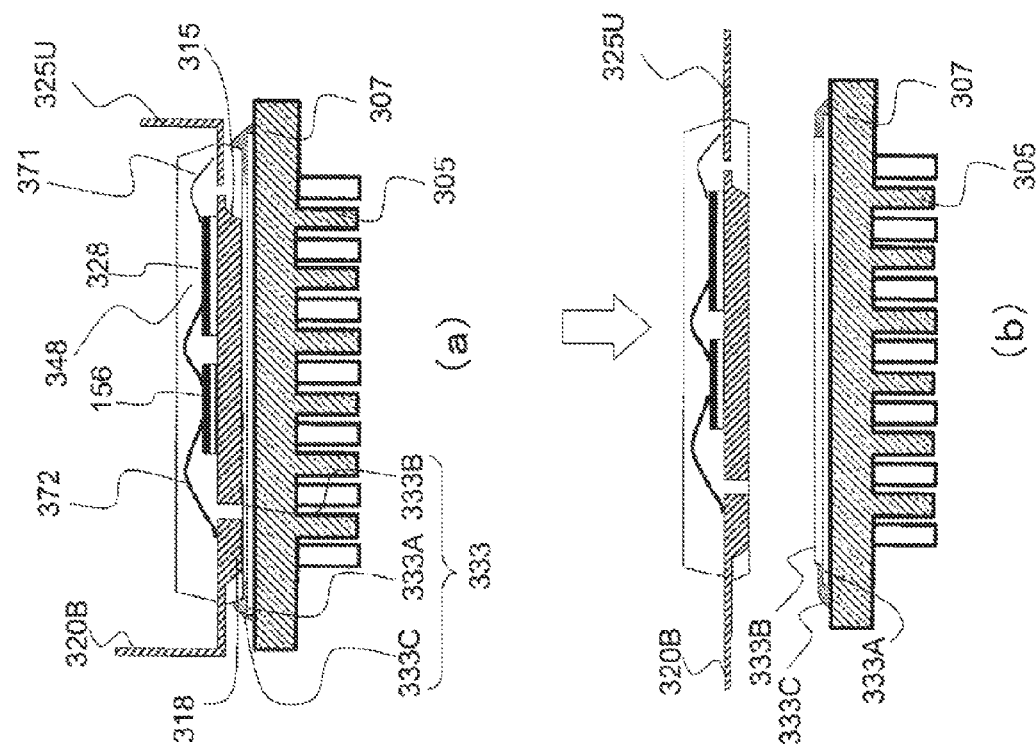
FIG. 28 is a view describing a bond of the single side cooling power module 300 to the heat dissipating portion 307.

A configuration of the resin-sealed single side cooling power module 300 used in an inverter unit 140 will be described with reference to FIGS. 27 and 28. FIG. 27 illustrates arrangement of the semiconductor chips and the conductor plates to put the circuit in FIG. 4 into practice. In the arrangement, the conductor plates 318 and 320 can be formed to have the same electrical potential using a sheet of conductor plates (hereinafter, referred to as the conductor plate 318). Main front surface electrodes of the IGBTs 328 and 330 and the diodes 156 and 166 are connected to each other by a plurality of metal wires or metal ribbons, and are connected to the conductor plates 318 and 319. A material of the wire or the ribbon is a simple substance or a composite such as Al, an Al alloy, Cu or a Cu alloy. Back surface electrodes of the IGBT 328 and the diode 156 are metal-joined to the conductor plate 315 by the metal joint material 160. The conductor plates 315 and 318 and the heat dissipating portion 307 are joined to each other via the insulation layer 333. Back surface electrodes of the IGBT 330 and the diode 166 are metal-joined to the conductor plate 318 by the metal joint material 160. The conductor plates 315, 318 and 319 and the heat dissipating portion 307 are joined to each other via the insulation layer 333.

FIG. 28(a) is a cross-sectional view of a portion illustrated by a dashed line in FIG. 27. Heat generated from the semiconductor chips efficiently radiates to the outside via the conductor plate 315, the insulation layer 333 and the heat dissipating portion 307. Herein, an example is illustrated where the thermal spray film 333A is provided on a side of the heat dissipating portion 307 and the resin layer 333B is joined to a side of the conductor plates 315, 318 and 319. However, the thermal spray film 333A may be provided on the side of the conductor plates 315, 318 and 319, and the resin layer 333B may be provided on the heat dissipating portion 307.

The high thermal conductive filler-dispersed resin layer 333B has an area greater than bottom areas of the conductor plates 315, 318 and 319 which are in contact with the insulation layer 333, has an area smaller than an area of the thermal spray film 333A and is temporarily attached onto the heat dissipating portion 307. Thereafter, impregnation with a resin is carried out using a margin portion of the thermal spray film 333A, onto which the resin layer 333B is not temporarily attached. The impregnation with a resin is carried out in such a manner that the resin portion 333C is formed in the circumferential end portion of the laminated body. As illustrated in FIG. 28(b), after the impregnation with a resin is completed, a thermocompressive bond is carried out for integration.

Since the back surfaces of the power semiconductor elements are joined to the conductor plates and to the front surface electrodes using wires or ribbons and then sealing is carried out by the sealing resin 348, it is possible to prevent mechanical damage caused by pressure applied when the conductor plate and the heat dissipating portion are bonded to each other. In addition, in the example, the thermal spray film 333A is formed on the side of the heat dissipating portion 307, but when the thermal spray film 333A is formed on the side of the conductor plates 315, 318 and 319, it is possible to prevent mechanical damage in a thermal spraying process.

As such, even in the single side cooling power module 300, when the insulation layer 333 arranged between the conductor plates and the heat dissipating portion 307 is configured to be a laminated body formed by the resin-impregnated thermal spray film 333A and the filler-mixed resin layer 333B, it is possible to achieve performance improvement in heat dissipation from the power semiconductors to the heat dissipating portion 307. Furthermore, since the resin portion 333C is provided in the circumferential end portion of the laminated body, it is possible to relief stress in the end portion of the laminated body.

Figure 29:
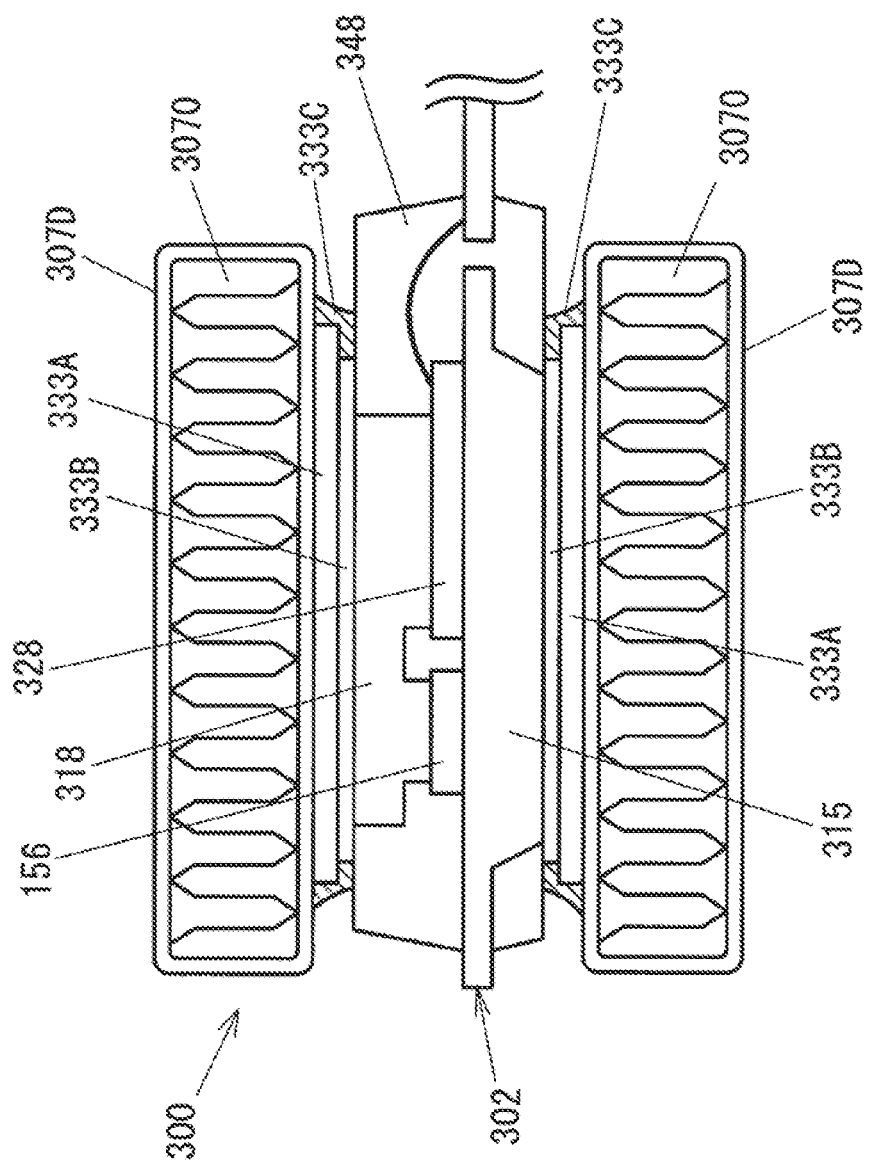
FIG. 29 is a view illustrating the power module 300 that has a configuration in which the primary sealed body 302 is interposed between a pair of heat dissipating portions 307D.

FIG. 29 is a view illustrating the power module 300 that has a configuration in which the primary sealed body 302 is interposed between a pair of heat dissipating portions 307D. Coolant flow paths 307O are formed in the heat dissipating portion 307D, and a coolant flows through the coolant flow paths. The resin-impregnated thermal spray film 333A is formed on a single surface of the heat dissipating portion 307D, and the resin layer 333B is formed in order that the resin layer 333B and the thermal spray film 333A are laminated on each other. The resin portion 333C is provided in the circumferential end portion of the laminated body. The thermal spray film 333A may be formed on the side of the primary sealed body 302.

-Fifth Embodiment-

Figure 30:
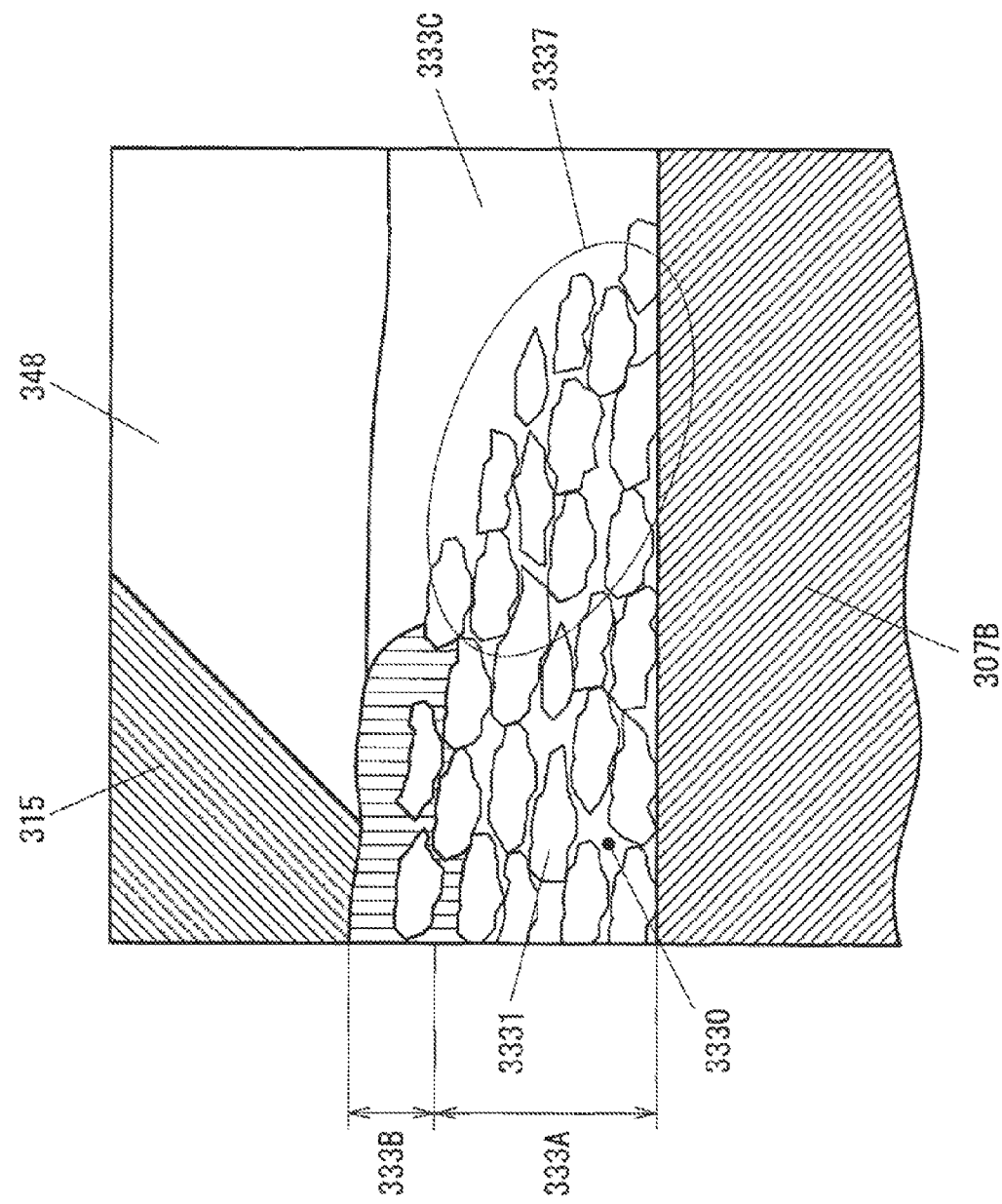
FIG. 30 is a view describing a fifth embodiment, and is an enlarged view illustrating a circumferential end portion of the laminated body formed by the resin-impregnated thermal spray film 333A and a resin layer 333B.

FIG. 30 is a view describing a fifth embodiment, and is an enlarged view illustrating the circumferential end portion of the laminated body formed by the resin-impregnated thermal spray film 333A and the resin layer 333B. Herein, as in the aforementioned third embodiment, since the resin portion 333C having a lower elastic modulus or great bond force is provided in the circumferential end portion of the laminated body that is configured to have the thermal spray film 333A and the resin layer 333B, stress is prevented from being concentrated in the end portion, and peeling is prevented from occurring from the end portion and from progressing. In the fifth embodiment, the amount of a resin configuring the resin portion 333C is increased and thus, effects of relieving the stress concentration are further improved. Hereinafter, the thickness of the thermal spray film 333A that makes the effects possible and is formed on the heat dissipating portion 307B or the primary sealed body 302 will be described.

An example that is illustrated in FIG. 30 illustrates a case where the thermal spray film 333A is formed on the side of the heat dissipating portion 307. The resin layer 333B has an area smaller than a heat-dissipating surface area of the heat dissipating portion 307, and the thermal spray film 333A is set to have an area larger than that of the resin layer 333B. For this reason, the edge portion of the thermal spray film 333A has an area 3337 in which the resin layer 333B is not formed. The area 3337 has a thickness smaller than that of a thermal spray film 333A immediately under the conductor plate 315, and the thickness of the resin layer 333B or the resin portion 333C can be made great in the outer circumferential portion in which stress becomes great (FIG. 30 illustrates an example in which the thickness of the resin portion 333C becomes great).

In addition, the following factors determine heat dissipation properties of the insulation layer 333 of the power module: the thermal conductivity or the thickness of the resin layer 333B and the thermal conductivity or the thickness of the resin-impregnated thermal spray film 333A. In particular, when the resin layer 333B having low thermal conductivity is made to have a small thickness, it is possible to improve thermal dissipation properties. The thickness of the resin layer 333B is determined from warpage or slope of the heat dissipating portion 307B on which the thermal spray film 333A is formed or of the primary sealed body 302. The values become the greatest in the outer circumferential portion of the laminated body.

An end (the right side in FIG. 30) of the heat dissipating portion 307B slopes to warp upward in FIG. 30. In a case where the thickness of the thermal spray film 333A is constant up to the end, when the thermal spray film 333A is set not to be exposed from the resin portion 333C or the resin layer 333B, the resin layer 333B has a difference in thickness between the circumference and the center thereof. On one hand, as illustrated in FIG. 30, when the thermal spray film 333A in the area 3337 is set to have a thickness smaller than that of the thermal spray film 333A in an area that faces the resin layer 333B, it is possible to reduce variation in thickness of the entire thermal spray thickness 333A. It is possible to easily manufacture a configuration in which the outer circumferential portion of the thermal spray film 333A is set to be thin as illustrated in FIG. 30 by controlling a scanning range of a thermal spraying gun, adjusting a scanning speed or placing a mask.

Figure 47:
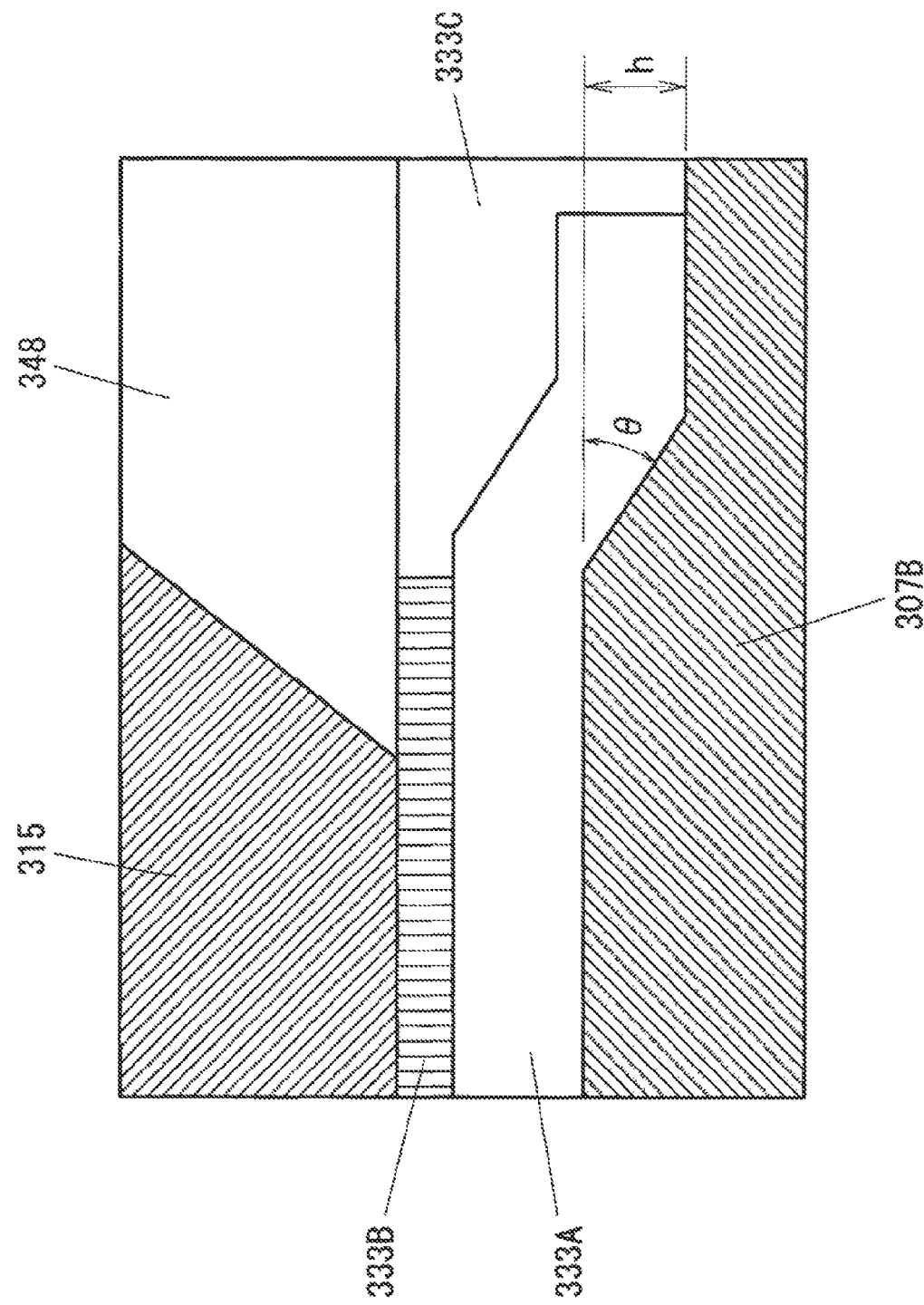
FIG. 47 is a view illustrating a stepped structure when the thermal spray film 333A is formed on a side of the heat dissipating portion 307B.
Figure 48:
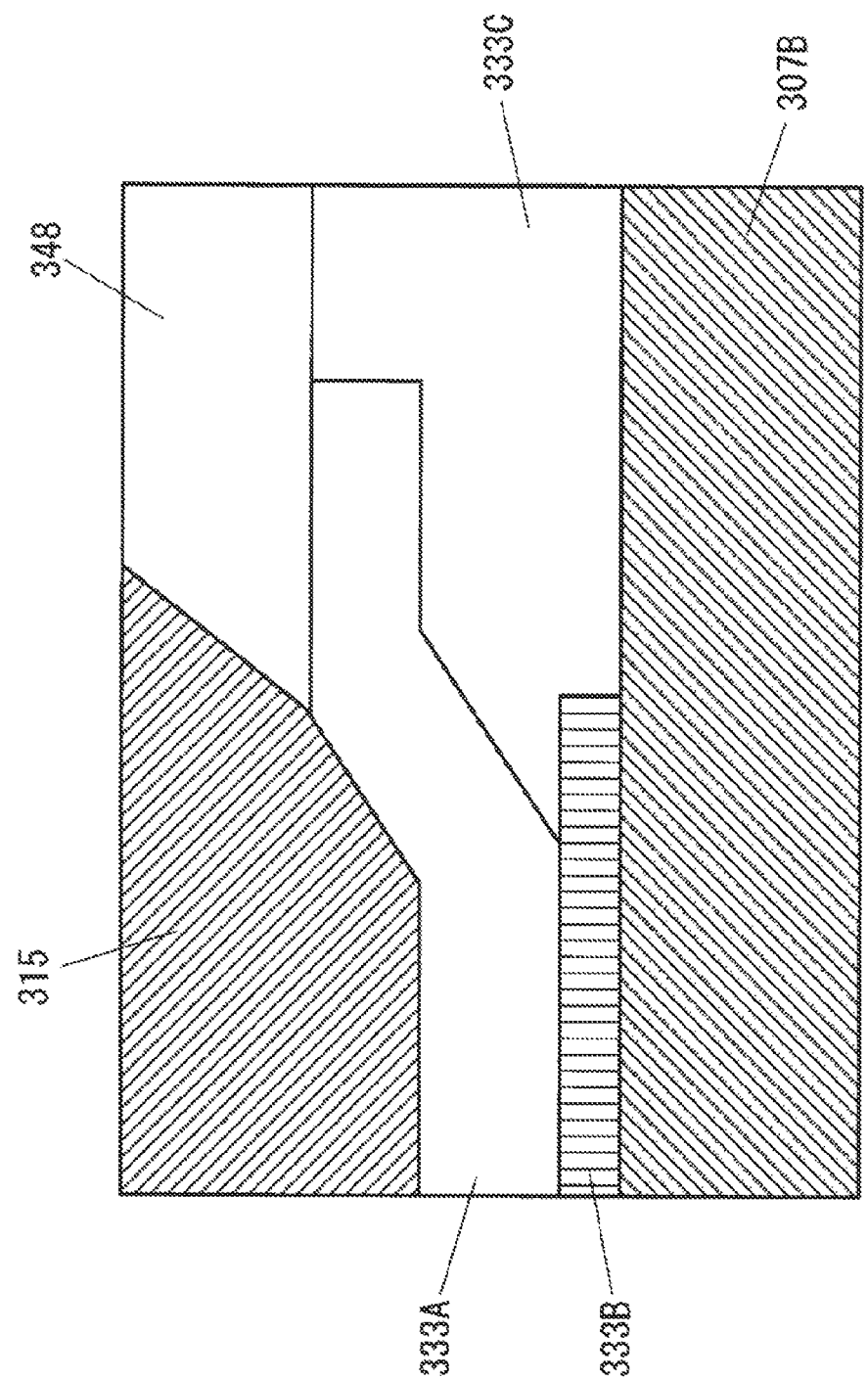
FIG. 48 is a view illustrating a stepped structure when the thermal spray film 333A is formed on a side of the primary sealed body 302.

Alternatively, as illustrated in FIG. 47, even when a step is provided in the heat dissipating portion 307B immediately under the area 3337 (refer to FIG. 30) and the height to the front surface of the heat dissipating portion 307B is reduced and thus, the thermal spray film 333A is formed to have the same thickness, it is possible to increase the thickness of the resin layer 333C. A depth h of the step is set to be smaller than the thickness of the thermal spray film to be formed. In addition, it is preferable to set an angle θ of the step to be an angle smaller than 45° in that bond force between the thermal spray film 333A and a base material (in this case, the heat dissipating portion 307B) is ensured. FIG. 48 is a view illustrating a stepped structure when the thermal spray film 333A is formed on the side of the primary sealed body 302.

-Sixth Embodiment-

Figure 49:
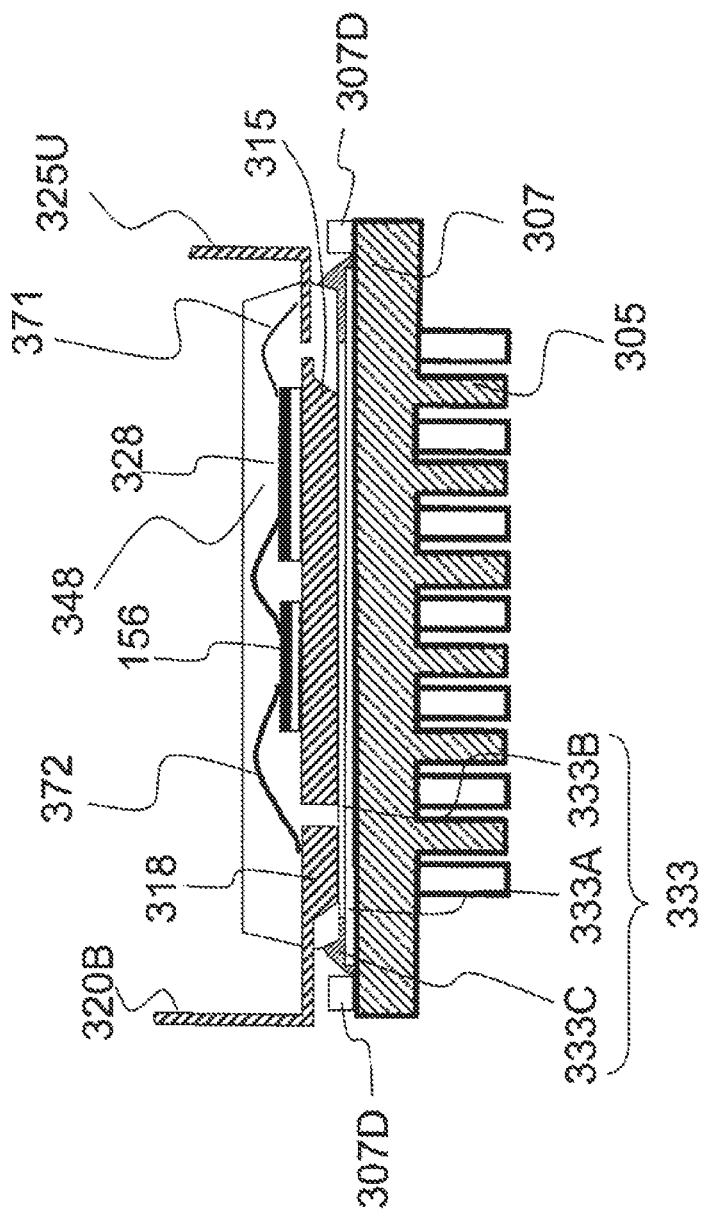
FIG. 49 is a view describing a sixth embodiment.

FIG. 49 is a view describing a sixth embodiment, and is an enlarged view illustrating the circumferential end portion of the laminated body formed by the resin-impregnated thermal spray film 333A and the resin layer 333B. Herein, in order to improve productivity of the insulation layer 333 of the power module, an overflow prevention convex portion 307D provided for the layer portion 333C for stress relief that is formed either in the heat dissipating portion 307B or the primary sealed body 302 will be described. There is a concern that, when the amount of a resin is excessively supplied, a resin component overflowing during an impregnation or bonding process is deposited in the circumference. For this reason, there is a case where a mask is provided to prevent the deposition, but as illustrated in FIG. 49, the frame-shaped convex portion 307D is provided in the outer circumferential portion of the 333C and thus, provision of a mask can be omitted and productivity is improved. The convex portion 307D may be integrally formed with the heat dissipating portion 307B, and may be individually formed. In addition, when the thermal spray film 333A is formed on the side of the primary sealed body 302, the convex portion 307D is formed on the side of the primary sealed body 302.

Figure 31:
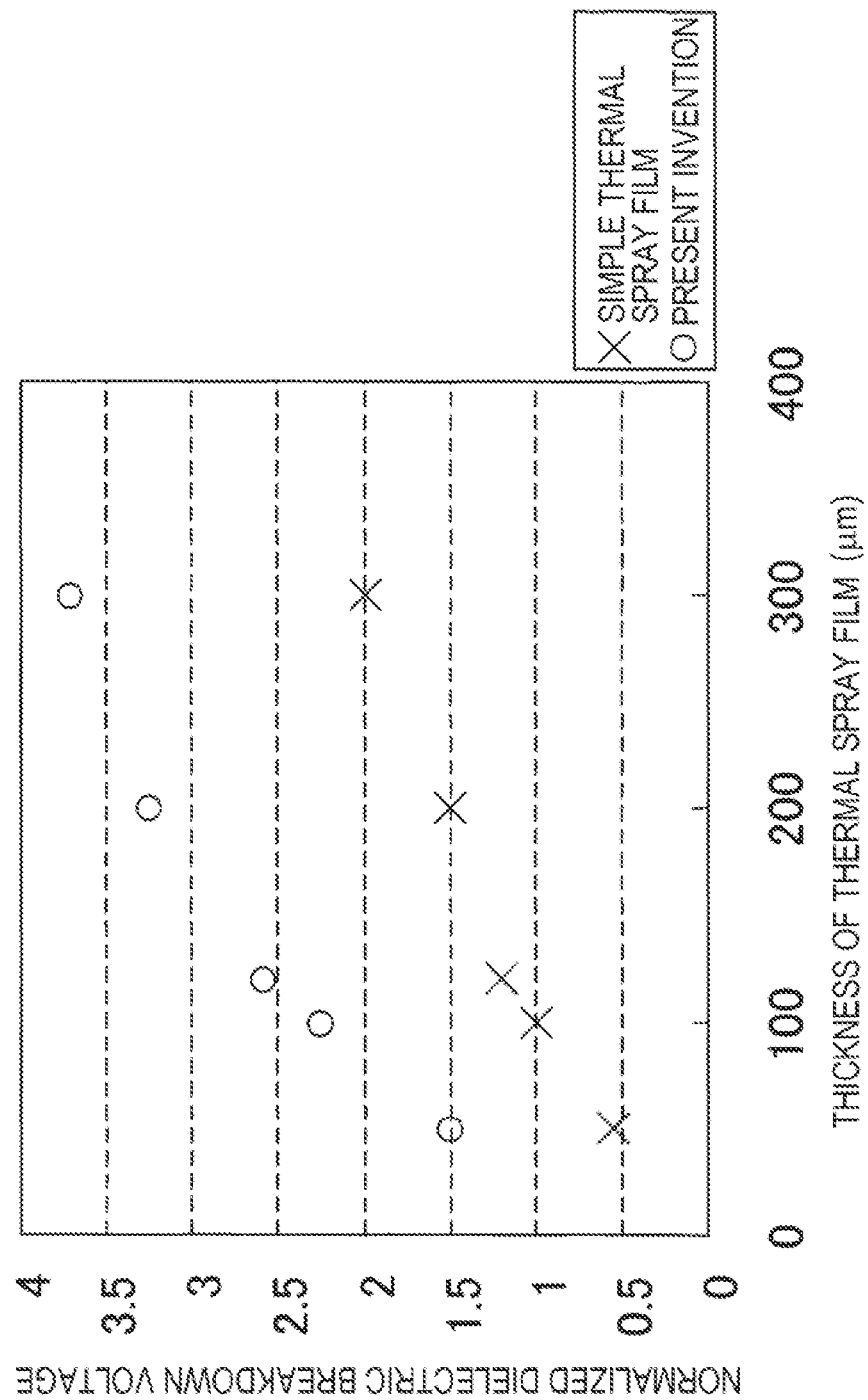
FIG. 31 is a view describing insulation performance (dielectric breakdown voltage) of the insulation layer 333.
Figure 32:
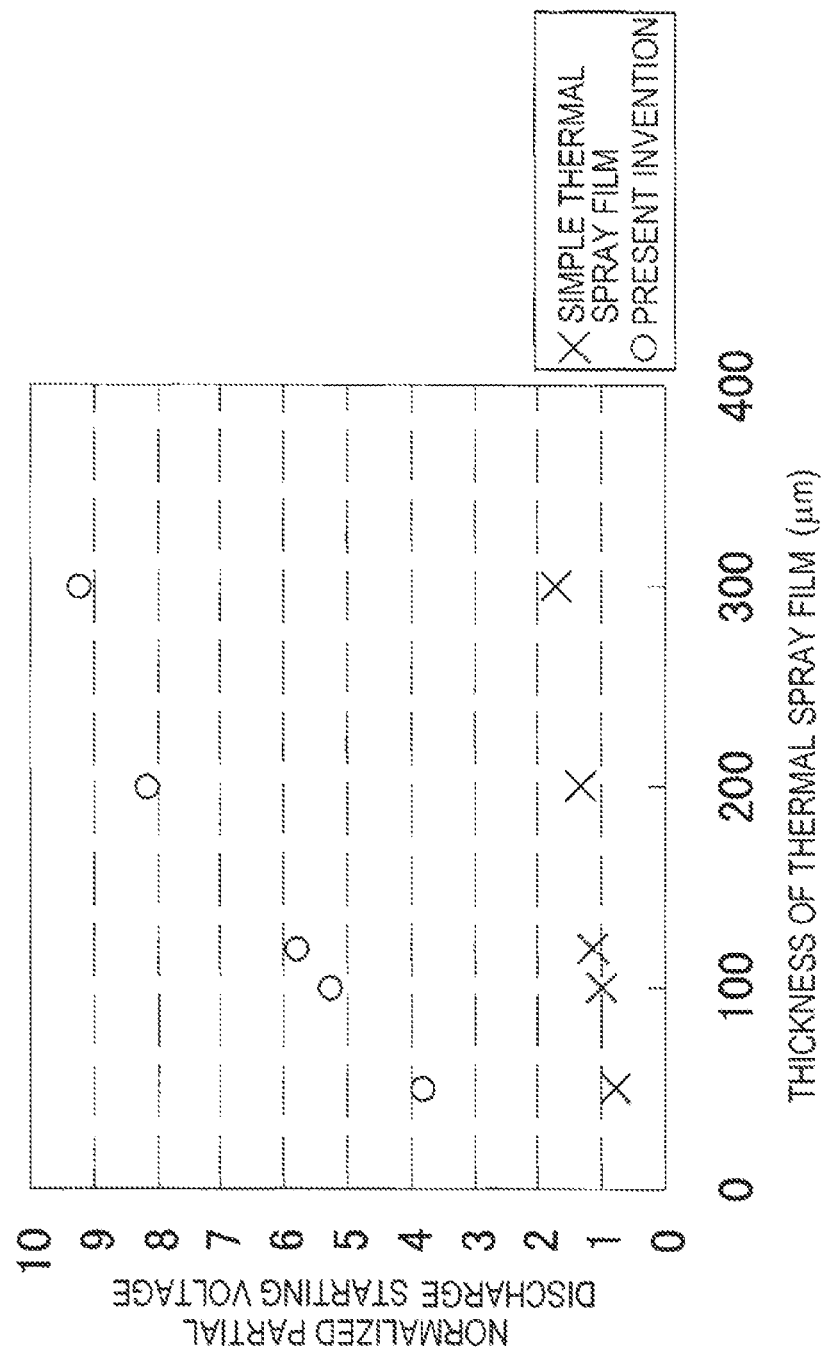
FIG. 32 is a view describing insulation performance (partial discharge voltage) of the insulation layer 333.

Insulation performance of the insulation layer 333 used in the invention will be described with reference to FIGS. 31 and 32. In FIG. 31, the horizontal axis indicates the thickness of the thermal spray film 333A when the thermal spray film 333A is formed on the heat dissipating portions 307A and 307B, and the vertical axis indicates a normalized dielectric breakdown voltage when a dielectric breakdown voltage of a simple thermal spray film having the thickness of 100 µm is set to be 1. In FIG. 32, the horizontal axis indicates the thickness of the thermal spray film 333A when the thermal spray film 333A is formed on the heat dissipating portions 307A and 307B, and the vertical axis indicates a normalized partial discharge starting voltage when a corona discharge starting voltage of a simple thermal spray film having the thickness of 100 µm is set to be 1. The partial discharge starting voltage is measured by a partial discharge measurement system. That is, an Al electrode is provided on a simple thermal spray film made of an Al plate or on a resin-impregnated thermal spray film, an applied alternating voltage is increased from 0 V at a speed of 100 V/s and a voltage at which a partial discharge starts is measured. Herein, a threshold value for start of a partial discharge is set to be 2 pc.

As illustrated in FIGS. 31 and 32, since a simple thermal spray film has a void therein, insulation performance is inferior, but since a resin is impregnated into the thermal spray film, a dielectric breakdown voltage and a corona discharge starting voltage are improved. In particular, the corona discharge starting voltage is greatly improved. As such, the insulation layer 333 that is configured to have the laminated body formed by the resin-impregnated thermal spray film 333A and the filler-mixed resin layer 333B have insulation performance better than a simple thermal spray film. For this reason, when the laminated body is applied to the power module, a thickness necessary for insulation can be made to small. Since it is possible to make the thickness of the insulation layer 333 small, thermal resistance of the insulation layer 333 decreases, and it is possible to improve heat dissipation properties of the power module.

Comparison Example 1

Figure 33:
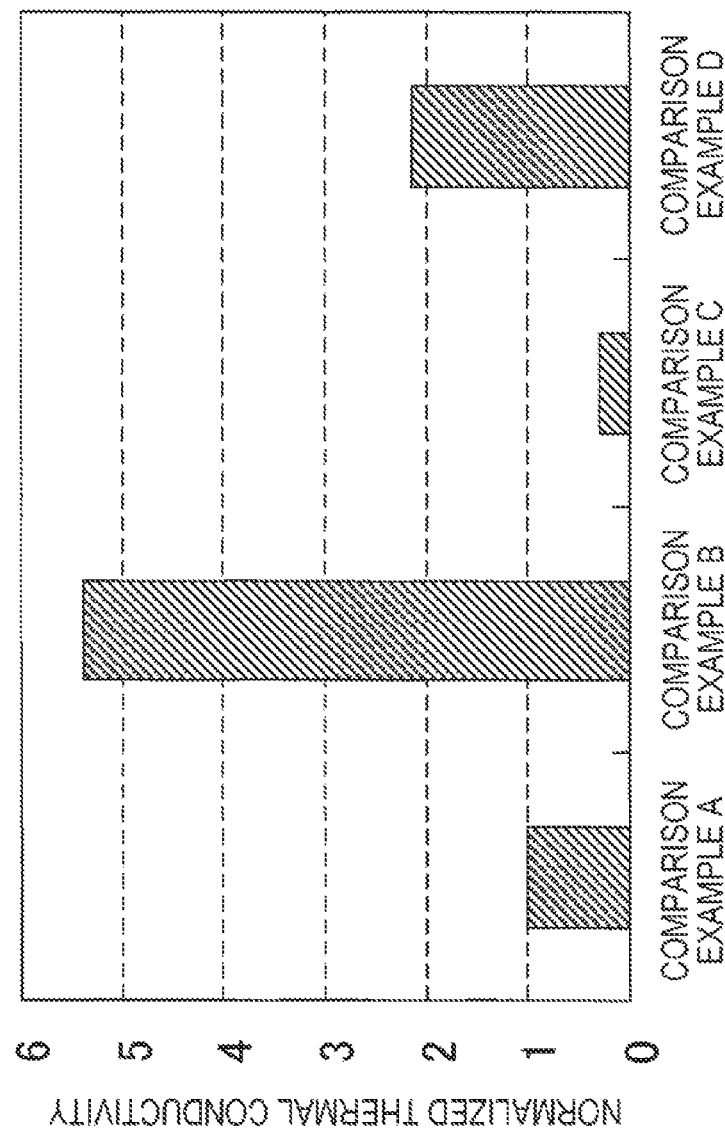
FIG. 33 is a view illustrating comparison examples relative to a configuration of the insulation layer.

FIG. 33 illustrates comparison examples relative to a configuration of the insulation layer. Herein, after a 150 mm×150 mm Al plate having a thickness of 2 mm is sandblasted using an alumina, alumina particles having a particle size of 10 µm to 30 µm are plasma-sprayed at an output of 40 kW and a thermal spray film is formed. At this time, the thermal-sprayed Al plate is preheated to 180° C. in order to suppress porosity of the thermal spray film formed on the Al plate and to prevent cracks of the thermal spray film during cooling.

Configurations of comparison insulation layers are as follows: a configuration in which a simple alumina thermal spray film is not impregnated with a resin (Comparison Example A) and a configuration in which an epoxy resin is impregnated into voids of an alumina thermal spray film (Comparison Example B). In manufactured thermal spray films, porosity is 10% and the thickness is 1 mm. In each of Comparison Examples A and B, an Al plate is removed by etching and thus, a simple alumina thermal spray film is made. In each of the simple alumina thermal spray films, density is measured using a density meter, thermal diffusivity is measured using a laser flash method, specific heat capacity is measured using a differential scanning calorimetry and thermal conductivity of the simple alumina thermal spray film is calculated.

Separately from Comparison Examples A and B, Comparison Example C is prepared as follows. A 150 mm×150 mm Al plate having a thickness of 2 mm is sandblasted using an alumina and preheated at 180° C., alumina particles having the particle size of 10 µm to 30 µm are plasma-sprayed and a thermal spray film of 100 µm is formed. Subsequently, the alumina thermal spray film is impregnated with an epoxy resin and then is bonded to a 100 mm×100 mm Al plate having a thickness of 2 mm.

On one hand, Comparison Example D is different from Comparison Example C in that the alumina thermal spray film is bonded to 100 mm×100 mm Al having the thickness of 2 mm using an alumina filler-mixed epoxy resin layer, and other configurations are the same as the configuration of Comparison Example C. Herein, in Comparison Example D, the filler is manufactured to have a particle size greater than that of concave and convex portions of the alumina thermal spray film in such a manner that the filler does not enter concave portions thereof.

In any one of Comparison Examples C and D, in a state where a spacer is inserted, the bond is carried out in order for the bonding resin to have a thickness of 25 µm. After the bond is completed, a 10 mm×10 mm area that has no void or a non-bonded portion is selected from the bonding resin layer using an ultrasonic flaw inspection, the area is cut off and thermal resistance thereof is measured. In addition, after the measurement is completed, using a scanning electron microscope, cross-sections of the Al plate, the thermal spray film in the insulation layer and the bonding resin layer cut off in a direction orthogonal to the insulation layer are observed, and the actual thicknesses thereof are measured and confirmed. Thermal conductivity of the insulation layer itself is calculated from a thermal resistance value of the entire bonded body. In FIG. 33, the vertical axis indicates normalized thermal conductivity when a simple thermal spray film that is not impregnated with a resin is set to have thermal conductivity of 1 and porosity of 10%.

A heat dissipation characteristic of the insulation layer 333 in the embodiment will be described with reference to FIG. 34. Similar to the aforementioned comparison examples, after a 150 mm×150 mm Al plate having a thickness of 2 mm is sandblasted using alumina, alumina particles having the particle size of 10 µm to 30 µm are plasma-sprayed and a thermal spray film of 100 µm is formed. Thereafter, an 40 vol % alumina filler-mixed epoxy resin sheet having a thickness of 30 µm is temporarily attached under a condition of 110° C., applied pressure of 2 MPa and 1 min. Thereafter, an epoxy resin is impregnated into the alumina thermal spray film under a depressurizing condition. Subsequently, the thermal spray film has a spacer inserted thereinto and is bonded to a 100 mm×100 mm Al plate having a thickness of 2 mm. The particle size of a filler is set to be 1 µm to 5 µm and thus, the filler can be arranged even in the concave portions of the thermal spray film. Furthermore, when a bond is carried out, a pressure is applied to the resin layer such that the resin layer is set to have a thickness of 25 µm. After the bond is completed, a 10 mm×10 mm area that has no void or a non-bonded portion is selected from the bonding resin layer using an ultrasonic flaw inspection, the area is cut off and thermal resistance thereof is measured. In addition, after the measurement is completed, using a scanning electron microscope, cross-sections of the Al plate, the thermal spray film in the insulation layer and the bonding resin layer cut off in a direction orthogonal to the insulation layer are observed, and the actual thicknesses thereof are measured and confirmed. Thermal conductivity of the insulation layer itself is calculated from a thermal resistance value of the entire bonded body.

Figure 34:
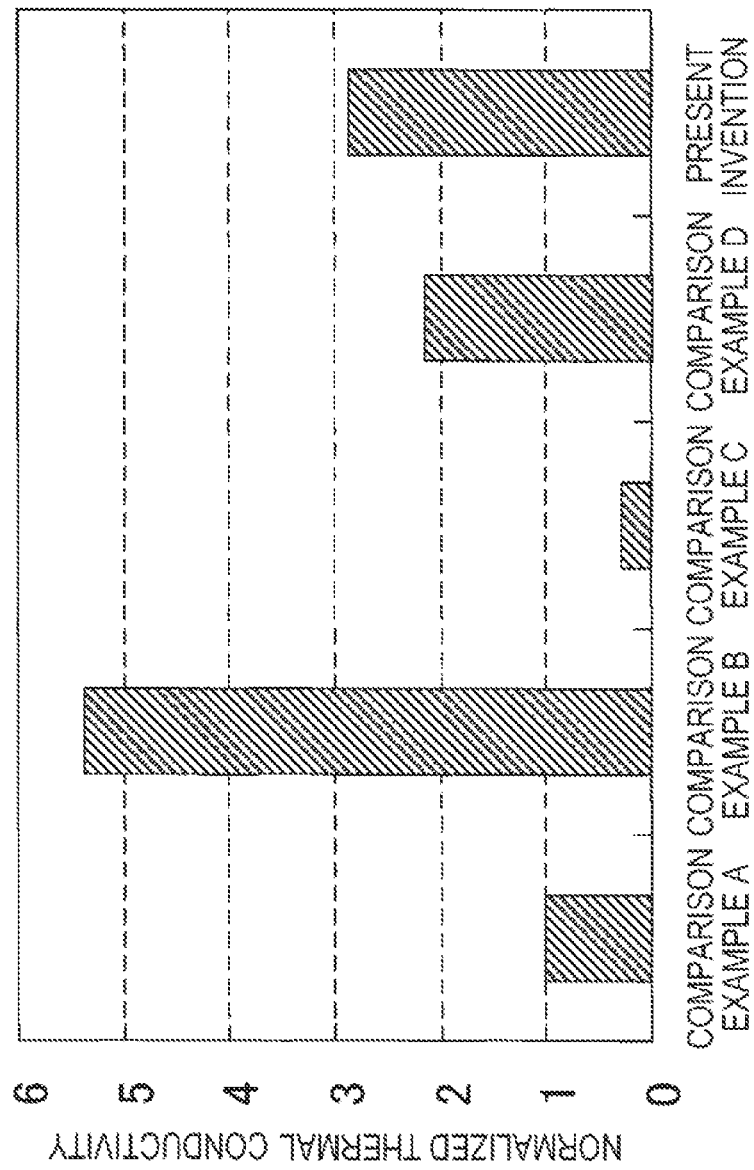
FIG. 34 is a view describing thermal conductivity of the comparison examples and the invention.

As illustrated in FIG. 34, it is found that thermal conductivity is improved by five times or greater compared to Comparison Examples A and B when a resin is impregnated into the simple thermal spray film. It is because the impregnated epoxy resin has thermal conductivity greater than air in pores in the thermal spray film. However, as illustrated in Comparison Example C, it is found that the thermal conductivity of the insulation layer greatly decreases when the resin layer without a filler is complexed to have a layer shape. Furthermore, as illustrated in Comparison Example D, it is found that, when a filler is not arranged in the concave portion of the thermal spray film, the thermal conductivity of the insulation layer decreases even though a resin-concentrated layer is formed to have an insular shape. As such, when the resin-impregnated thermal spray film is joined, it is important to reduce a resin area to be bonded.

In contrast, it is found that, when a filler is arranged in the concave portion of the thermal spray film, a resin area can be reduced and thermal conductivity exceeding those of Comparison Examples C and D is revealed. The resin layer 333B is set to have a thickness of 25 µm for easy comparison, but when joining is carried out in a state where a spacer is not inserted, the resin layer can be made thin up to approximately the maximum particle size of a filler to be mixed. In addition, when an aluminum nitride or the like having thermal conductivity higher than an alumina is mixed with thermal spray base powder for composition of the thermal spray film, it is possible to further improve the thermal conductivity of the thermal spray film after the impregnation with a resin is completed. Similarly, when a ceramic having thermal conductivity higher than an alumina is used as a material of the filler mixed in the bonding resin layer, it is possible to improve the thermal conductivity of the insulation layer 333.

The above description is simply an example, and the invention is not limited to the configurations of the embodiments. For example, instead of the insulation layer 333B, high thermal conductive grease may be used, and an elastic sheet having no bonding properties may be used. Instead of a resin, glass may be impregnated into the thermal spray film 333A. In addition, the elastic modulus in the above description indicates a Young's modulus after curing is completed, and is a storage modulus that is measured by a dynamic viscoelasticity test at a frequency of 10 Hz and a heating rate of 3° C./min. The bond force is a value which is measured by a JIS K6850. A degree of curing of the resin is defined as an area ratio based on a calorific value area detected by a differential scanning calorimetry when an unreactive resin is heated. A heating rate of the measurement is set to be 10° C./min. Viscosity of the resin is a value which is measured at a shear speed of 10 s$^{-1}$ using a parallel plate type of viscometer. A glass transition temperature of the resin is defined to be a tan-δ peak temperature which is measured by a dynamic viscoelasticity test at a frequency of 10 Hz and a heating rate of 3° C./min. Herein, tan δ is loss tangent (=(loss modulus)/(storage modulus)).

For example, the aforementioned power module can be applied to an electric power conversion apparatus that is mounted on a hybrid vehicle or an electric vehicle; an electric power conversion apparatus that is used in an electric railcar, a ship, an airplane or the like; an industrial electric power conversion apparatus that is used as a control apparatus of an electric motor which drives factory equipment; or a domestic electric power conversion apparatus that is used in a control apparatus of an electric motor which drives a domestic photovoltaic system or a domestic electric appliance. Hereinafter, with reference to FIGS. 35 to 46, an example will be described where the power module is applied to an electric power conversion apparatus of a hybrid vehicle.

Figure 35:
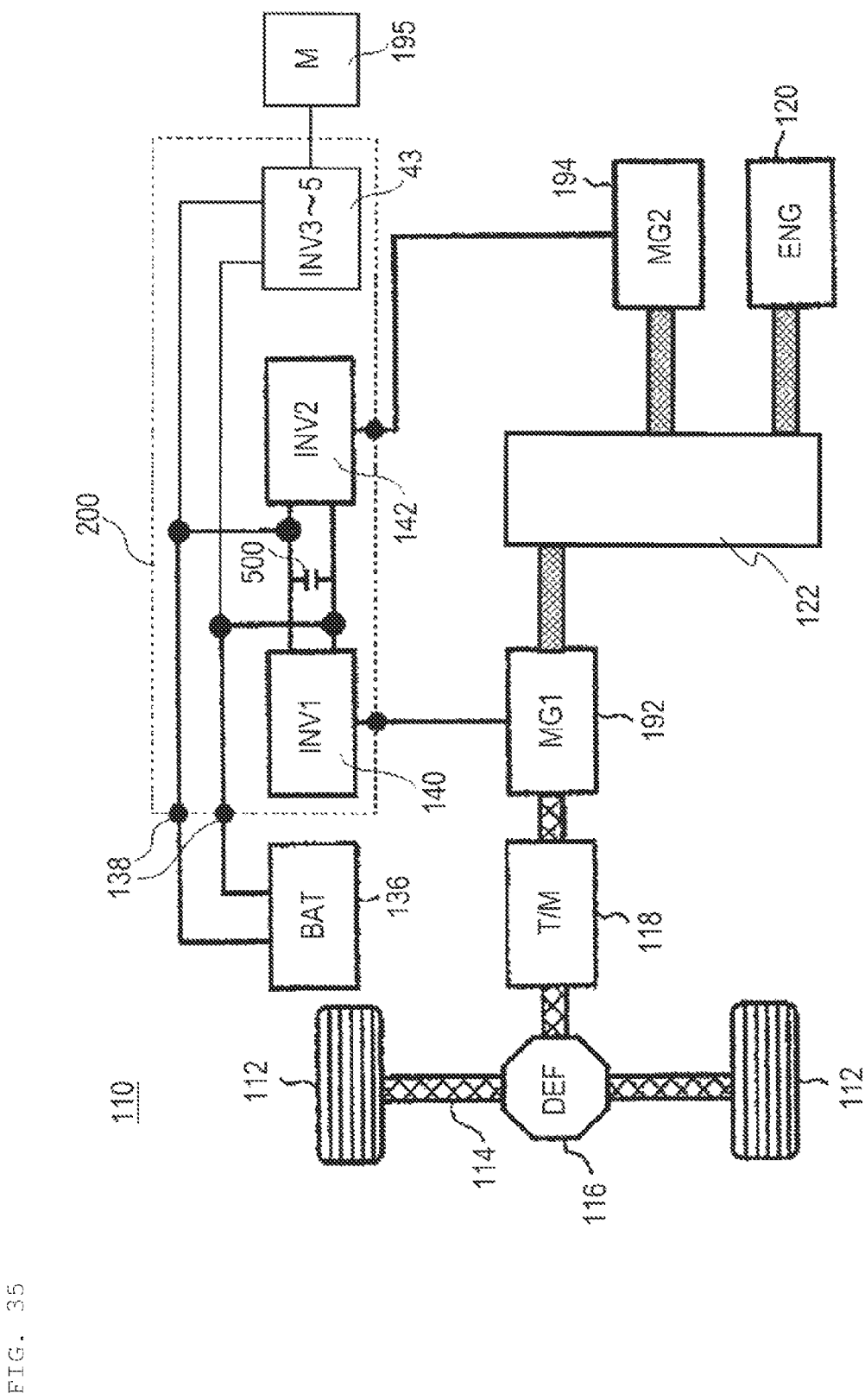
FIG. 35 is a view illustrating control blocks of a hybrid vehicle.

FIG. 35 is a view illustrating control blocks of a hybrid vehicle. In FIG. 35, a hybrid electric vehicle (hereinafter, referred to as "HEV") 110 is an electrically driven vehicle, and includes two vehicle drive systems. One of the two systems is an engine system that has an engine 120 as a power source, which is an internal combustion engine. The engine system is mainly used as a drive source of the HEV.

Another system is an on-vehicle electric machine system that has motor generators 192 and 194 as power sources. The on-vehicle electric machine system is mainly used as a drive source and a power generation source of the HEV. For example, the motor generators 192 and 194 are synchronous machines or induction machines. Since the motor generators 192 and 194 operate as not only motors but also generators depending on an operation method, herein, the machines are referred to as the motor generators.

A front axle shaft 114 is rotatably supported in a front portion of a vehicle body, and a pair of front wheels 112 are provided on both ends of the front axle shaft 114. A rear axle shaft is rotatably supported in a rear portion of the vehicle body, and a pair of rear wheels are provided on both ends of the rear axle shaft (not illustrated). In the HEV according to the embodiment, a so-called front wheel drive method is adopted but, in contrast, it does not matter that a rear wheel drive method is adopted. A front wheel side differential gear (hereinafter, referred to as "front wheel side DEF") 116 is provided in a center portion of the front axle shaft 114. An output shaft of a transmission 118 is mechanically connected to an input side of the front wheel side DEF 116. An output side of the motor generator 192 is mechanically connected to an input side of the transmission 118. Output sides of the engine 120 and the motor generator 194 are mechanically connected to an input side of the motor generator 192 via a power distribution mechanism 122.

The inverter unit 140 and an inverter unit 142 are electrically connected to a battery 136 via direct current connectors 138. Electrical power can be transferred between the battery 136 and the inverter units 140 and 142. The embodiment includes a first motor generator unit that is configured to have the motor generator 192 and the inverter unit 140, and a second motor generator unit that is configured to have the motor generator 194 and the inverter unit 142, and the first and the second motor generator units are differentially used based on operation conditions. In the embodiment, when the first motor generator unit is operated as a motor unit by electrical power from the battery 136, the vehicle can be driven by only power of the motor generator 192. Furthermore, in the embodiment, when the first or the second motor generator unit is operated as a generator unit by power of the engine 120 or power of the wheel and electrical power is generated, the battery 136 can be charged.

Furthermore, the battery 136 is used as a power supply for driving an auxiliary machine motor 195. An auxiliary machine is, for example, a motor that drives a compressor of an air conditioner or a motor that drives a controlling hydraulic pump. Direct current power is supplied to an inverter unit 43 from the battery 136, and the inverter unit 43 converts the direct current into an alternating current and supplies the alternating current to the motor 195. The inverter unit 43 has the same function as that of the inverter unit 140 or 142, and controls a phase or a frequency of the alternating current or electrical power which is supplied to the motor 195. The motor 195 has a capacity smaller than that of the motor generator 192 or 194, and the inverter unit 43 has the maximum conversion electrical power smaller than that of the inverter unit 140 or 142. However, the inverter unit 43 has basically the same circuit configuration as that of the inverter unit 140 or 142. In order to smooth a direct current supplied to the inverter units 140, 142 and 43, an electrical power conversion apparatus 200 includes a capacitor module 500.

Figure 36:
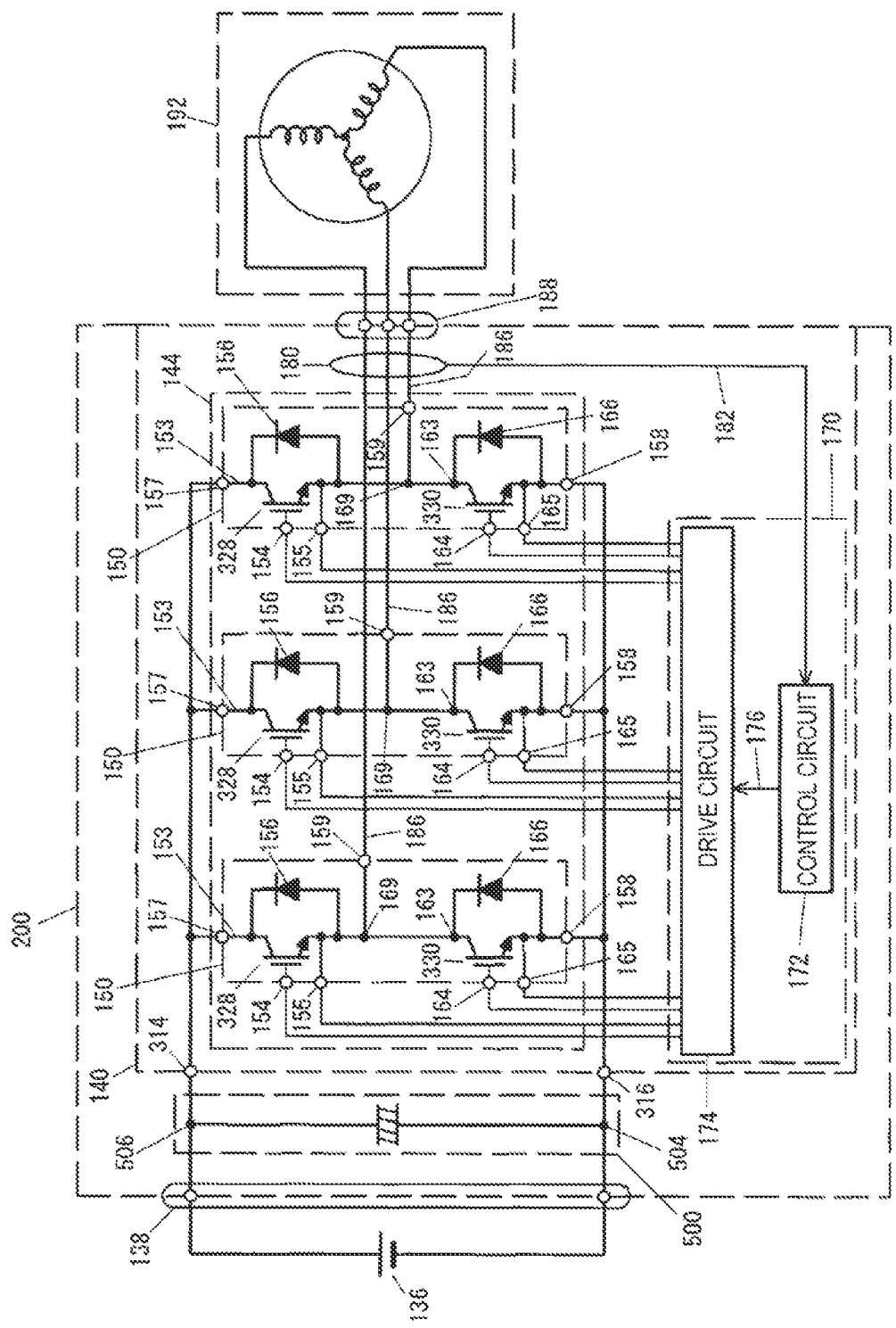
FIG. 36 describes electric circuit configuration of an inverter unit.

An electric circuit configuration of the inverter unit 140, 142 or 43 will be described with reference to FIG. 36. In FIG. 36, the inverter unit 140 is described as a representative example.

An inverter circuit 144 is provided with three-phase (U phase, V phase and W phase) upper and lower arm series circuits 150 to correspond to each phase winding of an armature winding of the motor generator 192, and the upper and lower arm series circuit 150 is configured to have the IGBT 328 and the diode 156 operating as upper arms and the IGBT 330 and the diode 166 operating as lower arms. In each of the upper and lower arm series circuits 150, a midpoint portion 169 (corresponding to the intermediate electrode 329) of each of the upper and lower arm series circuits 150 is connected via the alternating current terminal 159 and an alternating current connector 188 to an alternating current power wire (alternating current bus bar) 186 that is connected to the motor generator 192.

A collector electrode 153 of the upper arm IGBT 328 is electrically connected to a capacitor electrode on a side of a positive electrode of the capacitor module 500 via a positive electrode terminal (P terminal) 167, and an emitter electrode of the lower arm IGBT 330 is electrically connected to a capacitor electrode on a side of a negative electrode of the capacitor module 500 via a negative electrode terminal (N terminal) 168.

A control unit 170 has a driver circuit 174 that controls a drive of the inverter circuit 144, and a control circuit 172 that supplies a control signal to the driver circuit 174 via a signal wire 176. The IGBT 328 or 330 receives a drive signal that is output from the control unit 170 and is operated, and converts direct current power supplied from the battery 136 into three-phase alternating current power. The converted electrical power is supplied to the armature winding of the motor generator 192.

The IGBT 328 includes the collector electrode 153, a signaling emitter electrode 151 and a gate electrode 154. In addition, the IGBT 330 includes a collector electrode 163, a signaling emitter electrode 165 and a gate electrode 164. The diode 156 is electrically connected in parallel to the IGBT 328. In addition, a diode 158 is electrically connected in parallel to the IGBT 330. A metal oxide semiconductor field effect transistor (MOSFET) may be used as a switching power semiconductor element, and in this case, the diode 156 or 158 is not necessary. The capacitor module 500 is electrically connected to the battery 136 via a positive electrode side capacitor terminal 506, a negative electrode side capacitor terminal 504 and the direct current connector 138. The inverter unit 140 is connected to the positive electrode side capacitor terminal 506 via a direct current positive electrode terminal 314, and is connected to the negative electrode side capacitor terminal 504 via a direct current negative electrode terminal 316.

The control unit 172 includes a microcomputer (hereinafter, referred to as "micom") for carrying out the arithmetic processing of switching times of the IGBTs 328 and 330. A target value of torque that the motor generator 192 is required to supply; a value of a current that is supplied to the armature winding of the motor generator 192 from the upper and lower arm series circuit 150; and a position of a magnetic pole of a rotor of the motor generator 192 are input to the micom as input information. The target torque value is based on a command signal output from an upper-level control apparatus that is not illustrated. The current value is detected based on a detected signal output from a current sensor 180 via a signal wire 182. The position of the magnetic pole is detected based on a detected signal output from a magnetic rotary sensor (not illustrated) that is provided in the motor generator 192. In the embodiment, a case where a three-phase current value is detected is described as an example, but it does not matter that a two-phase current value is set to be detected.

The micom in the control unit 172 calculates current command values of d and q shafts of the motor generator 192 based on the target torque value, calculates voltage command values of the d and the q shafts based on a difference between the calculated current command values of the d and the q shafts and detected current values of the d and the q shafts, and converts the calculated voltage command values of the d and the q shafts into U-phase, V-phase and W-phase voltage command values based on detected positions of the magnetic poles. The micom generates a modulated pulse wave based on a comparison between a fundamental wave (sine wave) and a carrier wave (triangular wave) which are based on the U-shape, V-shape and W-shape voltage command values, and outputs the generated modulated wave as a pulse width modulation (PWM) signal to the driver circuit 174 via the signal wire 176.

In order to drive the lower arm, the driver circuit 174 outputs a drive signal into which a PWM signal is amplified to the gate electrode of the corresponding lower arm IGBT 330. In addition, in order to drive the upper arm, the driver circuit 174 shifts the level of a reference potential of a PWM signal to the level of an upper arm reference potential, then amplifies the PWM signal, and outputs the amplified PWM signal as a drive signal to the gate electrode of the corresponding upper arm IGBT 328.

In addition, the control unit 170 detects abnormalities (overcurrent, overvoltage, overtemperature and the like), and protects the upper and lower arm series circuit 150. For this reason, sensed information is input to the control unit 170. For example, information of currents flowing through emitter electrodes of the IGBTs 328 and 330 is input to the corresponding drive portions (ICs) from the signaling emitter electrodes 151 and 165, respectively, of the arms. Accordingly, each of the drive portions (ICs) detects an overcurrent, and when the overcurrent is detected, the ICs stop a switching operation of the corresponding IGBTs 328 and 330 and protect the corresponding IGBTs 328 and 330 from the overcurrent. Temperature information of the upper and lower arm series circuit 150 is input to the micom from a temperature sensor (not illustrated) that is provided in the upper and lower arm series circuit 150. In addition, voltage information of the side of the direct current positive electrode of the upper and lower arm series circuit 150 is input to the micom. The micom detects an overtemperature and an overvoltage based on the information, and when the overtemperature or the overvoltage is detected, the micom stops the switching operation of all of the IGBTs 328 and 330.

In FIG. 36, the gate electrode 154 and the signaling emitter electrode 151 correspond to the signal terminal 325U in FIG. 1, and the gate electrode 164 and the emitter electrode 165 correspond to the signal terminal 325L in FIG. 1. In addition, a positive electrode terminal 167 is the same as the direct current positive electrode terminal 315B, and the negative electrode terminal 168 is the same as the direct current negative electrode terminal 319B in FIG. 1. In addition, the alternating current terminal 159 is the same as the alternating current terminal 320B in FIG. 1.

Figure 37:
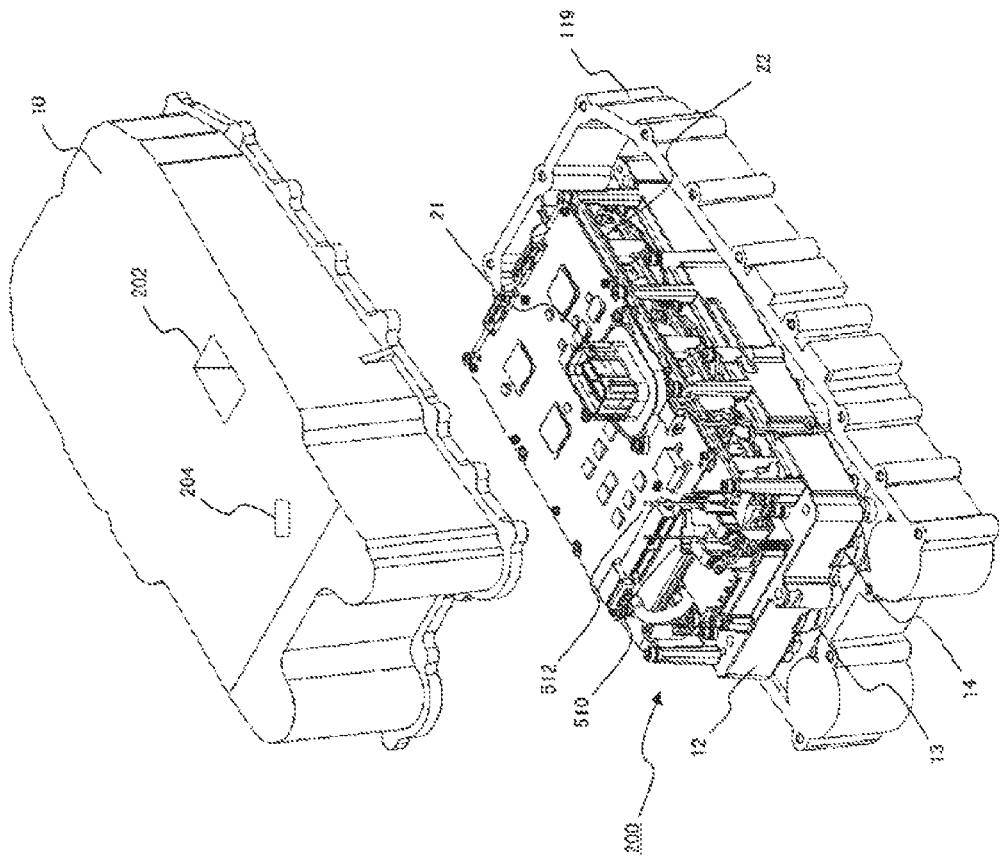
FIG. 37 illustrates an exploded perspective view for describing an electric power conversion apparatus 200.

FIG. 37 illustrates an exploded perspective view for describing the electric power conversion apparatus 200. The electric power conversion apparatus 200 is fixed to a housing 119 made of Al or an Al alloy for accommodating the transmission 118. Since the electric power conversion apparatus 200 has approximately rectangular bottom and upper surfaces, it is possible to obtain effects such as easy attachment thereof to a vehicle and easy production. A cooling jacket 12 retains the power module 300 and the capacitor module 500 to be described later, and is cooled by a coolant. In addition, the cooling jacket 12 is fixed to the housing 119, and an inlet pipe 13 and an outlet pipe 14 are formed in a surface that faces the housing 119. Since the inlet pipe 13 and the outlet pipe 14 are connected to pipes formed in the housing 119, a coolant for cooling the transmission 118 flows into and out of the cooling jacket 12.

A case 10 covers the electric power conversion apparatus 200, and is fixed to a side of the housing 119. The bottom of the case 10 is configured to face a control circuit substrate 20 on which the control circuit 172 is mounted. In addition, a first opening 202 and a second opening 204 are formed in the bottom surface of the case 10, and the bottom of the case 10 is connected to the outside via the first opening 202 and the second opening 204. A connector 21 is connected to the control circuit substrate 20, and various signals from the outside are transmitted to the control circuit substrate 20 via the connector 21. A battery negative electrode-side connection terminal portion 510 and a battery positive electrode-side connection terminal portion 512 are electrically connected to the battery 136 and the capacitor module 500.

The connector 21, the battery negative electrode-side connection terminal portion 510 and the battery positive electrode-side connection terminal portion 512 extend toward the bottom surface of the case 10, the connector 21 protrudes from the first opening 202, and the battery negative electrode-side connection terminal portion 510 and the battery positive electrode-side connection terminal portion 512 protrude from the second opening 204. Sealing members that are not illustrated are provided on circumferences of the first opening 202 and the second opening 204 in an inner wall of the case 10.

Terminal engaging surfaces of the connector 21 and the like are oriented in various directions depending on a vehicle type. In particular, when the electric power conversion apparatus 200 is mounted on a small vehicle, the engaging surfaces preferably face upward due to a limitation in the size of an engine room or from the viewpoint of assemblability. In particular, as in the embodiment, when the electric power conversion apparatus 200 is arranged above the transmission 118, the engaging surfaces protrude toward a side opposite a side on which the transmission 118 is arranged and thus, workability is improved. In addition, it is necessary to seal the connector 21 from the external atmosphere. However, in a case where the case 10 is configured to be assembled from above with respect to the connector 21, when the case 10 is assembled with the housing 119, the connector 21 can be pressed by the sealing members in contact with the case 10 and thus, air tightness is improved.

Figure 38:
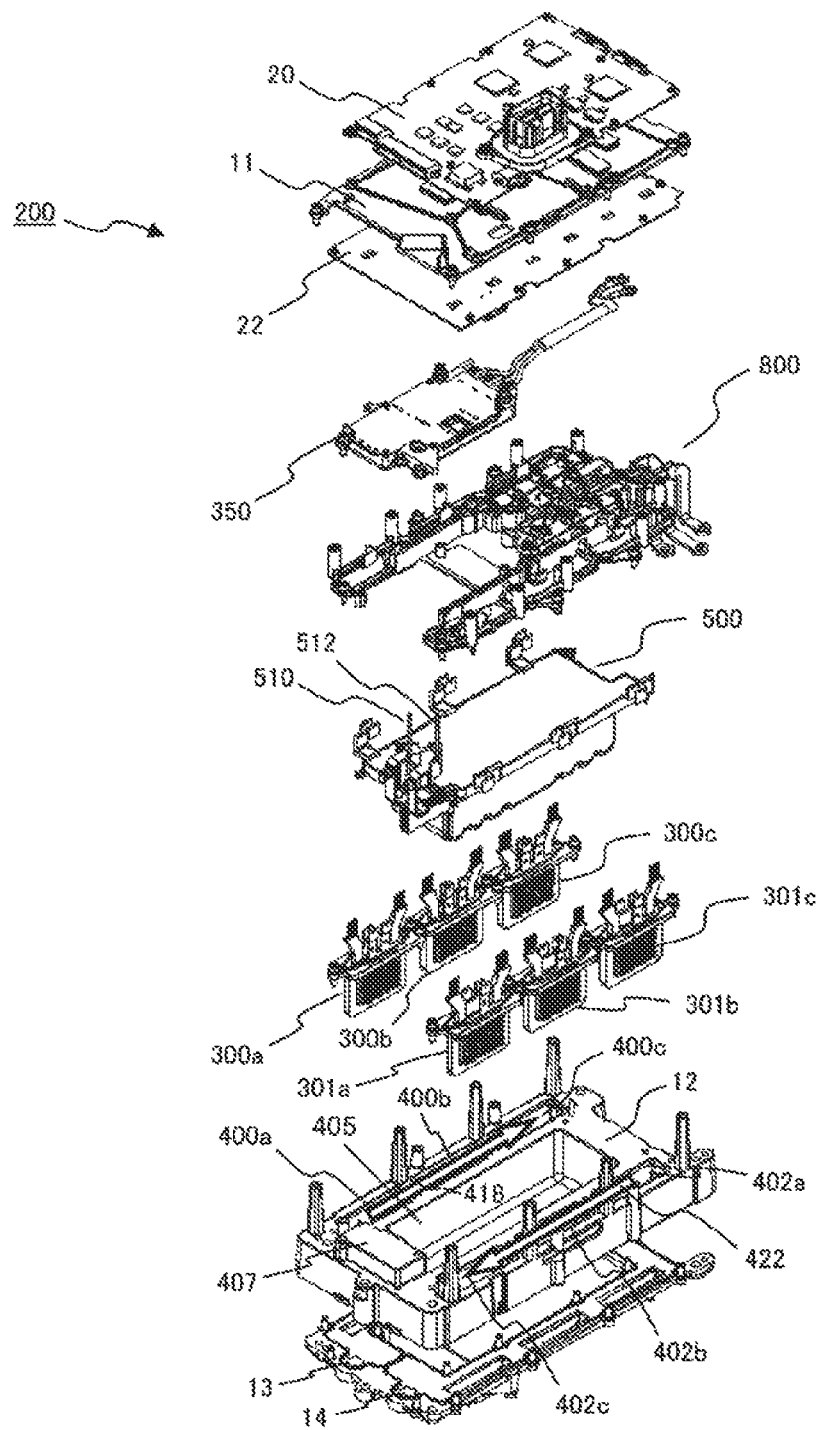
FIG. 38 is an exploded perspective view of the electric power conversion apparatus 200.

FIG. 38 is an exploded perspective view of the electric power conversion apparatus 200. The cooling jacket 12 is provided with a flow path 19 (refer to FIG. 39), and opening portions 400a to 400c are formed on the upper surface of the flow path 19 along a coolant flow direction 418, and opening portions 402a to 402c are formed along a coolant flow direction 422. The opening portions 400a to 400c are blocked by power modules 300a to 300c, and the opening portion 402a to 402c are blocked by power modules 301a to 301c.

In addition, an accommodation space 405 for accommodating the capacitor module 500 is formed in the coolant jacket 12. Since the capacitor module 500 is accommodated in the accommodation space 405, the capacitor module 500 is cooled by a coolant that flows through the flow path 19. Since the capacitor module 500 is interposed between the flow path 19 that forms the coolant flow direction 418 and the flow path 19 that forms the coolant flow direction 422, efficient cooling can be achieved.

The cooling jacket 12 has a protrusion portion 407 formed at a position which the inlet pipe 13 and the outlet pipe 14 face. The protrusion portion 407 is integrally formed with the cooling jacket 12. An auxiliary power module 350 is fixed to the protrusion portion 407, and is cooled by a coolant that flows through the flow path 19. A bus bar module 800 is arranged in a side portion of the auxiliary power module 350. The bus bar module 800 is configured to have the alternating current bus bar 186 or the current sensor 180 (refer to FIG. 36).

As such, the accommodation space 405 for the capacitor module 500 is provided in a center portion of the cooling jacket 12, the flow paths 19 are provided to interpose the accommodation space 405 therebetween, the vehicle drive power modules 300a to 300c and 301a to 301c are arranged in each of the flow paths 19, and the auxiliary power module 350 is arranged on the upper surface of the cooling jacket 12. Therefore, efficient cooling even in a small space can be achieved, and the entire electric power conversion apparatus can be downsized. In addition, the main structure of the flow path 19 of the cooling jacket 12 is integrally made with the cooling jacket 12 using an Al casting or an Al alloy casting and thus, the flow path 19 has great mechanical strength in addition to cooling effects. In addition, since the cooling jacket 12 and the flow path 19 are made using the Al casting and have an integral structure, heat transfer becomes good and cooling efficiency is improved.

The power modules 300a to 300c and 301a to 301c are fixed to the flow paths 19, and the flow path 19 is finished, and then the water path is tested for water leakage. When the water leakage test is passed, it is then possible to attach the capacitor module 500, the auxiliary power module 350 or the substrate. As such, the cooling jacket 12 is arranged in a bottom portion of the electric power conversion apparatus 200, and the necessary parts such as the capacitor module 500, the auxiliary power module 350, the bus bar module 800 and the substrate are then sequentially fixed, and thus, productivity and reliability are improved.

A drive circuit substrate 22 is arranged above the auxiliary power module 350 and the bus bar module 800. In addition, a metal base plate 11 is arranged between the drive circuit substrate 22 and the control circuit substrate 20. The metal base plate 11 has a function of electromagnetic shielding for a group of circuits that are mounted on the drive circuit substrate 22 and the control circuit substrate 20. Heat generated from the drive circuit substrate 22 and the control circuit substrate 20 escapes via the metal base plate 11 and thus, the metal base plate 11 serves to cool the drive circuit substrate 22 and the control circuit substrate 20.

Figure 39:
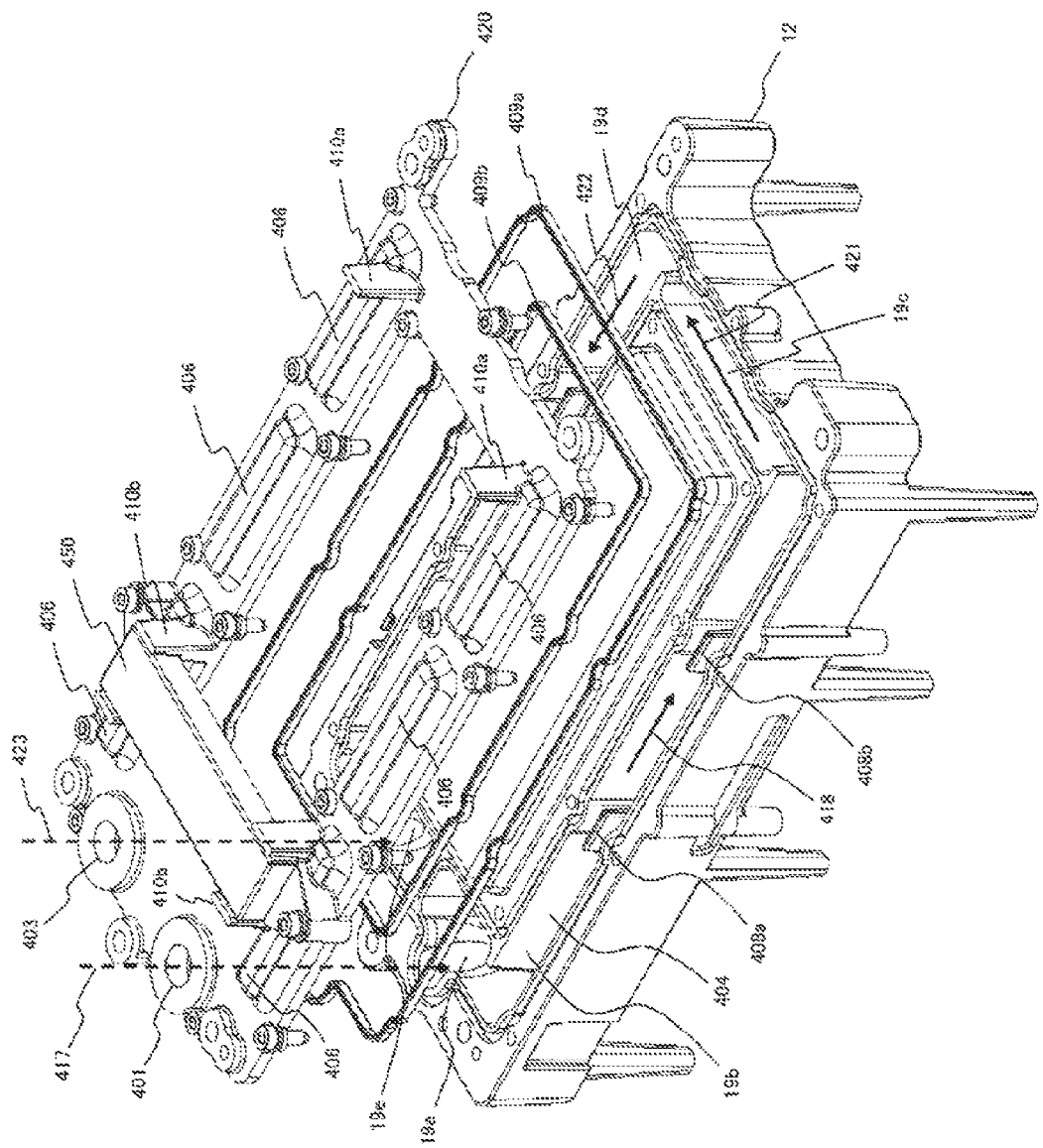
FIG. 39 is a bottom view of a cooling jacket 12 that has a flow path 19.

FIG. 39 is a bottom view of the cooling jacket 12 that has the flow path 19. The cooling jacket 12 and the flow paths 19 (19a to 19e) provided inside the cooling jacket 12 are integrally cast. An opening portion 404 is formed as a form of a single portion on the bottom surface of the cooling jacket 12. The opening portion 404 is blocked by a lower cover 420 that has an opening in a center portion. Sealing members 409a and 409b are provided between the lower cover 420 and the cooling jacket 12 and thus, air tightness is maintained.

An inlet port 401 into which the inlet pipe 13 is inserted and an outlet port 403 into which the outlet pipe 14 is inserted are formed in the vicinity of one edge side of the lower cover 420 along the edge side. In addition, a convex portion 406 is formed in the lower cover 420, and protrudes toward a direction in which the transmission 118 is arranged. The convex portion 406 is provided in each of the power modules 300a to 300c and 301a to 301c.

A coolant flows via the inlet port 401 in a flow direction 417 toward a first flow path portion 19a that is formed along a side in a lateral direction of the cooling jacket 12. The coolant flows in a flow direction 418 through a second flow path portion 19b that is formed along a side in a longitudinal direction of the cooling jacket 12. In addition, the coolant flows in a flow direction 421 through a third flow path portion 19c that is formed along a side in the lateral direction of the cooling jacket 12. The third flow path portion 19c forms a foldback flow path. In addition, the coolant flows in a flow direction 422 through a fourth flow path portion 19d that is formed along a side in the longitudinal direction of the cooling jacket 12. The fourth flow path 19d is provided at a position where the four flow path 19d faces the second flow path portion 19b with the capacitor module 500 being interposed therebetween. Furthermore, the coolant flows in a flow direction 423 through a fifth flow path portion 19e that is formed along a side in the lateral direction of the cooling jacket 12 and through the outlet port 403, and the coolant flows into the outlet pipe 14.

The first flow path portion 19a, the second flow path portion 19b, the third flow path portion 19c, the fourth flow path portion 19d, and the fifth flow path portion 19d are formed to be greater in a depth direction than in a width direction. The power modules 300a to 300c are inserted via the opening portions 400a to 400c formed on a side of the upper surface of the cooling jacket 12 (refer to FIG. 38), and are accommodated in accommodation spaces in the second flow path portion 19b. An intermediate member 408a is formed between the accommodation space for the power module 300a and the accommodation space for the power module 300b in order for a coolant not to stagnate. Similarly, an intermediate member 408b is formed between the accommodation space for the power module 300b and the accommodation space for the power module 300c in order for a coolant not to stagnate. The intermediate members 408a and 408b are formed in such a manner that main surfaces thereof run along coolant flow directions. Similar to the second flow path portion 19b, accommodation spaces for the power modules 310a to 301c and intermediate members are formed even in the fourth flow path portion 19d. In addition, since the opening portion 404 is formed to face the opening portions 400a to 400c and 402a to 402c, the cooling jacket 12 is configured to be easily manufactured using an aluminum casting.

Supporting members 410a and 410b are provided in the lower cover 420 to come into contact with the housing 119 and to support the electric power conversion apparatus 200. The supporting member 410a is provided close to one edge side of the lower cover 420, and the supporting member 410b is provided close to another edge side of the lower cover 420. Accordingly, it is possible to rigidly fix the electric power conversion apparatus 200 to a side wall of the housing 119 that is formed to conform to a columnar shape of the transmission 118 or the motor generator 192.

In addition, the supporting member 410b is configured to support a resistor 450. In consideration of occupant protection or safety during maintenance, the resistor 450 discharges electric charge in electrified capacitor cells. The resistor 450 is configured to continuously discharge high-voltage electricity, but even in a case where the resistor or a discharge mechanism may have some abnormality, the resistor 450 is required to have a configuration in which damage to a vehicle is minimized. That is, in a case where the resistor 450 is arranged in the vicinity of the power module, the capacitor module, the drive circuit substrate or the like, a possibility is taken into consideration where the resistor 450 may undergo malfunctions such as heat generation or ignition and then catch fire in the vicinity of the main parts.

The power modules 300a to 300c, the power modules 301a to 301c or the capacitor module 500 interpose the cooling jacket 12 therebetween, and are arranged on a side opposite the side of the housing 119 that accommodates the transmission 118. The resistor 450 is arranged in a space between the cooling jacket 12 and the housing 119. Accordingly, the resistor 450 is arranged in a closed space that is surrounded by the metal cooling jacket 12 and the metal housing 119. Switching means is mounted on the drive circuit substrate 22 that is illustrated in FIG. 38, and, by the switching operation, the switching means controls discharging of electric charge stored in the capacitor cells of the capacitor module 500 to the resistor 450 via wirings that pass by a side portion of the cooling jacket 12. In the embodiment, the control of the switching means is carried out in order for discharge to be made at a high speed. Since the cooling jacket 12 is provided between the drive circuit substrate 22 and the resistor 450 which control discharge, the drive circuit substrate 22 can be protected from the resistor 450. In addition, since the resistor 450 is fixed to the lower cover 420 and is provided at a position thermally very close to the flow path 19, abnormal heat generation of the resistor 450 can be suppressed.

Figure 40:
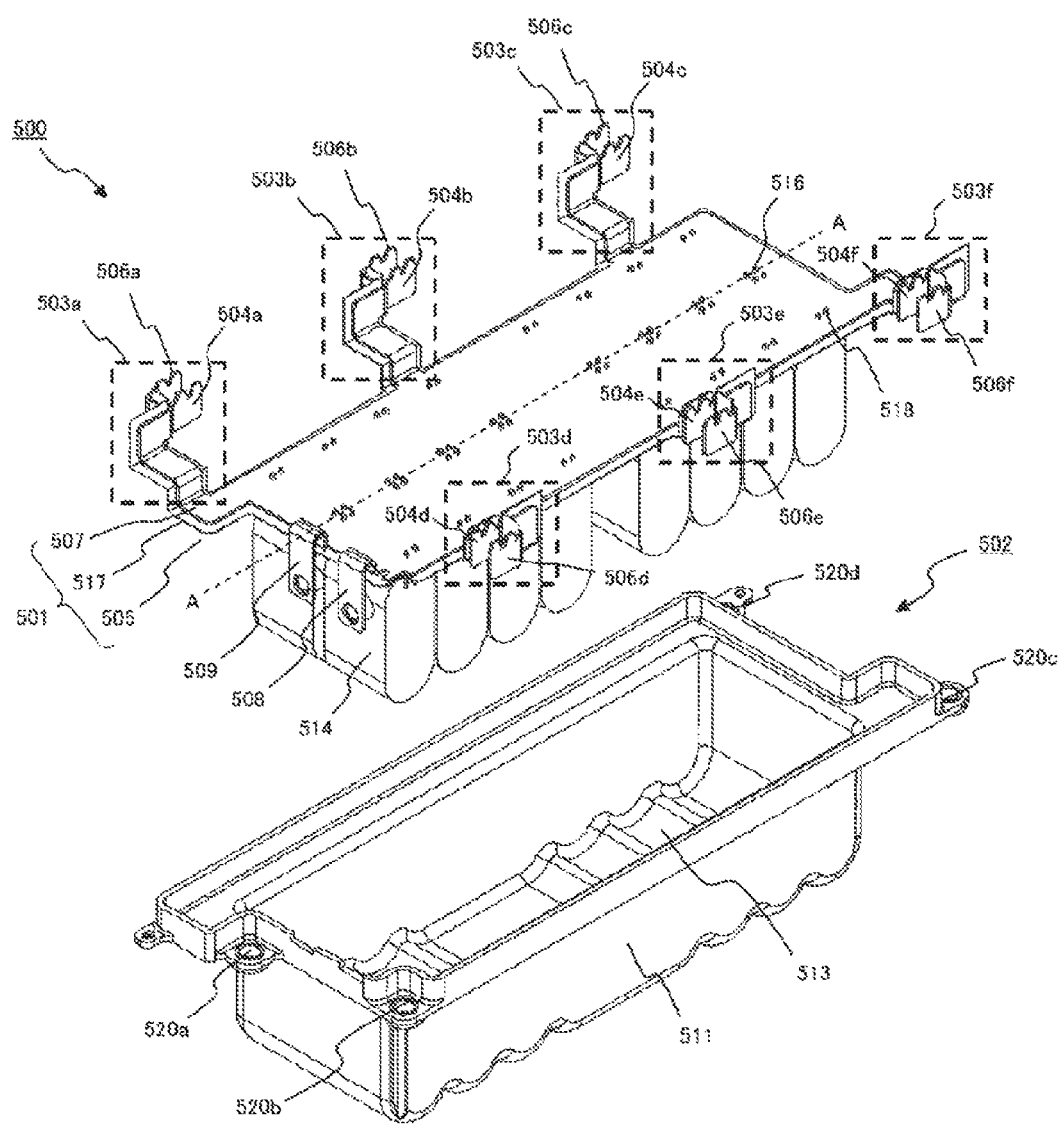
FIG. 40 is an exploded view of a capacitor module 500.

FIG. 40 is an exploded view of the capacitor module 500. Since a laminated conductor plate 501 is configured to have a negative electrode conductor plate 505 and a positive electrode conductor plate 507 which are made of a thin plate-shaped wide conductor and an insulation sheet 517 that is interposed between the negative electrode conductor plate 505 and the positive electrode conductor plate 507, low inductance of the laminated conductor plate 501 is achieved. The laminated conductor plate 501 has an approximately rectangular shape. Battery negative electrode-side terminals 508 and 509 are formed to rise from one side in a lateral direction of the laminated conductor plate 501.

Capacitor terminals 503a to 503c are formed to rise from one side in a longitudinal direction of the laminated conductor plate 501. In addition, capacitor terminals 503d to 503f are formed to rise from another side in the longitudinal direction of the laminated conductor plate 501. The capacitor terminals 503a to 503f rise to vertically intersect a main surface of the laminated conductor plate 501. The capacitor terminals 503a to 503c are connected to the power modules 300a to 300c, respectively. The capacitor terminals 503d to 503f are connected to the power modules 301a to 301c, respectively. A part of the insulation sheet 517 is provided between a negative electrode-side capacitor terminal 504a and a positive electrode-side capacitor terminal 506a which configure the capacitor terminal 503a and thus, insulation is ensured. The other capacitor terminals 503b to 503f are configured similarly to the capacitor terminal 503a. In the embodiment, the negative electrode conductor plate 505, the positive electrode conductor plate 507, the battery negative electrode-side terminals 508 and 509 and the capacitor terminals 503a to 503f are made of a metal plate that is integrally formed and thus, inductance reduction and productivity improvement are achieved.

A plurality of capacitor cells 514 are provided under the laminated conductor plate 501. In the embodiment, eight capacitor cells 514 align in a row along one side in a longitudinal direction of the laminated conductor plate 501, and other eight capacitor cells 514 align in a row along another side in the longitudinal direction of the laminated conductor plate 501, and thus, the sixteen capacitor cells in total are provided. The capacitor cells 514 that are arranged to align in a row along each of the sides in the longitudinal direction of the laminated conductor plate 501 are arranged to align in a row symmetrically with respect to a boundary of dashed line AA that is illustrated in FIG. 40. Accordingly, when a direct current that is smoothed by the capacitor cell 514 is supplied to the power modules 300a to 300c and 301a to 301c, a current is uniformly balanced between the capacitor terminals 503a to 503c and the capacitor terminals 503d to 503f and thus, low inductance of the laminated conductor plate 501 can be achieved. In addition, since a current is prevented from locally flowing in the laminated conductor plate 501, heat is uniformly balanced and thus, heat resistance can be improved.

In addition, the battery negative electrode-side terminals 508 and 509 also are arranged to align in a row symmetrically with respect to a boundary of dashed line AA that is illustrated in FIG. 40. Similarly, a current is uniformly balanced between the capacitor terminals 503a to 503c and the capacitor terminals 503d to 503f and thus, low inductance of the laminated conductor plate 501 can be achieved, and heat is uniformly balanced and thus, heat resistance can be improved.

In the embodiment, the capacitor cell 514 is a unit structure body of an electrical storage portion of the capacitor module 500. In the capacitor cell 514, two sheets of film, each of which has a metal such as Al deposited on a single surface thereof, are laminated and wound, and the two sheets of film are used as a positive electrode film capacitor and a negative electrode film capacitor, respectively. In the capacitor cell 514, each of wound axial surfaces becomes a positive electrode and a negative electrode, and the electrodes of the capacitor cell 514 are manufactured by spraying a conductor such as Sn on the axial surfaces. Cell terminals 516 and 518 are connected to the positive and the negative electrodes, extend via an opening portion of the laminated conductor plate 501 to a side opposite a side on which the capacitor cell 514 is arranged, and are connected to the positive electrode conductor plate 507 and the negative electrode conductor plate 505 by soldering or welding.

In the embodiment, the capacitor cell 514 is a unit structure body of the electrical storage portion of the capacitor module 500. In the capacitor cell 514, two sheets of film, each of which has a metal such as Al deposited on a single surface thereof, are laminated and wound, and the two sheets of film are used as a positive electrode film capacitor and a negative electrode film capacitor, respectively. In the capacitor cell 514, each of wound axial surfaces becomes a positive electrode and a negative electrode, and the electrodes of the capacitor cell 514 are manufactured by spraying an electric conductor such as Sn on the axial surfaces. The cell terminals 516 and 518 are connected to the positive and the negative electrodes, extend via the opening portion of the laminated conductor plate 501 to a side opposite the side on which the capacitor cell 514 is arranged, and are connected to the positive electrode conductor plate 507 and the negative electrode conductor plate 505 by soldering or welding.

A bottom surface portion 513 of an accommodation portion 511 forms a smooth concave and convex shape or a wave shape to conform to a shape of the front surface of the cylindrical capacitor cell 514. Accordingly, it is easy to locate a module, to which the laminated conductor plate 501 and the capacitor cell 514 are connected, in a capacitor case 502. In addition, after the laminated conductor plate 501 and the capacitor cell 514 are accommodated in the capacitor case 502, the capacitor case 502 is filled with a filler (not illustrated) in such a manner that the laminated conductor plate 501 is covered with the filler except for the capacitor terminals 503a to 503f and the battery negative electrode-side terminals 508 and 509. Since the bottom surface portion 513 has a wave shape to conform to the shape of the capacitor cell 514, when the capacitor case 502 is filled with a filler, the capacitor cell 514 can be prevented from shifting from a predetermined position.

In addition, a ripple current at the time of switching causes electrical resistance in thin metal films deposited on the films of the capacitor cell 514 and an internal conductor, and heat is generated from the capacitor cell 514 due to the electrical resistance. In order for heat from the capacitor cell 514 to easily escape to the capacitor case 502, the capacitor cell 514 is molded with a filler. Furthermore, when a resin filler is used, it is possible to improve moisture resistance of the capacitor cell 514.

Furthermore, in the embodiment, since the capacitor module 500 is arranged in such a manner that a side wall forming a side in a longitudinal direction of the accommodation portion 511 is interposed between the flow paths 19, the capacitor module 500 can be efficiently cooled. In addition, the capacitor module 514 is arranged in such a manner that one electrode surface of the capacitor cell 514 faces an inner wall which forms a side in the longitudinal direction of the accommodation portion 511. Accordingly, since heat is easily transferred in a winding axis direction of the film, the heat is likely to escape to the capacitor case 502 via the electrode surface of the capacitor cell 514.

Figure 41:
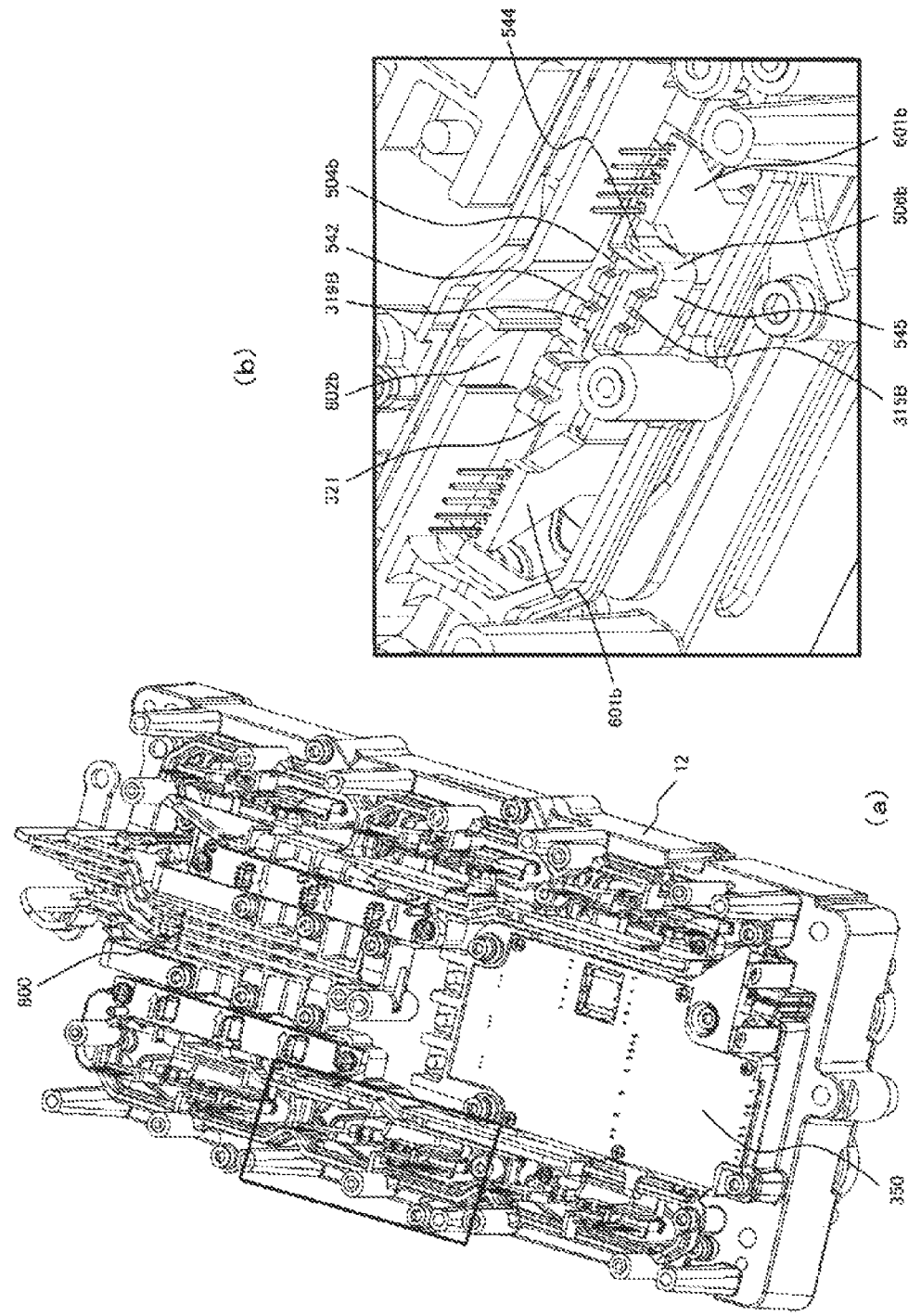
FIG. 41 is an exterior perspective view when the power module, the capacitor module and a bus bar module are assembled with the cooling jacket 12.

FIG. 41(*a*) is an exterior perspective view when the power module, the capacitor module and the bus bar module are assembled with the cooling jacket 12. FIG. 41(*b*) is an enlarged view of a rectangularly surrounded portion in FIG. 41(*a*).

As illustrated in FIG. 41(*b*), the direct current negative electrode terminal 319B, the direct current positive electrode terminal 315B, an alternating current terminal 321 and a second sealing portion 601*b* extend to an upper portion of a flange 515*a* via a through-hole 519 of the capacitor case 502. Current paths of the direct current negative electrode terminal 319B and the direct current positive electrode terminal 315B have areas much smaller than that of a current path of the laminated conductor plate 501. For this reason, when a current flows to the direct current negative electrode terminal 319B and the direct current positive electrode terminal 315B from the laminated conductor plate 501, an area of a current path greatly changes. That is, a current concentrates in the direct current negative electrode terminal 319B and the direct current positive electrode terminal 315B. In addition, when the direct current negative electrode terminal 319B and the direct current positive electrode terminal 315B protrude to vertically intersect the laminated conductor plate 501, in other words, when the direct current negative electrode terminal 319B and the direct current positive electrode terminal 315B have a torsional relationship with the laminated conductor plate 501, there is a problem in that a new connection conductor is necessary, productivity deteriorates, and cost is increased.

The negative electrode-side capacitor terminal 504*a* is configured to have a rising portion that rises from the laminated conductor plate 501; a foldback portion that is connected to the rising portion and is bent to have a U shape; and a connection portion 542 which is connected to the foldback portion and of which a surface opposite a side of the rising portion faces the main surface of the direct current negative electrode terminal 319B. In addition, the positive electrode-side capacitor terminal 506*a* is configured to have a rising portion that rises from the laminated conductor plate 501; a foldback portion 544; and a connection portion 545 which is connected to the foldback portion 544 and of which a surface opposite a side of the rising portion faces the main surface of the direct current negative electrode terminal 319B. In particular, the foldback portion 544 is configured to be connected to the rising portion at approximately right angles and to bridge side portions of the negative electrode-side capacitor terminal 504*a*, the direct current negative electrode terminal 319B and the direct current positive electrode terminal 315B. Furthermore, a main surface of the negative electrode-side rising portion and a main surface of the positive electrode-side rising portion face each other via the insulation sheet 517. Similarly, a main surface of the negative electrode-side foldback portion and a main surface of the positive electrode-side foldback portion 544 face each other via the insulation sheet 517.

Accordingly, since the capacitor terminal 503*a* forms a laminated structure via the insulation sheet 517 right up to the connection portion 542, wiring inductance of the capacitor terminal 503*a* in which a current concentrates can be reduced. In addition, the foldback portion 544 is configured to bridge the side portions of the negative electrode-side capacitor terminal 504*a*, the direct current negative electrode terminal 319B and the direct current positive electrode terminal 315B. Furthermore, the tip end of the direct current positive electrode terminal 315B is connected to a side of the connection portion 542 by welding, and similarly, the tip end of the direct current positive electrode terminal 319B is connected to a side of the connection portion 545 by welding.

Accordingly, since a welding operation interferes with the foldback portion 544 when the direct current positive electrode terminal 315B and the direct current negative electrode terminal 319B are connected to each other by welding, it is possible to achieve low inductance and to improve productivity.

In addition, the tip end of the alternating current terminal 321 is connected to the tip end of an alternating current bus bar 802*a* by welding. In production equipment for welding, an approach in which a welding machine is made to be movable in a plurality of directions relative to a welding target leads to complexity of the production equipment and thus, the approach is not preferable from the viewpoint of productivity and costs. In the embodiment, welding locations of the alternating current terminal 321 and the direct current positive electrode terminal 315B are linearly arranged along the side in the longitudinal direction of the cooling jacket 12. Accordingly, while the welding machine is movable in a direction, welding can be carried out at multiple locations and productivity is improved.

Furthermore, as illustrated in FIGS. 38 and 41(*a*), the plurality of power modules 300*a* to 300*c* are linearly arranged along the side in the longitudinal direction of the cooling jacket 12. Accordingly, when the plurality of power modules 300*a* to 300*c* are welded, it is possible to further improve productivity.

Figure 42:
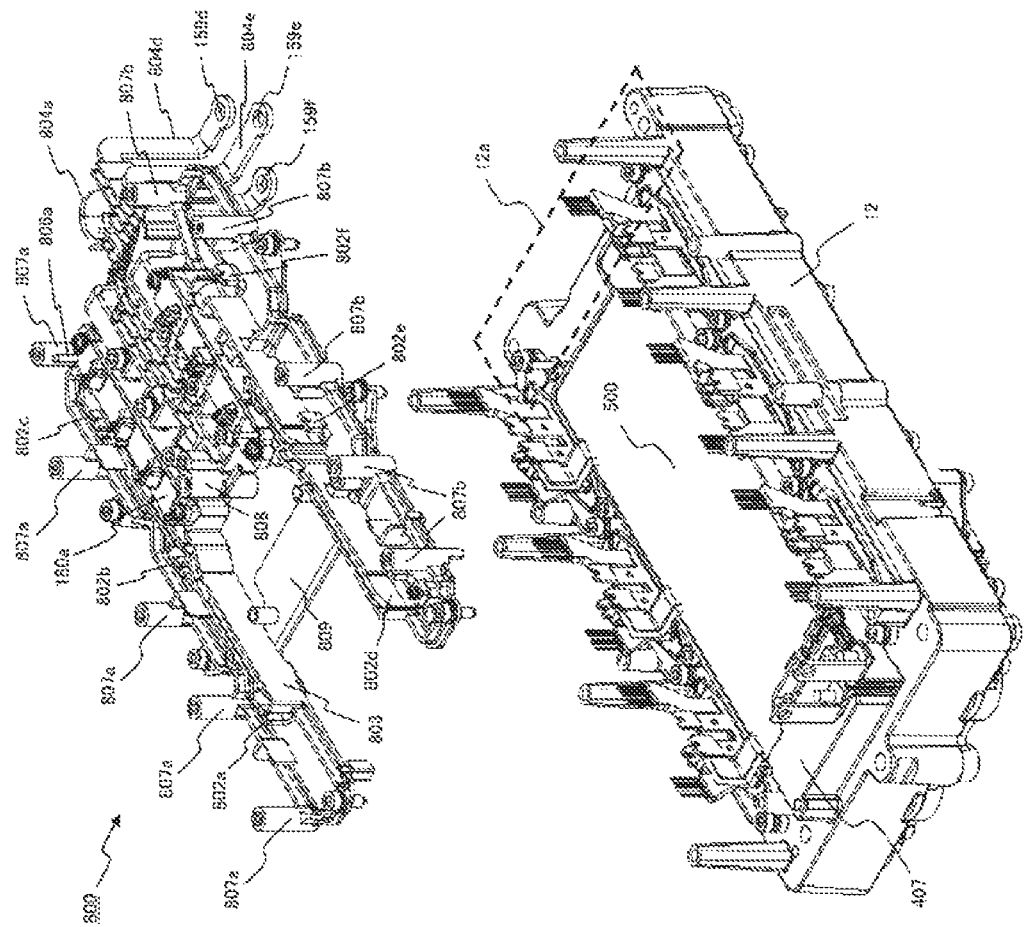
FIG. 42 is an exploded perspective view of the cooling jacket 12 with which the power module and the capacitor module are assembled and of a bus bar module 800.
Figure 43:
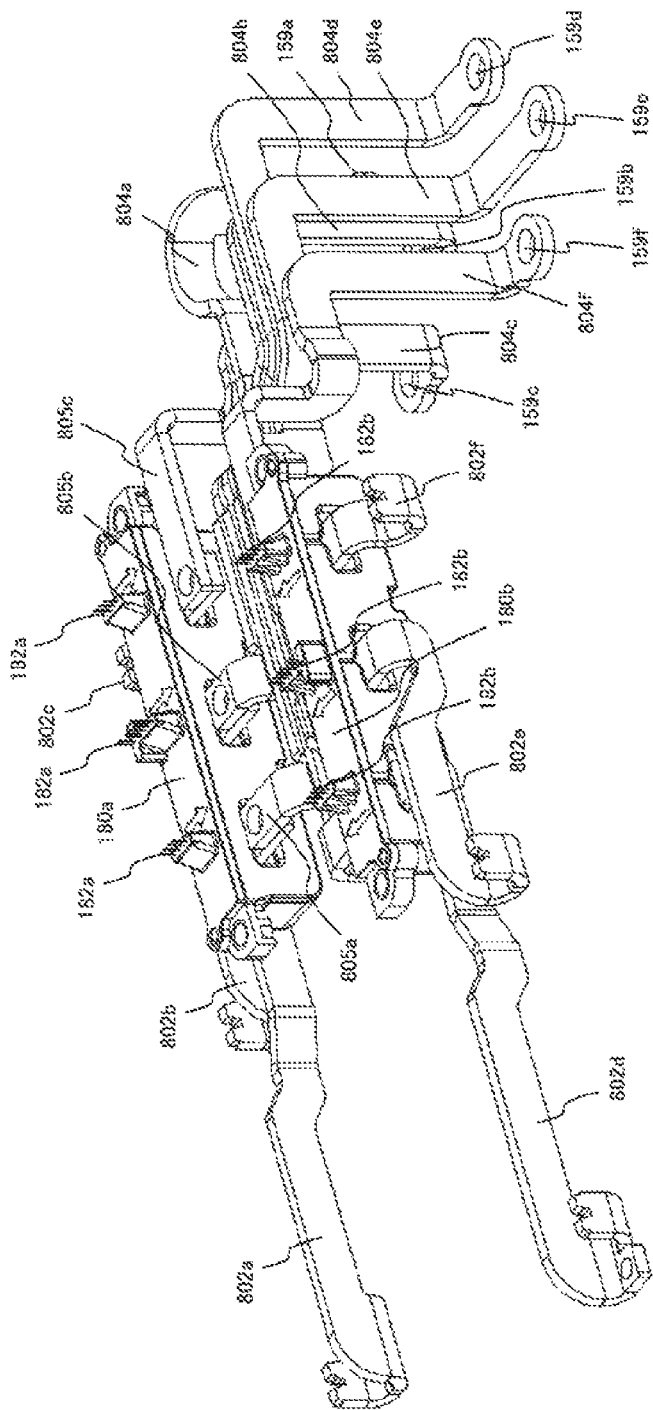
FIG. 43 is an exterior perspective view of the bus bar module 800 from which a retaining member 803 is removed.

FIG. 42 is an exploded perspective view of the cooling jacket 12 with which the power module and the capacitor module are assembled and of the bus bar module 800. FIG. 43 is an exterior perspective view of the bus bar module 800 from which a retaining member 803 is removed.

As illustrated in FIGS. 42 and 43, first alternating current bus bars 802a to 802f are formed up to locations where current sensors 180a and 180b are placed in such a manner that main surfaces of the first alternating current bus bars 802a to 802f are approximately orthogonal to the main surface of the laminated conductor plate 501 of the capacitor module 500. In addition, the first alternating current bus bars 802a to 802f are bent at approximately right angles immediately before through-holes of the current sensors 180a and 180b. Accordingly, main surfaces of portions of the first alternating current bus bars 802a to 802f which pass through the current sensors 180a and 180b are approximately in parallel to the main surface of the laminated conductor plate 501. Connection portions 805a to 805f are formed in end portions of the first alternating current bus bars 802a to 802f, and are connected to second alternating current bus bars 804a to 804f (the connection portions 805d to 805f are not illustrated).

The second alternating current bus bars 804a to 804f are bent toward a side of the capacitor module 500 at approximately right angles in the vicinity of the connection portions 805a to 805f. Accordingly, main surfaces of the second alternating current bus bars 804a to 804f are approximately orthogonal to the main surface of the laminated conductor plate 501 of the capacitor module 500. Furthermore, the second alternating current bus bars 804a to 804f are formed to extend from the vicinity of the current sensors 180a and 180b toward one side 12a in the lateral direction of the cooling jacket 12 that is illustrated in FIG. 43, and to intersect the side 12a. That is, in a state where the main surfaces of the plurality of second alternating current bus bars 804a to 804f face each other, the second alternating current bus bars 804a to 804f are formed to intersect the side 12a.

Accordingly, without size enlargement of the entire apparatus, the plurality of plate-shaped alternating current bus bars can protrude outside from the short side of the cooling jacket 12. Since the plurality of alternating current bus bars protrude from a side of one surface of the cooling jacket 12, it is easy to handle wirings outside of the electric power conversion apparatus 200, and productivity is improved.

As illustrated in FIG. 42, the first alternating current bus bars 802a to 802f, the current sensors 180a and 180b and the second alternating current bus bars 804a to 804f are retained and insulated by the retaining member 803 made of a resin. Using the retaining member 803, the second alternating current bus bars 804a to 804f improve insulating properties between the metal cooling jacket 12 and the metal housing 119. In addition, the retaining member 803 is thermally in contact with or is in direct contact with the cooling jacket 12. Therefore, heat that is transferred to the second alternating current bus bars 804a to 804f from a side of the transmission 118 can escape to the cooling jacket 12 and reliability of the current sensors 180a and 180b can be improved.

As illustrated in FIG. 42, the retaining member 803 includes supporting members 807a and 807b for supporting the drive circuit substrate 22 that is illustrated in FIG. 36. The plurality of supporting members 807a are provided, and are formed to align in a row along one side in the longitudinal direction of the cooling jacket 12. In addition, the plurality of supporting members 807b are provided, and are formed to align in a row along another side in the longitudinal direction of the cooling jacket 12. Screw holes for fixing the drive circuit substrate 22 are formed in tip end portions of the supporting members 807a and 807b.

Furthermore, the retaining member 803 includes protrusion portions 806a and 806b which extend upward from the locations where the current sensors 180a and 180b are arranged. The protrusion portions 806a and 806b are configured to pass through the current sensors 180a and 180b, respectively. As illustrated in FIG. 42, the current sensors 180a and 180b include signal wires 182a and 182b which extend in the direction where the drive circuit substrate 22 is arranged. The signal wires 182a and 182b are joined to a wiring pattern of the drive circuit substrate 22 by soldering. In the embodiment, the retaining member 803, the supporting members 807a and 807b and the protrusion portions 806a and 806b are integrally formed using a resin.

Accordingly, since the retaining member 803 serves to locate the current sensor 180 and the drive circuit substrate 22, it is easy to assemble and connect by soldering the signal wire 182a and the drive circuit substrate 22 to each other. In addition, a mechanism is provided in the retaining member 803 to retain the current sensor 180 and the drive circuit substrate 22 and thus, the number of parts in the entirety of the electric power conversion apparatus can be reduced.

Since the electric power conversion apparatus 200 is fixed to the housing 119 that accommodates the transmission 118, the electric power conversion apparatus 200 is greatly affected by vibration of the transmission 118. The retaining member 803 is provided with a supporting member 808 in order to indicate the vicinity of a center portion of the drive circuit substrate 22, thereby reducing the influence of vibration exerted on the drive circuit substrate 22. The retaining member 803 is fixed to the cooling jacket 12 by screws.

In addition, the retaining member 803 is provided with a bracket 809 for fixing one end portion of the auxiliary power module 350. In addition, as illustrated in FIG. 38, the auxiliary power module 350 is arranged in the protrusion portion 407, and another end portion of the auxiliary power module 350 is fixed to the protrusion portion 407. Accordingly, the influence of vibration exerted on the auxiliary power module 350 is reduced, and the number of fixing parts can be reduced.

Figure 44:
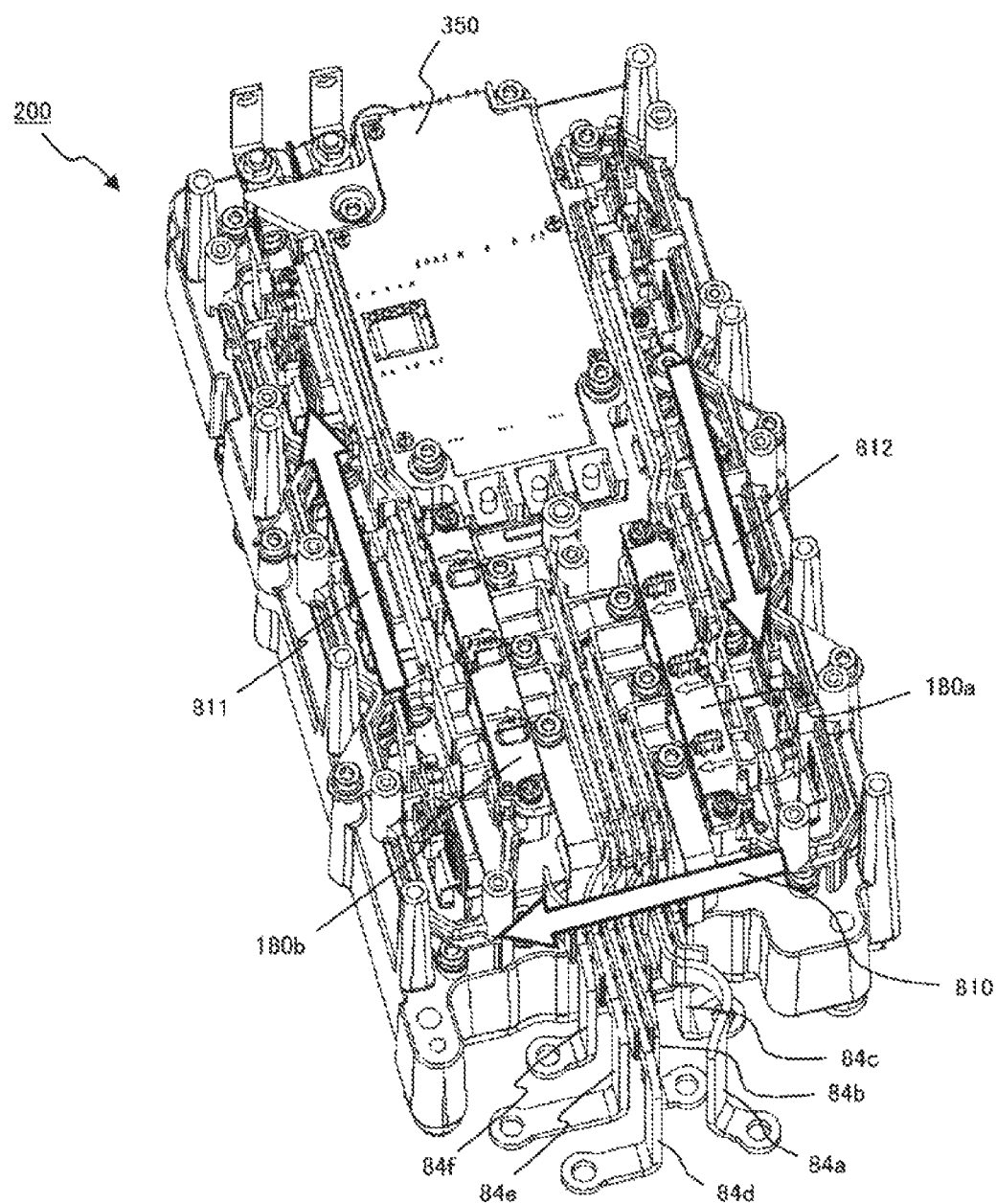
FIG. 44 is an exterior perspective view of the cooling jacket 12 with which the power module, the capacitor module, the bus bar module 800 and an auxiliary power module 350 are assembled.

FIG. 44 is an exterior perspective view of the cooling jacket 12 with which the power module, the capacitor module, the bus bar module 800 and the auxiliary power module 350 are assembled. There is a concern that the current sensor 180 is destroyed when the current sensor 180 is subject to a heat-resistance temperature of approximately 100° C. or greater. In particular, since an on-vehicle electric power conversion apparatus is subject to a very high working temperature, it is important to protect the current sensor 180 from heat. In particular, since the electric power conversion apparatus 200 according to the embodiment is mounted on the transmission 118, it is important to protect the electric power conversion apparatus 200 from heat generated from the transmission 118.

The current sensors 180a and 180b interpose the cooling jacket 12 therebetween, and are arranged on a side opposite a side of the transmission 118. Accordingly, heat generated from the transmission 118 is unlikely to be transferred to the current sensor, and temperature increase of the current sensor is suppressed. Furthermore, the second alternating current bus bars 804a to 804f are formed to vertically intersect a flow direction 810 of a coolant that flows through the third flow path portion 19c which is illustrated in FIG. 39. The current sensors 180a and 180b are arranged closer to the alternating current terminal 321 of the power module than portions of the second alternating current bus bars 804a to 804f which vertically intersect the third flow path portion 19c. Accordingly, the second alternating current bus bars 804a to 804f are indirectly cooled by a coolant, heat transfer can be mitigated from the alternating current bus bars to the current sensors and semiconductor chips in the power module, and thus, reliability is improved.

A flow direction 811 that is illustrated in FIG. 44 indicates a flow direction of a coolant that flows through the fourth flow path portion 19d that is illustrated in FIG. 39. Similarly, a flow direction 812 indicates a flow direction of a coolant that flows through the second flow path portion 19b that is illustrated in FIG. 39. When the electric power conversion apparatus 200 according to the embodiment is projected from above, the current sensors 180a and 180b are arranged in such a manner that projected portions thereof are surrounded by a projected portion of the flow path 19. Accordingly, it is possible to further protect the current sensors from heat of the transmission 118.

Figure 45:
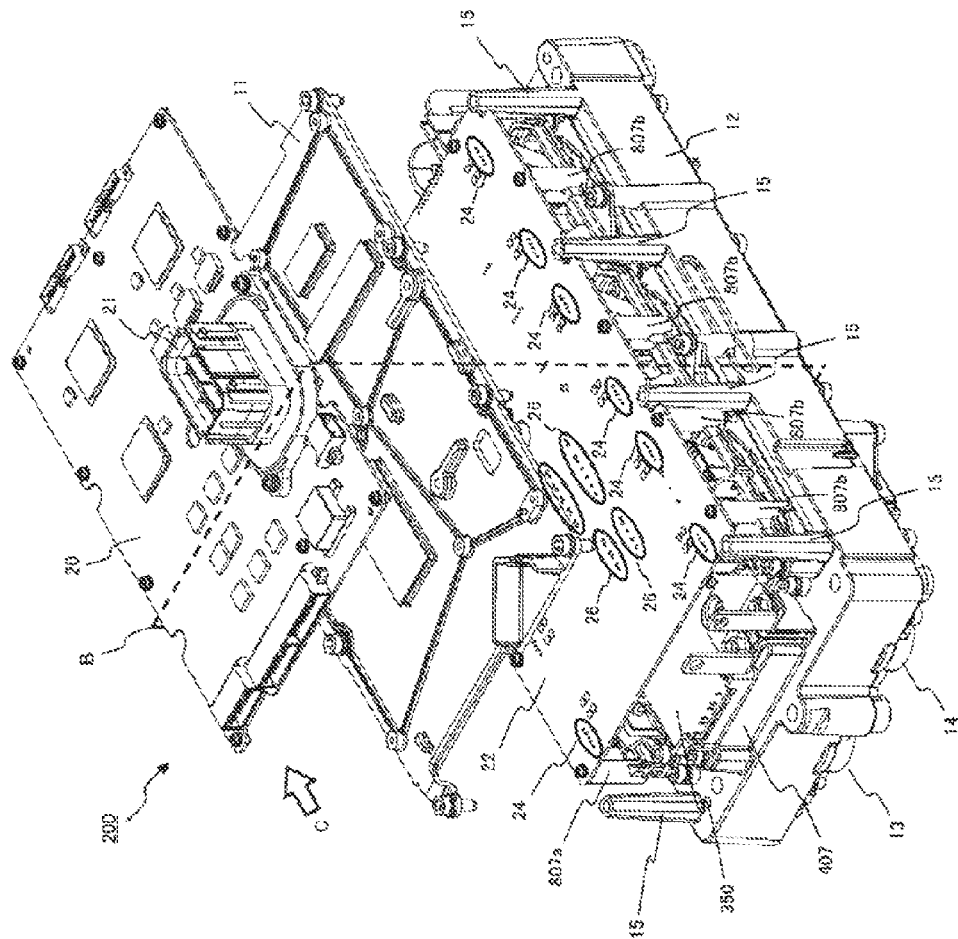
FIG. 45 is a partitioned perspective view of the electric power conversion apparatus 200 from which a control circuit substrate 20 and a metal base plate 11 are separated.

FIG. 45 is a partitioned perspective view of the electric power conversion apparatus 200 from which the control circuit substrate 20 and the metal base plate 11 are separated. As illustrated in FIG. 44, the current sensor 180 is arranged above the capacitor module 500. The drive circuit substrate 22 is arranged above the current sensor 180, and is supported by the supporting member 807a and 807b which are provided in the bus bar module 800 that is illustrated in FIG. 8. The metal base plate 11 is arranged above the drive circuit substrate 22, and is supported by a plurality of supporting members 15 that are erected on the cooling jacket 12. The control circuit substrate 20 is arranged above the metal base plate 11, and is fixed to the metal base plate 11.

Since the current sensor 180, the drive circuit substrate 22 and the control circuit substrate 20 are hierarchically arranged in a row in a vertical direction and the control circuit substrate 20 is arranged at the farthest location from the power modules 300 and 301 which are intense electric systems, introduction of switching noise or the like can be suppressed. Furthermore, the metal base plate 11 is electrically connected to the cooling jacket 12 that is electrically connected to the ground. The metal base plate 11 reduces introduction of noise to the control circuit substrate 20 from the drive circuit substrate 22.

Since cooling targets of a coolant flowing through the flow path 19 are mainly the drive power modules 300 and 301, the power modules 300 and 301 are accommodated in the flow path 19, are in direct contact with the coolant, and are cooled. Meanwhile, it is also necessary for the auxiliary power module 350 to be cooled but not to an extent that the cooling of the drive power modules occurs.

A heat dissipating surface formed in a metal base of the auxiliary power module 350 is formed to face the inlet pipe 13 and the outlet pipe 14 via the flow path 19. In particular, since the protrusion portion 407 for fixing the auxiliary power module 350 is formed above the inlet pipe 13, a coolant flowing from below collides with an inner wall of the protrusion portion 407, and can efficiently take away heat from the auxiliary power module 350. Furthermore, a space is formed in the protrusion portion 407, and is connected to the flow path 19. The depth of the flow path 19 becomes great in the vicinity of the inlet pipe 13 and the outlet pipe 14 due to the space in the protrusion portion 407, and liquid entrapment occurs in the space of the protrusion portion 407. The auxiliary power module 350 can be efficiently cooled by the liquid entrapment.

When the current sensor 180 and the drive circuit substrate 22 are electrically connected to each other, use of wiring connectors causes increase in a connection process or a risk of connection error.

As illustrated in FIG. 45, in the embodiment, the drive circuit substrate 22 has a first hole 24 and a second hole 26 that pass therethrough. In addition, the signal terminals 325U and 325L of the power module 300 are inserted into the first hole 24, and are connected to the wiring pattern of the drive circuit substrate 22 by soldering. Furthermore, the signal wire 182 of the current sensor 180 is inserted into the second hole 26, and is connected to the wiring pattern of the drive circuit substrate 22 by soldering. A surface facing the cooling jacket 12 is joined from a surface on an opposite side of the drive circuit substrate 22 by soldering.

Accordingly, since the signal wire can be connected without wiring connectors being used, productivity can be improved. In addition, since the signal terminal 325 of the power module 300 and the signal wire 182 of the current sensor 180 are welded in the same direction by soldering, productivity can be further improved. In addition, since the drive circuit substrate 22 is provided with the first hole 24 through which the signal terminal 325 passes, and the second hole 26 through which the signal wire 182 passes, a risk of connection error can be reduced.

In addition, a drive circuit such as a drive IC chip (not illustrated) is mounted on the surface of the drive circuit substrate 22, which faces the cooling jacket 12. Accordingly, heat caused by soldering a joint is prevented from being transferred to a drive IC chip and the like, and damage to a drive IC chip and the like caused by soldering a joint is prevented. In addition, since apart with great height such as a transformer, which is mounted on the driver circuit substrate 22, is arranged in a space between the capacitor module 500 and the driver circuit substrate 22, it is possible to lower the height of the entire electric power conversion apparatus 200.

Figure 46:
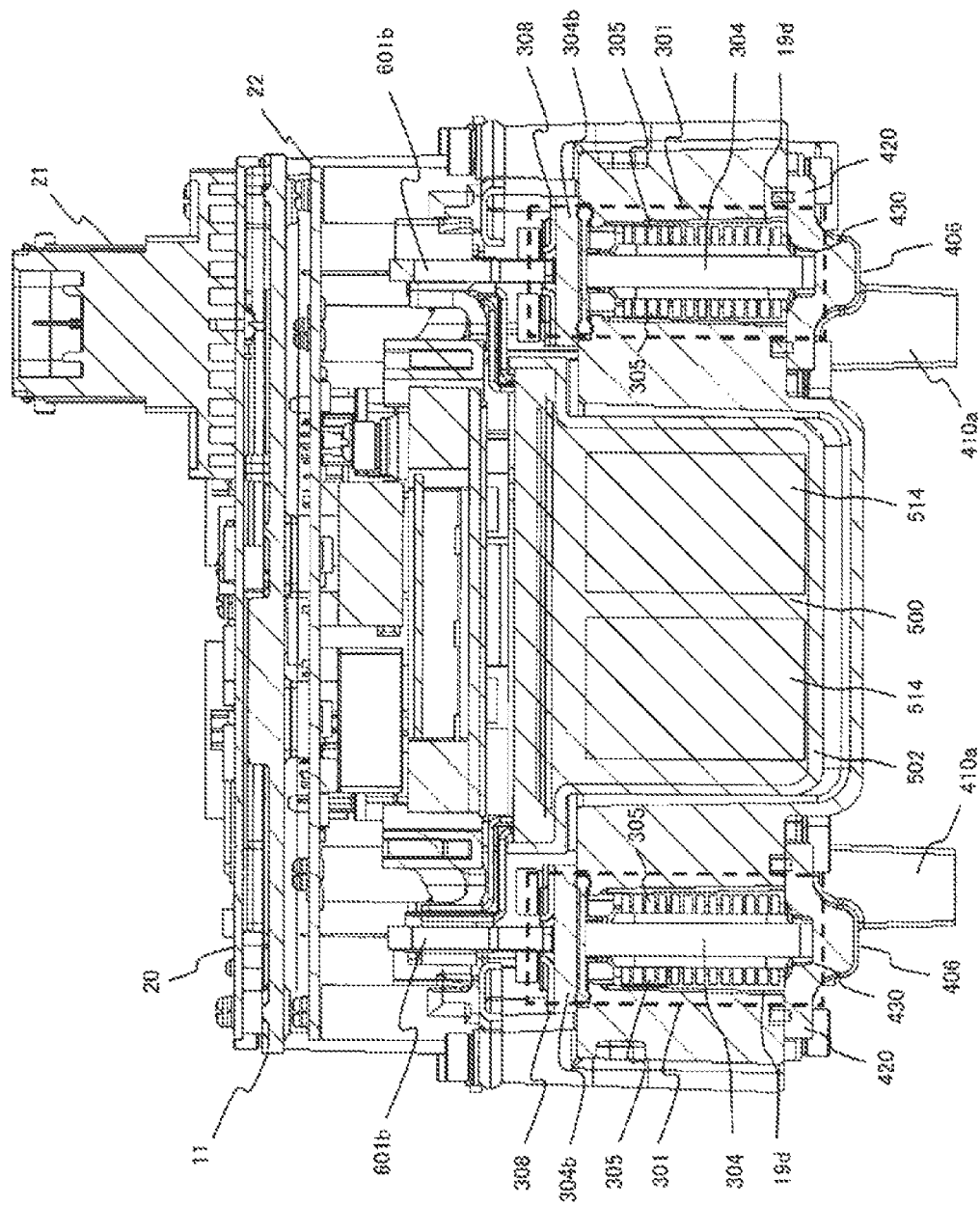
FIG. 46 is a cross-sectional view when the electric power conversion apparatus 200 is seen from a direction C in FIG. 45.

FIG. 46 is a cross-sectional view when the electric power conversion apparatus 200 is cut off at a surface B in FIG. 45 and is seen in a direction C. The flange 304B provided in the module case 304 is pressed to the cooling jacket 12 by flanges 515a and 515b provided in the capacitor case 502. That is, the module case 304 is pressed to the cooling jacket 12 by the weight of the capacitor case 502 that accommodates the capacitor cell 514 and thus, air tightness of the flow path 19 can be improved.

In order to improve cooling efficiency of the power module 300, it is necessary for a coolant in the flow path 19 to flow through an area in which the fin 305 is formed. In order to ensure a space for the thin wall portion 304A, the fin 305 is not formed in a lower portion of the module case 304. The lower cover 420 is formed in such a manner that the lower portion of the module case 304 engages with the concave portion 430 formed in the lower cover 420. Accordingly, it is possible to prevent a coolant from flowing into a space in which the cooling fin is not formed.

As illustrated in FIG. 46, the power module 300, the capacitor module 500 and the power module 301 are arranged to align in a row to vertically intersect a direction where the control circuit substrate 20, the drive circuit substrate 22 and the transmission 118 are arranged. In particular, the power module 300, the capacitor module 500 and the power module 301 are arranged to align in a row in the lowest layer of the electric power conversion apparatus 200. Accordingly, it is possible to lower the height of the entire electric power conversion apparatus 200, and the influence of vibration caused by the transmission 118 can be reduced.

Operation effects of the aforementioned embodiments are summarized as follows.

(1) As illustrated in FIG. 13, the power module is arranged between the primary sealed body 302 and the heat dissipating portion 307B, and includes the insulation layer 333 that is provided to be in contact with the heat dissipating portion 307B and at least the entire heat dissipating surface area of the conductor plate 315. The insulation layer 333 has the laminated body formed by laminating the resin-impregnated ceramic thermal spray film 333A and the resin layer 333B mixed with a filler that has good thermal conductivity; and the resin portion 333C that is provided in a gap between the heat dissipating portion 307B and the primary sealed body 32 to cover the circumferential end portion of the laminated body.

As such, since the thermal spray film 333A of which the void 3330 is impregnated with a resin has a fill factor (70% to 97%) higher than a fill factor of a filler of a high thermal conductive insulation sheet, the thermal spray film 333A has good thermal conductivity. As a result, the good thermal spray film 333A in the insulating characteristic and thermal conductivity is obtained, the insulating characteristic and thermal conductivity are ensured by the thermal spray film 333A, and thus, the resin layer 333B can be made thin as a bonding resin. A filler is mixed in the resin layer 333B and thus, the influence of the resin layer 333B on thermal conduction performance can be suppressed.

Furthermore, as illustrated in FIG. 16, the laminated body is set to have an area greater than the heat dissipating surface areas of the conductor plates 315 and 318, the laminated body is provided to be in contact with at least the entire heat dissipating surface area, and thus, heat generated from the semiconductor chips can be effectively dissipated to the heat dissipating portions 307A and 307B from the conductor plates 315 and 318. In the example that is illustrated in FIG. 16, the thermal spray film 333A is set to have an area greater than that of the bonding resin layer 333B, but it does not matter that any one may be set to have a greater area or both the thermal spray film 333A and the bonding resin layer 333B may have the same area. Furthermore, a formation is simultaneously made when the resin portion 333C is impregnated with a resin, but a formation may be made after the laminated body is formed.

Since a bonding temperature of the resin layer 333B or temperature increase by thermal spraying is much lower than a joint temperature of a ceramic plate in which a brazing filler material in the related art is used, thermal stress can be reduced when a module is manufactured. In addition, the thermal spray film 333A can be made to have the same small thickness as an insulation sheet in the related art, and heat dissipation properties of the insulation portion of the power module can be improved. In addition, since ceramic particles are meltingly bonded and the thermal spray film 333A has a constant strength, it is possible to increase pressure applied when the heat dissipating portion 307B is bonded to the resin layer 333B, and to manufacture the resin layer 333B having few voids. When applied pressure increases, the thickness of the resin layer 333B is greatly changed and becomes small, but insulation performance can be ensured by the resin-impregnated thermal spray film 333A.

Thermal stress of the laminated body caused by a difference in coefficients of thermal expansion between the conductor plate 315 and the heat dissipating portion 307B becomes great in the outer circumferential portion of the bonding surface. In particular, in the power module, since a great current flows through the semiconductor chips, the conductor plate 315 is heated by generated heat, and the differential amount of thermal expansion is likely to be great. However, since the resin portion 333C is provided in the circumferential end portion of the laminated body to cover the circumferential end portion, thermal stress can be relieved in the circumferential end portion of the laminated body. In this case, when the resin used in the resin portion 333C has an elastic modulus smaller than that of the resin used in the resin layer 333B, stress relief effects can be further improved. In addition, in a case where a filler is mixed in the resin portion 333C, when the resin portion 333C has a filler fill factor smaller than that of the resin layer 333B, decrease in the elastic modulus becomes small, the same effects are obtained, and bond force becomes great. Therefore, resistance to occurrence or progression of peeling is improved.

(2) Furthermore, as illustrated in FIGS. 25 and 26, when the concave and convex portions (concave portions 304e and 348a and steps 304f and 348b) are formed in the primary sealed body 302 or the heat dissipating portions 307B and 307A and the concave and convex portions are filled with the resin of the resin portion 333C, the amount of the resin increases in the circumference of the laminated body, and the aforementioned stress relief effects can be further improved. Furthermore, stress relief effects become very great due to an anchor effect resulting from the penetration of the resin into the concave and convex portion.

(3) The resin sheet 3332 is made of a resin of which a main component is a thermoplastic resin and is a composition that has a thermally cured portion, a thermosetting resin is selected, as the resin 333D, of which viscosity in a temperature range of a room temperature to 150° C. is lower than that of the resin 333B and which has good impregnability, and thus, at the temperature when pressure is applied, the range of a heating temperature at which viscosity of the resin sheet 3332 is satisfactorily greater than that of the resin layer 333D becomes wide, and productivity is improved. The resin 333D between the thermal spray film 333A and the resin layer 333B is swept away into the thermal spray film 333A or in the circumferential direction of the laminated body by pressure applied when the heat dissipating portion 307B is bonded to the resin layer 333B as illustrated in FIG. 23. As a result, thermal conduction performance can be prevented from deteriorating in a boundary area in which the filler of the resin layer 333B penetrates into the concave and convex portion of the thermal spray film 333A, and improvement in thermal conduction performance of the laminated body can be achieved. When the resin sheet 3332 uses a resin of which a glass temperature is high and the resin 333D uses a resin of which a glass transfer temperature is lower than that of the resin sheet 3332 and is heated at a temperature lower than the glass transfer temperature of the resin sheet 3332, the same effects can be obtained.

(4) The thermal spray film 333A is formed in such a manner that the void 3330 has a size smaller than that of the front-surface concave and convex portion of the thermal spray film, and a filler mixed in the resin layer 333B is set to have a size smaller than that of the front-surface concave and convex portion of the thermal spray film and greater than that of the void 3330. Accordingly, the filler of the resin layer 333B can penetrate into the front-surface concave portion of the thermal spray film without entering the void 3330. As a result, thermal conduction performance can be improved at an interface between the thermal spray film 333A and the resin layer 333B. Since a resin has thermal conductivity much smaller compared to a ceramic or a metal, heat dissipation properties of the entire module decrease when a resin-concentrated layer (a layer having less filler) is present in a heat dissipating path. For this reason, a setting is configured as described above, and it is important to have a filler in the resin layer 333B that is present in the concave portion of the thermal spray film 333A. The front-surface concave and convex portion of the thermal spray film 333A can be controlled by adjustment of thermal spraying conditions such as a thermal spraying temperature, a preheating temperature of base materials, a spraying speed, the atmosphere and a particle size of powder. In addition, if necessary, surface treatment such as machining, polishing or laser irradiation may be carried out after thermal spraying is completed.

(5) When the heat dissipating portion 307B has a coefficient of thermal expansion greater than that of the conductor plate 315, for example, when the conductor plate 315 is made of Al or an Al alloy (a composite of AlSiC or AlC and Al or the like) and the heat dissipating portion 307B is made of Cu or a Cu alloy, the laminated body is configured in such a manner that the resin layer 333B having a great coefficient of thermal expansion is arranged in the conductor plate 315 and that the thermal spray film 333A having a small coefficient of thermal expansion is arranged on the side of the heat dissipating portion 307B. As a result, thermal stress slopes from the heat dissipating portion 307B to the conductor plate 315, and thermal stress in the circumferential end portion of the laminated body is relieved. In contrast, when the conductor plate 315 has a coefficient of thermal expansion greater than that of the heat dissipating portion 307B, the laminated body may be configured in such a manner that the conductor plate has a coefficient of thermal expansion greater than that of the heat dissipating portion. When the amount of filler filling or a coefficient of thermal expansion of a resin is adjusted, the coefficient of thermal expansion of the resin layer 333B can be changed. When a coefficient of thermal expansion of an impregnation resin is adjusted, a coefficient of thermal expansion of the thermal spray film 333A can be changed.

Each of the aforementioned embodiments may be individually used, or may be combined for use. Effects of each of the embodiments can be individually obtained, or synergistic effects can be obtained. In addition, the invention is not limited to the embodiments, and other embodiments can also be included in the invention without departing from the technological philosophy of the invention.

The disclosure of the following priority based patent application is incorporated herein by reference in its entirety.

Japanese Patent Application No. 2011-209815 (filed on Sep. 26, 2011

The invention claimed is:

1. A power module comprising:
a sealed body in which a semiconductor chip-mounted conductor plate is sealed by a resin in such a manner that a heat dissipating surface of the conductor plate is exposed;
a heat dissipating member that is arranged to face the heat dissipating surface; and
an insulation layer that is arranged between the sealed body and the heat dissipating member,
wherein the insulation layer has
a laminated body that is made by laminating a ceramic thermal spray film, which is impregnated with an impregnation resin, and a bonding resin layer in which a filler having good thermal conductivity is mixed, and that is provided to be in contact with the heat dissipating member and at least the entirety of the heat dissipating surface, and
a stress relief resin portion that is provided in a gap between the heat dissipating member and the sealed body to cover an entire circumferential end portion of the laminated body.

2. The power module according to claim 1, wherein
a concave portion is formed in a surface that is positioned on an outer circumferential side of the laminated body in at least one of the sealed body and the heat dissipating member, and
the concave portion is filled with a part of a resin that configures the stress relief resin portion.

3. The power module according to claim 1,
wherein an annular convex portion that surrounds the stress relief resin portion is formed in a surface of the sealed body or the heat dissipating member which the ceramic thermal spray film faces.

4. The power module according to claim 1,
wherein a circumferential edge of the ceramic thermal spray film is set to have a thickness smaller than a thickness in an area farther inside than the circumferential edge in such a manner that a clearance between the heat dissipating member and the sealed body in a circumferential edge position of the ceramic thermal spray film is greater than a clearance in the area farther inside than the circumferential edge of the ceramic thermal spray film.

5. The power module according to claim 1,
wherein a step is formed in a surface of the sealed body or the heat dissipating member, with which the circumferential edge of the ceramic thermal spray film is in contact, in such a manner that the clearance between the heat dissipating member and the sealed body in the circumferential edge position of the ceramic thermal spray film is greater than the clearance in the area farther inside than the circumferential edge of the ceramic thermal spray film.

6. The power module according to claim 1,
wherein an elastic modulus of a resin used in the stress relief resin portion is smaller than an elastic modulus of a resin used in the bonding resin layer.

7. The power module according to claim 1,
wherein a filler is mixed in the stress relief resin portion at a fill factor lower than the fill factor of the bonding resin layer.

8. The power module according to claim 1,
wherein the resin used in the bonding resin layer has a glass transition temperature greater than a glass transition temperature of the resin used in the stress relief resin portion.

9. The power module according to claim 1,
wherein the resin used in the bonding resin layer is a thermoplastic resin, and the resin used in the stress relief resin portion is a thermosetting resin.

10. The power module according to claim 1, wherein
a void formed in the ceramic thermal spray film has a size greater than the size of a front-surface concave portion thereof, and
the filler mixed in the bonding resin layer has a size smaller than the size of the front-surface concave portion, and greater than the size of the void.

11. The power module according to claim 1,
wherein when the heat dissipating member has a coefficient of thermal expansion greater than a coefficient of thermal expansion of the conductor plate, the laminated body is configured in such a manner that the heat dissipating member has a coefficient of thermal expansion greater than the coefficient of thermal expansion of the conductor plate, and in contrast, when the conductor plate has a coefficient of thermal expansion greater than the coefficient of thermal expansion of the heat dissipating member, the laminated body is configured in such a manner that the conductor plate has a coefficient of thermal expansion greater than the coefficient of thermal expansion of the heat dissipating member.

12. The power module according to claim 1, wherein
the semiconductor chip has electrodes on both front and back surfaces thereof,
the conductor plate includes a front surface-side conductor plate that is joined to a side of the front surface of the chip, and a back surface-side conductor plate that is joined to a side of the back surface of the chip,
the heat dissipation member is a module case that accommodates the sealed body in which the semiconductor chip, the front surface-side conductor plate, and the back surface-side conductor plate are sealed by a resin, and the heat dissipation member has a first heat dissipating wall that faces the front surface-side conductor plate, a second heat dissipating wall that faces the back surface-side conductor plate and a thin-walled plastically deformable portion that is formed in the circumference of the first and the second heat dissipating walls, and
the insulation layer includes a first insulation layer that is arranged between the front surface-side conductor plate and the first heat dissipating wall, and a second insulation layer that is arranged between the back surface-side conductor plate and the second heat dissipating wall.

13. The power module according to claim 1, wherein
the semiconductor chip has electrodes on both front and back surfaces thereof,
the conductor plate includes a front surface-side conductor plate that is joined to a side of the front surface of the chip, and a back surface-side conductor plate that is joined to a side of the back surface of the chip,
the heat dissipation member has a first heat dissipating wall that faces the front surface-side conductor plate, and a second heat dissipating wall that faces the back surface-side conductor plate, and
the insulation layer includes a first insulation layer that is arranged between the front surface-side conductor plate and the first heat dissipating wall, and a second insulation layer that is arranged between the back surface-side conductor plate and the second heat dissipating wall.

* * * * *